(12) United States Patent
Ito et al.

(10) Patent No.: US 10,008,674 B2
(45) Date of Patent: Jun. 26, 2018

(54) ORGANIC LIGHT EMITTING DIODE AND ORGANIC LIGHT EMITTING DISPLAY DEVICE INCLUDING THE SAME

(71) Applicant: SAMSUNG DISPLAY CO., LTD., Yongin, Gyeonggi-Do (KR)

(72) Inventors: Naoyuki Ito, Seongnam-si (KR); Seul Ong Kim, Suwon-si (KR); Youn Sun Kim, Seoul (KR); Dong Woo Shin, Seoul (KR); Jung Sub Lee, Bucheon-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 233 days.

(21) Appl. No.: 14/736,572

(22) Filed: Jun. 11, 2015

(65) Prior Publication Data

US 2016/0111658 A1  Apr. 21, 2016

(30) Foreign Application Priority Data

Oct. 15, 2014 (KR) .................. 10-2014-0139240

(51) Int. Cl.
*H01L 51/50* (2006.01)
*H01L 51/00* (2006.01)
(Continued)

(52) U.S. Cl.
CPC ........ *H01L 51/0072* (2013.01); *C09K 11/025* (2013.01); *C09K 11/06* (2013.01);
(Continued)

(58) Field of Classification Search
None
See application file for complete search history.

(56) References Cited

U.S. PATENT DOCUMENTS

| | | | | |
|---|---|---|---|---|
| 2009/0085468 A1* | 4/2009 | Funahashi | ............. | C07C 211/54 313/504 |
| 2010/0148158 A1* | 6/2010 | Kim | ......................... | C07C 2/86 257/40 |

(Continued)

FOREIGN PATENT DOCUMENTS

| KR | 10-2012-0122982 A | 11/2012 |
|---|---|---|
| KR | 10-1270169 | 5/2013 |

(Continued)

OTHER PUBLICATIONS

Abstract of WO 2013-0243905 A1 (pub. 2013).*
Chang et al. (J. Mater. Chem., 2012, 22, 3832).*
Abstract of WO 2013-035329 A1 (pub. 2013).*

*Primary Examiner* — Kevin M Bernatz
(74) *Attorney, Agent, or Firm* — Lee & Morse, P.C.

(57) ABSTRACT

An organic light emitting diode including a first compound represented by one of Chemical Formulae 1-A to 1-D and a second compound represented by Chemical Formula 2:

(1-A)

(Continued)

-continued (1-B)

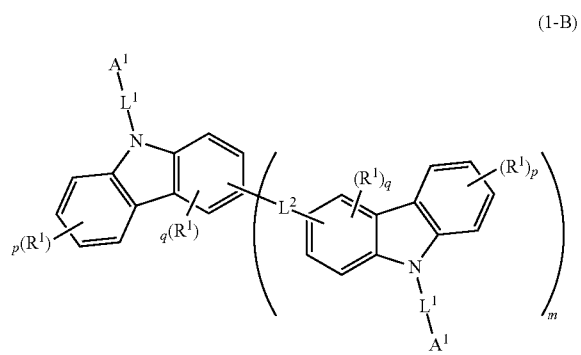

[Chemical Formula 2]

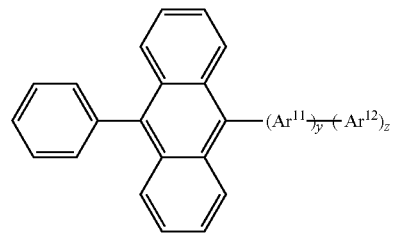

10 Claims, 4 Drawing Sheets

(1-C)

(51) Int. Cl.
*C09K 11/02* (2006.01)
*C09K 11/06* (2006.01)

(52) U.S. Cl.
CPC ...... *H01L 51/0067* (2013.01); *H01L 51/0073* (2013.01); *C09K 2211/1007* (2013.01); *C09K 2211/1011* (2013.01); *H01L 51/0058* (2013.01); *H01L 51/5016* (2013.01); *H01L 51/5096* (2013.01)

(56) References Cited

U.S. PATENT DOCUMENTS

| 2012/0268003 A1* | 10/2012 | Fujita | C07D 471/04 313/504 |
| 2014/0217393 A1* | 8/2014 | Kato | C07D 403/10 257/40 |
| 2015/0194621 A1* | 7/2015 | Nishimura | C07D 209/82 257/40 |
| 2015/0243905 A1* | 8/2015 | Yamamoto | C07D 403/14 257/40 |

(1-D)

FOREIGN PATENT DOCUMENTS

| KR | 10-2013-0116023 A | 10/2013 |
| WO | WO 2007-029403 A1 | 3/2007 |
| WO | WO 2011-086941 A1 | 7/2011 |
| WO | WO 2013-035329 A1 | 3/2013 |

* cited by examiner

ORGANIC LIGHT EMITTING DIODE AND ORGANIC LIGHT EMITTING DISPLAY DEVICE INCLUDING THE SAME

CROSS-REFERENCE TO RELATED APPLICATION

Korean Patent Application No. 10-2014-0139240, filed on Oct. 15, 2014, in the Korean Intellectual Property Office, and entitled: "Organic Light Emitting Diode and Organic Light Emitting Display Device Including The Same," is incorporated by reference herein in its entirety.

BACKGROUND

1. Field

Embodiments relate to an organic light emitting diode and an organic light emitting diode device including the same.

2. Description of the Related Art

Recent trends toward lightweight and thin personal computers and televisions sets also require lightweight and thin display devices, and flat panel displays satisfying such requirements are being considered in place of conventional cathode ray tubes (CRTs). LCDs are passive display devices, an additional backlight as a light source is needed, and the LCD may have a slow response time and a narrow viewing angle.

An organic light emitting diode device has recently been spotlighted as a display device that has merits such as a wide viewing angle, outstanding contrast, and a fast response time.

In the organic light emitting diode device, electrons injected from one electrode and holes injected from another electrode may be combined with each other in an emission layer, thereby generating excitons, and energy may be outputted from the excitons to thereby emit light.

The above information disclosed in this Background section is only for enhancement of understanding of the background and therefore it may contain information that does not form the prior art that is already known in this country to a person of ordinary skill in the art.

SUMMARY

Embodiments are directed to an organic light emitting diode and an organic light emitting diode device including the same.

An exemplary embodiment provides an organic light emitting diode including a first compound expressed in one of Chemical Formulae 1-A to 1-D and a second compound expressed in Chemical Formula 2.

[Chemical Formulae 1-A to 1-D]

(1-A)

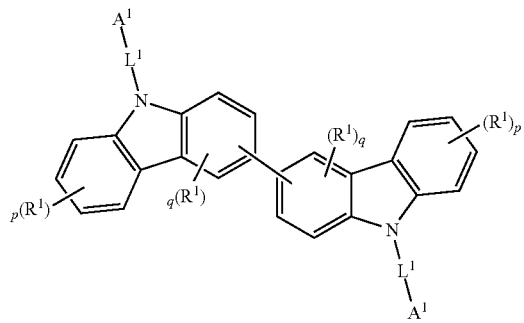

(1-B)

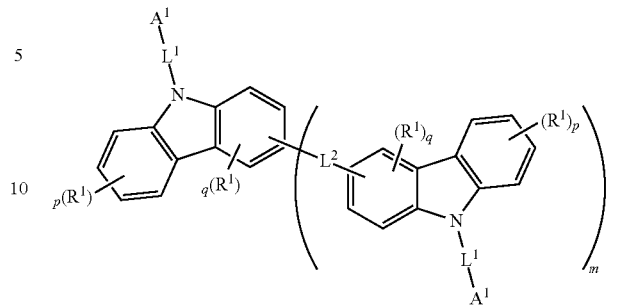

(1-C)

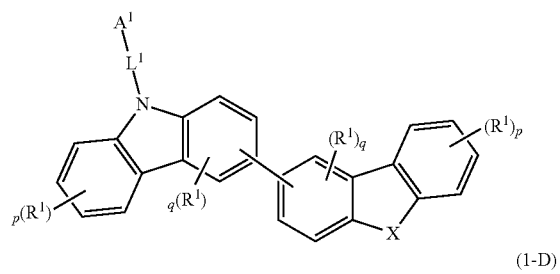

(1-D)

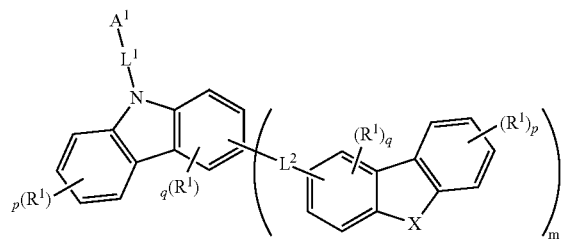

In Chemical Formulae 1-A to 1-D, $A^1$ denotes a substituted or unsubstituted ring-type C1 to C30 aromatic hydrocarbon group or a substituted or unsubstituted ring-type C1 to C30 condensed aromatic heterocyclic group, each of $L^1$ and $L^2$ denotes, as a connection group, individual single bonds, a substituted or unsubstituted C6 to C30 aromatic hydrocarbon group, a substituted or unsubstituted ring-type C6 to C30 condensed aromatic hydrocarbon group, a substituted or unsubstituted C2 to C30 aromatic heterocyclic group, or a substituted or unsubstituted ring-type C2 to C30 condensed aromatic heterocyclic group, X denotes S, O, N—$R^1$, or C($R^1$)$_2$, $R^1$ is, independently, hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted ring-type C6 to C30 aromatic hydrocarbon group, a substituted or unsubstituted ring-type C6 to C30 condensed aromatic hydrocarbon group, a substituted or unsubstituted ring-type C2 to C30 aromatic heterocyclic, or a substituted or unsubstituted C2 to C30 condensed aromatic heterocyclic, p denotes an integer of 1 to 4, q is an integer of 1 to 3, when p is an integer of 2 to 4 or q is an integer of 2 or 3, each R1 is equivalent to or different from one another, m is an integer of 1 to 3, and when n is an integer of 2 or 3, each $R^1$ is equivalent to or different from one another.

[Chemical Formula 2]

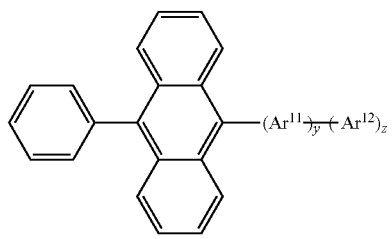

In Chemical Formula 2, $Ar^{11}$ denotes a substituted or unsubstituted C5 to C30 arylene group or a substituted or unsubstituted C5 to C30 heteroarylene group, y denotes an integer of 0 to 3, when y is 0, $Ar^{11}$ is a single bond, $Ar^{12}$ denotes a substituted or unsubstituted C5 to C30 aryl group or a substituted or unsubstituted C5 to C30 heteroaryl group, z is an integer of 1 to 3, and when y or z is 2 or more, the $Ar^{11}$ or $Ar^{12}$ are equal to or different from one another.

The organic light emitting diode may include: an anode and a cathode that face each other; an emission layer disposed between the anode and the cathode; a hole transfer layer disposed between the anode and the emission layer; an electron transfer layer disposed between the cathode and the emission layer; and a hole blocking layer disposed between the electron transfer layer and the emission layer, wherein the hole blocking layer may include the first compound, and the emission layer may include the second compound.

$Ar^{11}$ of the second compound may include a substituted or unsubstituted phenylene group or a substituted or unsubstituted naphthylene group.

The first compound may include at least one selected from a group consisting of Chemical Formulae 1-1 to 1-8.

(1-1)

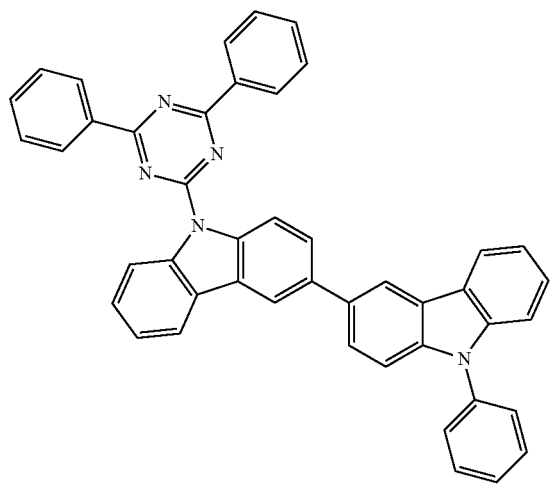

(1-2)

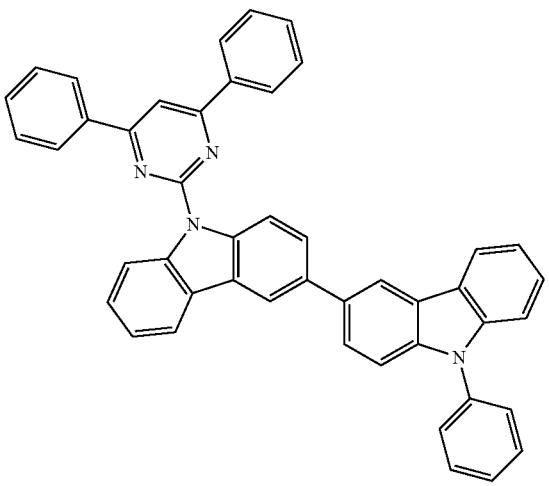

(1-3)

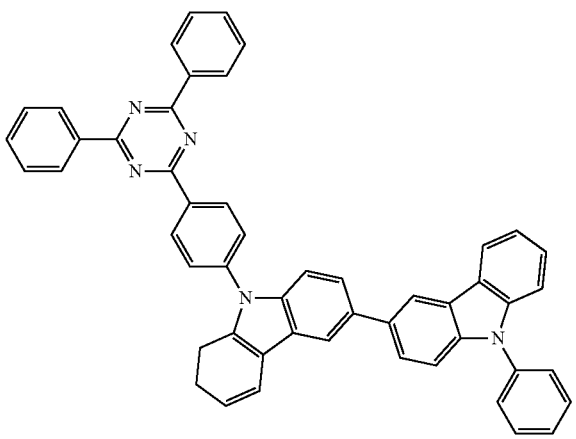

(1-4)

(1-5)
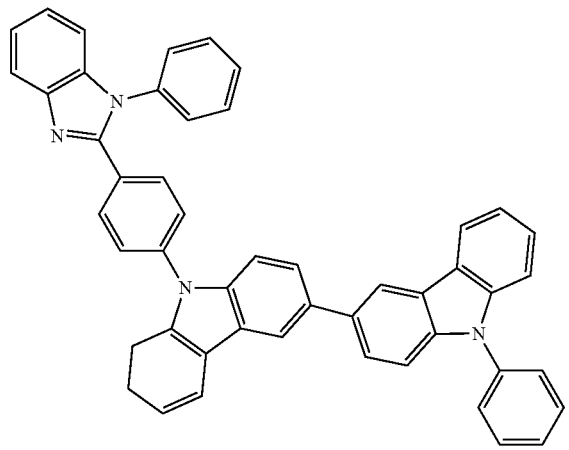
(1-6)
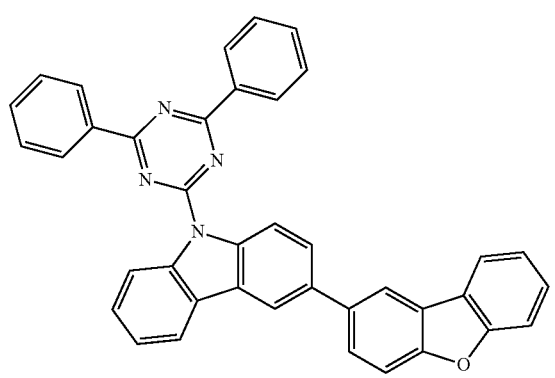
(1-7)
(1-8)
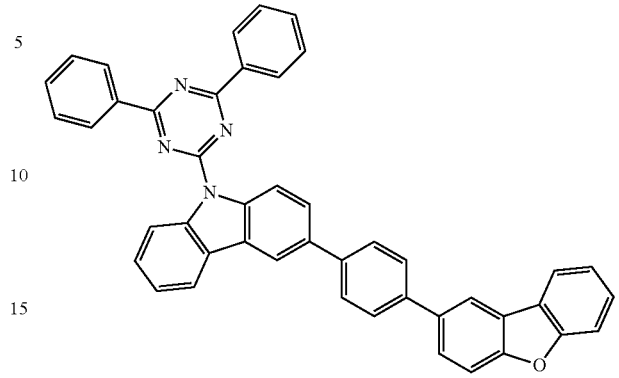
The second compound may include at least one selected from a group consisting of Chemical Formulae 2-1 to 2-9.
(2-1)
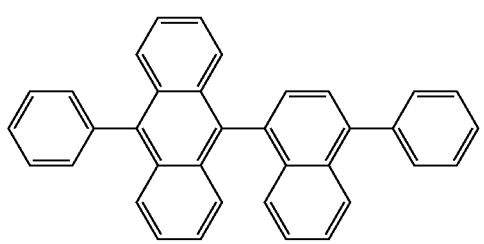
(2-2)
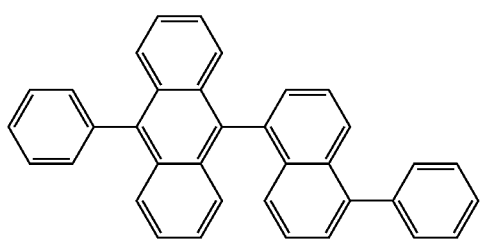
(2-3)
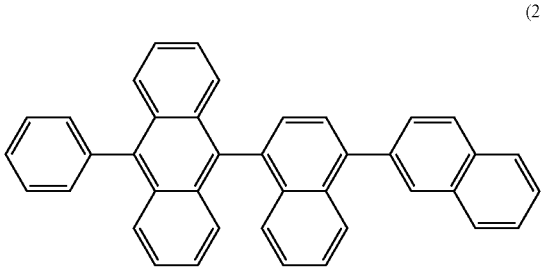
(2-4)
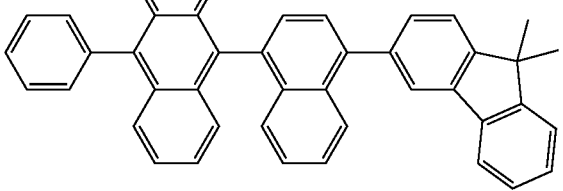

-continued (2-5)
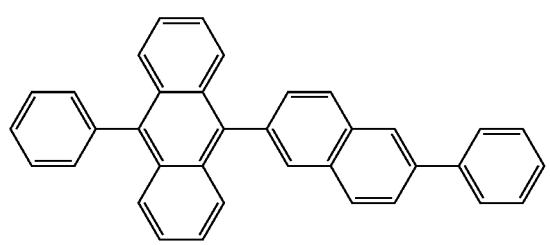

(2-6)
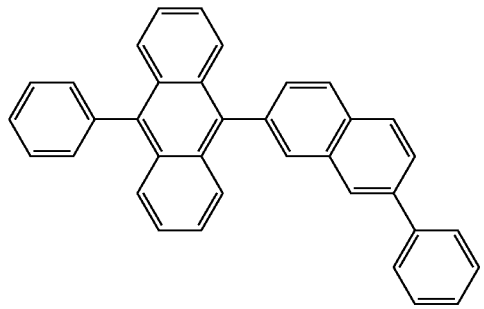

(2-7)
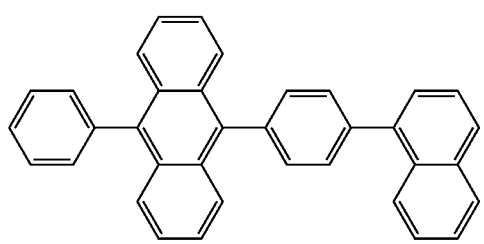

(2-8)
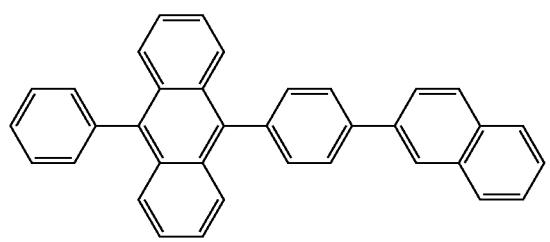

(2-9)
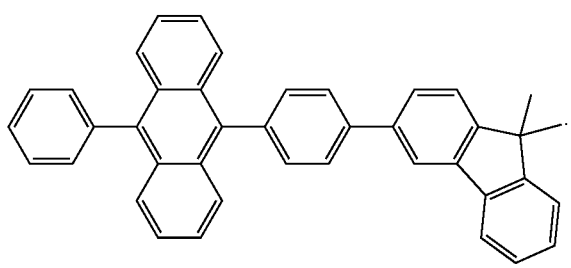

The electron transfer layer may further include a metal or a metal complex.

The electron transfer layer may include at least one selected from a group consisting of Alq₃, TAZ, Balq, BPhen, and Bebq₂.

A thickness of the hole blocking layer may be in a range of 1 nm to 100 nm.

Another exemplary embodiment provides an organic light emitting diode device including: a substrate; gate lines disposed on the substrate; data lines and a driving voltage line disposed to cross the gate lines; a switching thin film transistor connected to the gate line and the data line; a driving thin film transistor connected to the switching thin film transistor and the driving voltage line; and an organic light emitting diode connected with the driving thin film transistor, wherein the organic light emitting element comprises a first compound represented by Chemical Formulae 1-A to 1-D and a second compound represented by Chemical Formula 2.

[Chemical Formula 1-A - Chemical Formula 1-D]

(1-A)
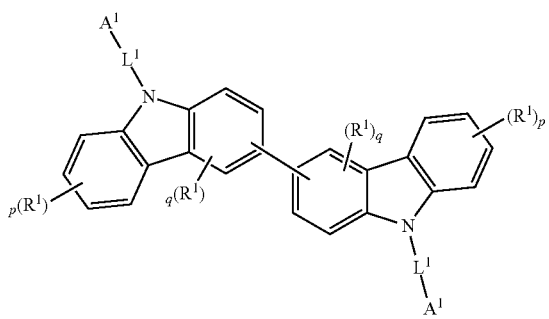

(1-B)
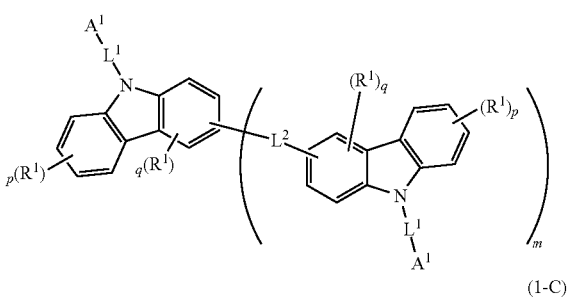

(1-C)
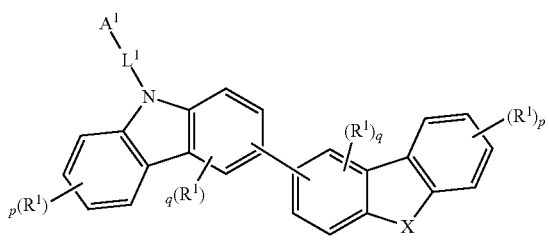

(1-D)
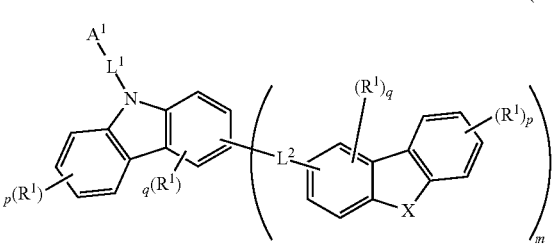

In Chemical Formulae 1-A to 1-D, $A^1$ denotes a substituted or unsubstituted ring-type C1 to C30 aromatic hydrocarbon group or a substituted or unsubstituted ring-type C1 to C30 condensed aromatic heterocyclic group, each of $L^1$ and $L^2$ denotes, as a connection group, individual single bonds, a substituted or unsubstituted C6 to C30 aromatic hydrocarbon group, a substituted or unsubstituted ring-type C6 to C30 condensed aromatic hydrocarbon group, a substituted or unsubstituted C2 to C30 aromatic heterocyclic group, or a substituted or unsubstituted ring-type C2 to C30 condensed aromatic heterocyclic group, X denotes S, O, N—$R^1$, or $C(R^1)_2$, $R^1$ is, independently, hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted ring-type C6 to C30 aromatic hydrocarbon group, a substituted or unsubstituted ring-type C6 to C30 condensed aromatic hydrocarbon group, a substituted or unsubstituted ring-type C2 to C30 aromatic heterocyclic, or a substituted or unsubstituted C2 to C30 condensed aromatic heterocyclic, p denotes an integer of 1 to 4, q is an integer of 1 to 3, when p is an integer of 2 to 4 or q is an integer of 2 or 3, each R1 is equivalent to or different from one another, m is an integer of 1 to 3, and when n is an integer of 2 or 3, each $R^1$ is equivalent to or different from one another.

[Chemical Formula 2]

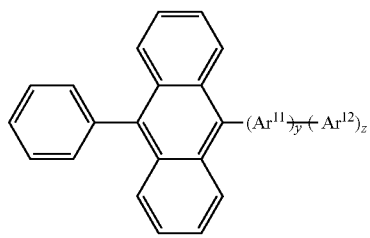

In Chemical Formula 2, $Ar^{11}$ denotes a substituted or unsubstituted C5 to C30 arylene group or a substituted or unsubstituted C5 to C30 heteroarylene group, y denotes an integer of 0 to 3, when y is 0, $Ar^{11}$ is a single bond, $Ar^{12}$ denotes a substituted or unsubstituted C5 to C30 aryl group or a substituted or unsubstituted C5 to C30 heteroaryl group, z is an integer of 1 to 3, and when y or z is 2 or more, the $Ar^{11}$ or $Ar^{12}$ are equal to or different from one another.

The organic light emitting diode may include: an anode and a cathode that face each other; an emission layer disposed between the anode and the cathode; a hole transfer layer disposed between the anode and the emission layer; an electron transfer layer disposed between the cathode and the emission layer; and a hole blocking layer disposed between the electron transfer layer and the emission layer, wherein the hole blocking layer includes the first compound, and the emission layer includes the second compound.

$Ar^{11}$ of the second compound may include a substituted or unsubstituted phenylene group or a substituted or unsubstituted naphthylene group.

The first compound may include at least one selected from a group consisting of Chemical Formulae 1-1 to 1-8.

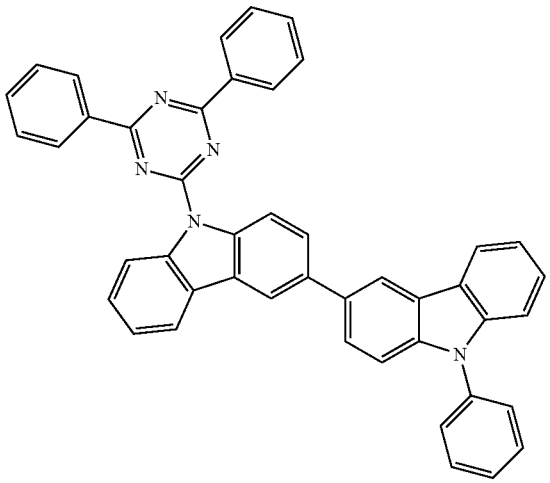

(1-1)

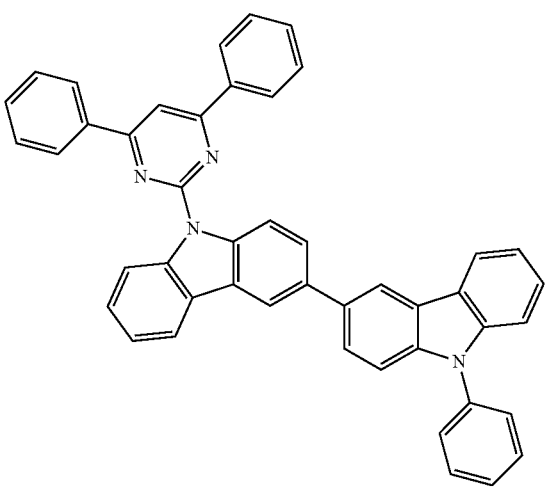

(1-2)

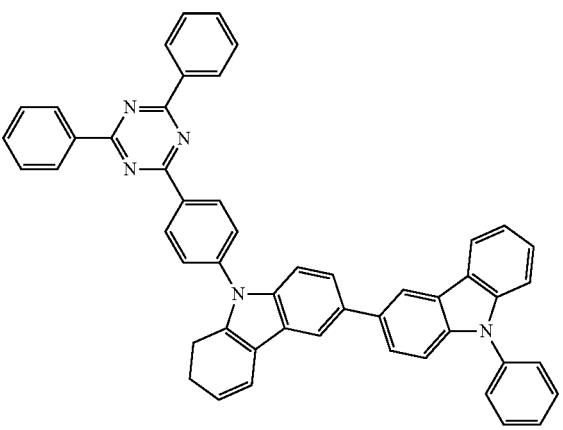

(1-3)

(1-4)
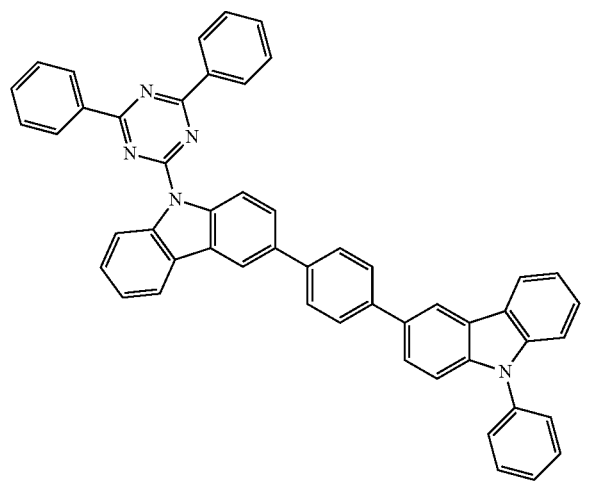
(1-5)
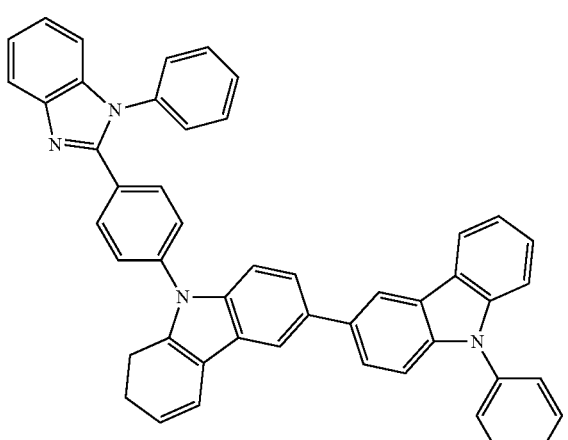
(1-6)
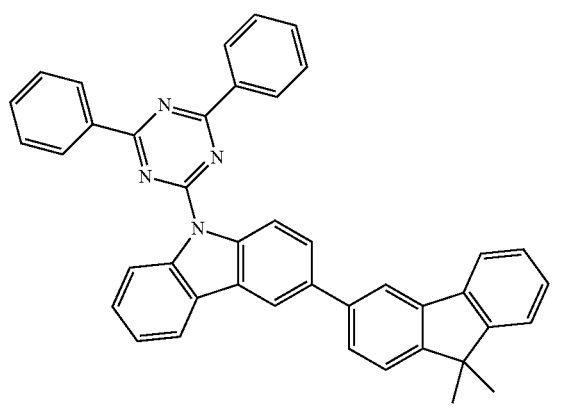
(1-7)
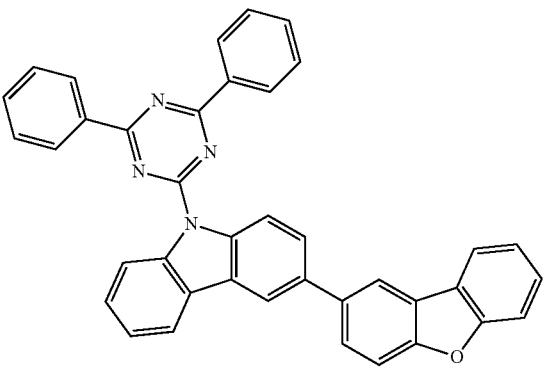
(1-8)
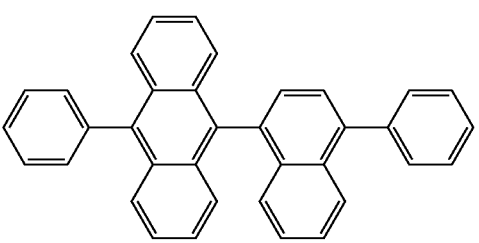
The second compound may include at least one selected from a group consisting of Chemical Formulae 2-1 to 2-9.
(2-1)
(2-2)
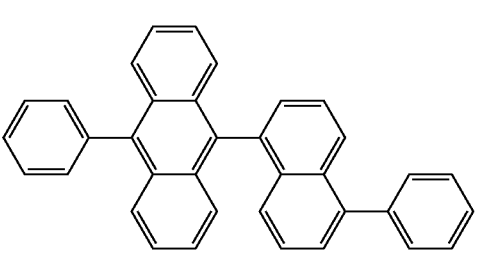

(2-3)

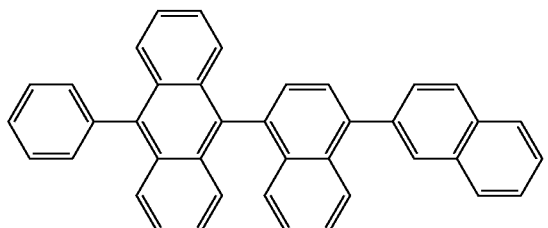

(2-4)

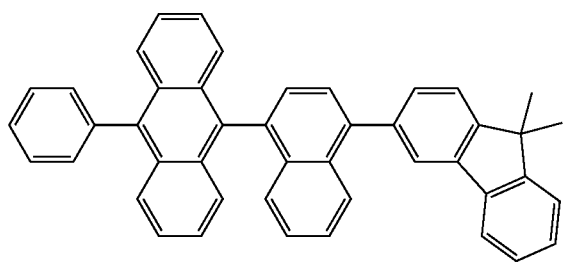

(2-5)

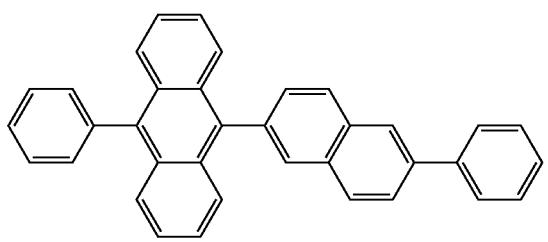

(2-6)

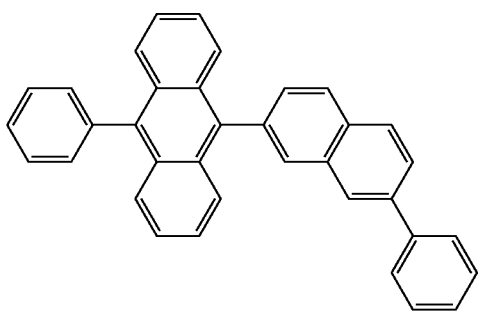

(2-7)

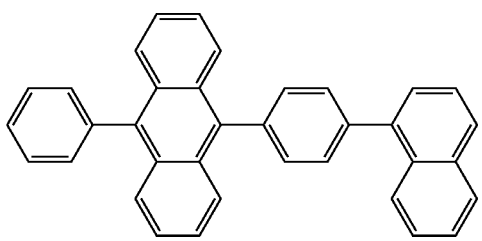

(2-8)

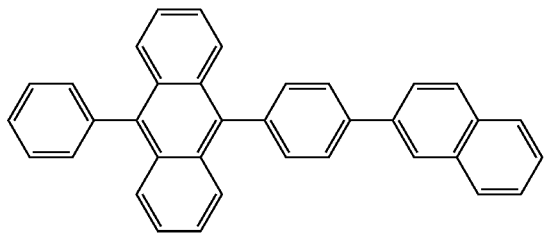

(2-9)

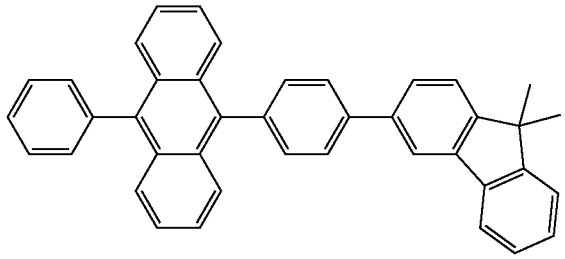

The electron transfer layer may further include a metal or a metal complex.

The electron transfer layer may include at least one selected from a group consisting of $Alq_3$, TAZ, Balq, BPhen, and $Bebq_2$.

A thickness of the hole blocking layer may be in a range of 1 nm to 100 nm.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
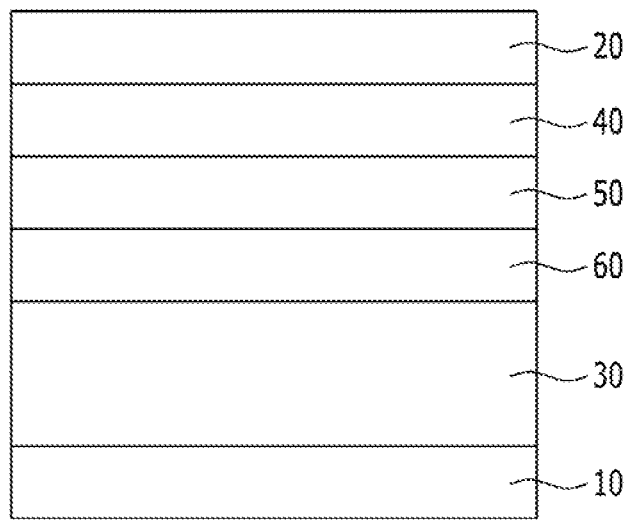
FIG. 1 illustrates a structure of an organic light emitting element according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the present specification, the term "substituted", unless separately defined, means a substitution with a substituent selected from a group consisting of deuterium, C1 to C30 alkyl groups, C6 to C36 aryl groups, C2 to C30 heteroaryl groups, C1 to C30 alkoxy groups, C2 to C30 alkenyl groups, C6 to C30 aryloxy groups, C3 to C30 silyloxy groups, C1 to C30 acyl groups, C2 to C30 acyloxy groups, C2 to C30 heteroacyloxy groups, C1 to C30 sulfonyl groups, C1 to C30 alkylthio groups, C6 to C30 arylthio groups, C1 to C30 heterocyclothiol groups, C1 to C30 phosphoric acid amide groups, C3 to C40 silyl groups, NR"R''' (here, R" and R''' are respectively substituents selected from a group consisting of a hydrogen atom, C1 to C30 alkyl groups, and C6 to C30 aryl groups), a carboxylic acid group, a halogen group, a cyano group, a nitro group, an azo group, a fluorene group, and a hydroxyl group.

In addition, in the specification, the term "hetero", unless separately defined, means a single functional group contains 1 to 3 heteroatoms selected from the group consisting of B, N, O, S, P, Si, and P(=O), and carbon atoms as the remainder.

Further, among groups used in chemical formulae of the present specification, definition of a representative group is as follows. (The number of carbons that limits substituents is not restrictive, and does not limit characteristics of the constituents).

An unsubstituted C1 to C30 alkyl group may be a linear type or a branched type, and nonrestrictive examples of the unsubstituted C1 to C30 alkyl may be methyl, ethyl, propyl, iso-propyl, sec-butyl, hexyl, iso-amyl, hexyl, heptyl, octyl, nonyl, dodecyl, and the like.

An unsubstituted C1 to C30 alkoxy group indicates a group having a structure of —OA (wherein A is an unsubstituted C1 to C30 alkyl group as described above). Non-limiting examples of the unsubstituted C1 to C30 alkoxy include a methoxy group, an ethoxy group, a propoxy group, an isopropyloxy group, a butoxy group, and a pentoxy group.

An unsubstituted C6 to C30 aryl group indicates a carbocyclic aromatic system containing at least one ring. At least two rings may be fused to each other or linked to each other by a single bond. The term "aryl" refers to an aromatic system, such as phenyl, naphthyl, or anthracenyl. Examples of the unsubstituted C6 to C30 aryl group may be selected from a group consisting of a phenyl group, a tolyl group, a biphenyl group, a naphthyl group, an anthracenyl group, a terphenyl group, a fluorenyl group, a phenanthrenyl group, a pyrenyl group, a diphenylanthracenyl group, a diphenylanthracenyl group, a dinaphthylanthracenyl group, a pentacenyl group, a bromophenyl group, a hydroxyphenyl group, a stilbene group, an azobenzenyl group, and a ferrocenyl group.

An unsubstituted C2 to C30 heteroaryl group includes one, two, or three heteroatoms selected from a group consisting of B, N, O, S, P, Si, and P(=O). At least two rings may be fused to each other or linked to each other by a single bond. Examples of the unsubstituted C2 to C30 heteroaryl group include a pyrazolyl group, an imidazolyl group, an oxazolyl group, a thiazolyl group, a triazolyl group, a tetrazolyl group, an oxadiazolyl group, a thidiazolyl group, a pyridinyl group, a triazinyl group, a carbazole group, an N-phenylcarbazole group, an indole group, a quinolyl group, an isoquinolyl group, a thiophene group, a dibenzothiophene group, and a dibenzimidazole group.

Hereinafter, an organic light emitting diode according to an exemplary embodiment will be described in further detail. FIG. 1 illustrates a cross-sectional view of an organic light emitting diode according to an exemplary embodiment.

Referring to FIG. 1, the organic light emitting element according to the exemplary embodiment may include an anode 10, a cathode 20 facing the anode 10, an emission layer 60 between the anode 10 and the cathode 20, a hole transport layer 30 between the anode 10 and the emission layer 60, an electron transport layer 40 between the cathode 20 and the emission layer 60, and a hole blocking layer 50 between the electron transport layer 40 and the emission layer 60.

A substrate (not shown) may be provided on the side of the anode 10 or on the side of the cathode 20. The substrate may be made of, e.g., an inorganic material such as glass, an organic material such as a polycarbonate, polymethylmethacrylate, polyethylene terephthalate, polyethylene naphthalate, a polyamide, polyether sulfone, or a combination thereof, or of a silicon wafer.

The anode 10 may be a transparent electrode or an opaque electrode. The transparent electrode may be, e.g., made of a conductive oxide such as indium tin oxide (ITO), indium zinc oxide (IZO), tin oxide ($SnO_2$), or a combination thereof, or a metal such as aluminum, silver, or magnesium with a thin thickness, and the opaque electrode may be made of a metal such as aluminum, silver, magnesium, or the like.

For example, the anode 10 of the organic light emitting element according to the exemplary embodiment may have a structure in which a reflective layer is made of silver (Ag), aluminum (Al), chromium (Cr), molybdenum (Mo), tungsten (W), titanium (Ti), gold (Au), palladium (Pd), or an alloy film thereof, and an electrical reflective layer made of a transparent electrode material such as ITO, IZO, or ZnO, are layered.

The anode 10 may be formed using a sputtering method, a vapor phase deposition method, an ion beam deposition method, an electron beam deposition method, or a laser ablation method.

The cathode 20 may include a material having a small work function to facilitate electron injection. For example, the material may be a metal such as magnesium, calcium, sodium, potassium, titanium, indium, yttrium, lithium, gadolinium, aluminum, silver, tin, lead, cesium, barium, or the like, or an alloy thereof, or a multi-layered structure material such as LiF/Al, $LiO_2$/Al, LiF/Ca, LiF/Al, and $BaF_2$/Ca. For example, a metallic electrode such as aluminum may be used as the cathode 20.

For example, the conductive material used as the cathode 20 according to the exemplary embodiment may include magnesium, calcium, tin, lead, titanium, yttrium, lithium, ruthenium, manganese, aluminum, lithium fluoride, or the like, or an alloy thereof. In an implementation, the alloy may include magnesium/silver, magnesium/indium, lithium/aluminum, and the like. An alloy ratio of the alloys may be controlled based on a temperature of a deposition source, an atmosphere, a degree of vacuum, and the like, and an appropriate alloy ratio may be selected.

The anode 10 and the cathode 20 may be formed of two or more layers as desired.

The emission layer 60 may include a blue, red, or green emission material, and the emission layer 60 may include a host and a dopant.

The emission layer 60 according to the exemplary embodiment may include a second compound represented by Chemical Formula 2, as a host.

[Chemical Formula 2]

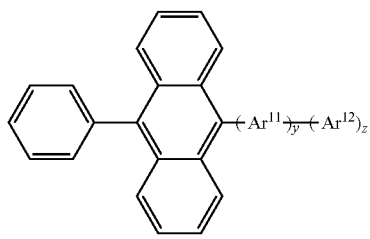

In Chemical Formula 2, $Ar^{11}$ may be or may include a substituted or unsubstituted C5 or C6 to C30 arylene group or a substituted or unsubstituted C5 to C30 heteroarylene group, y may be an integer of 0 to 3, and when y is 0, $Ar^{11}$ may be a single bond, $Ar^{12}$ may be a substituted or unsubstituted C5 or C6 to C30 aryl group or a substituted or unsubstituted C5 to C30 heteroaryl group, z may be an integer of 1 to 3.

When y or z is 2 or 3, each $Ar^{11}$ or $Ar^{12}$ may be the same as or different from one another.

In an implementation, the compound represented by Chemical Formula 2 may be a compound represented by one of the following Chemical Formula 2-1 to Chemical Formula 2-98.

(2-1)

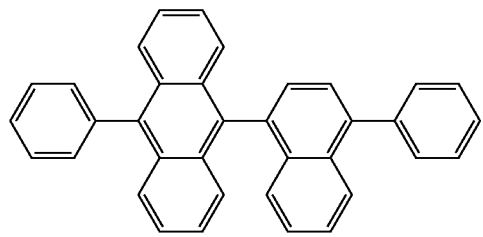

(2-2)

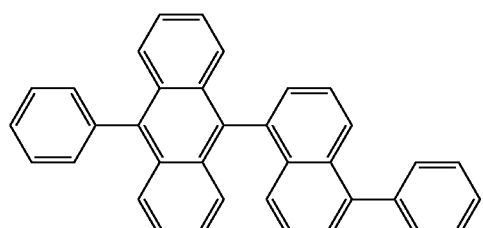

(2-3)

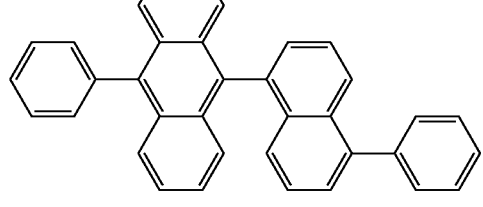

(2-4)

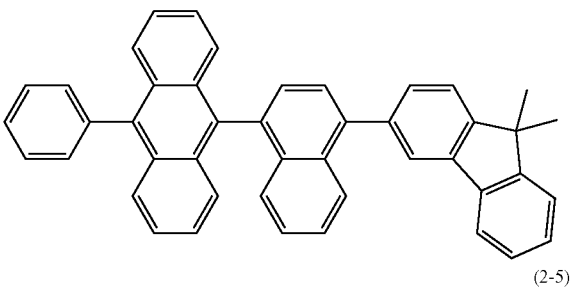

(2-5)

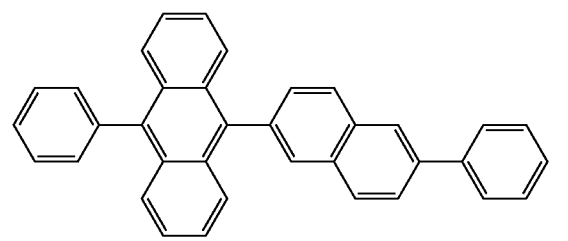

(2-6)

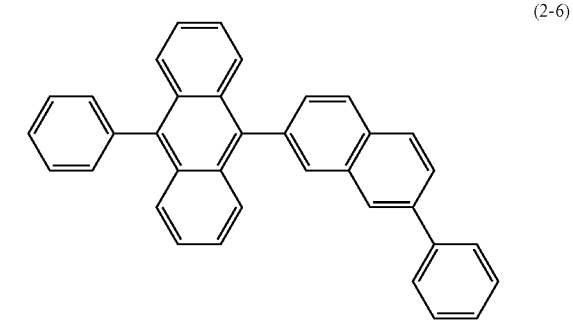

(2-7)

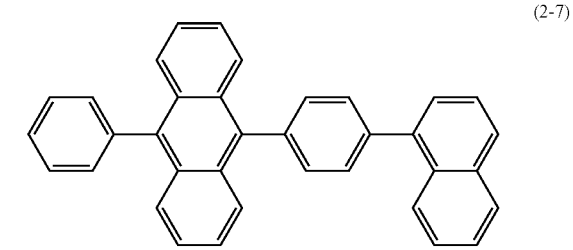

(2-8)

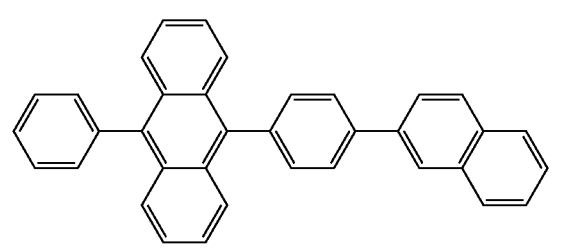

(2-9)

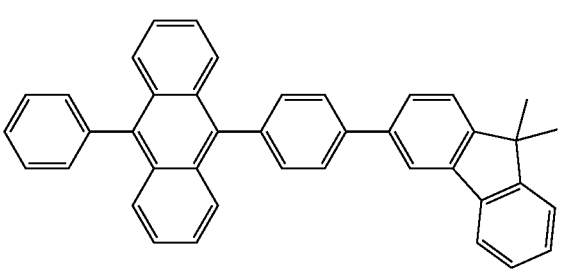

-continued
(2-10)
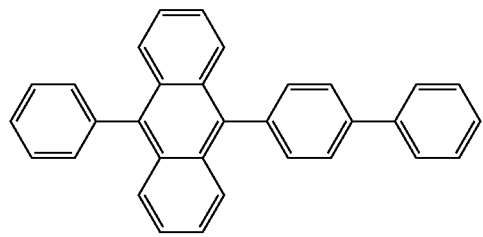
(2-11)
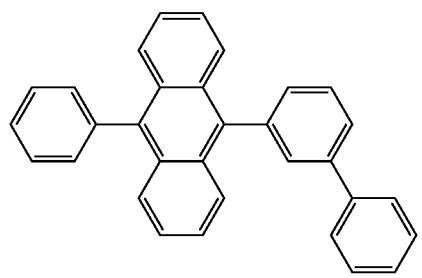
(2-12)
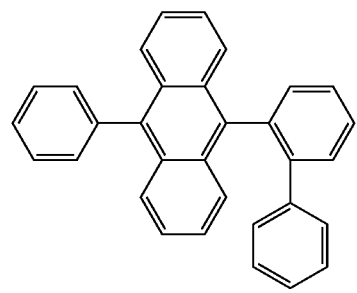
(2-13)
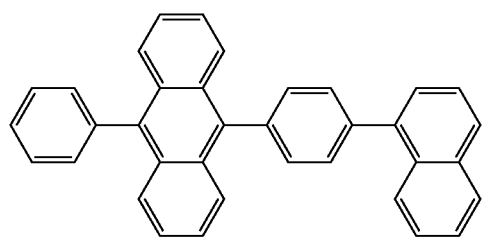
(2-14)
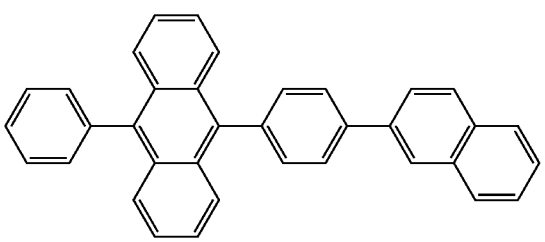
(2-15)
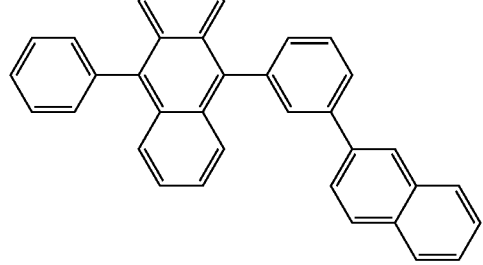
-continued
(2-16)
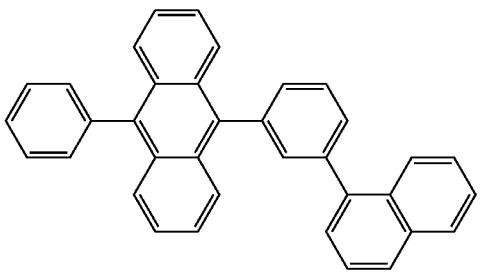
(2-17)
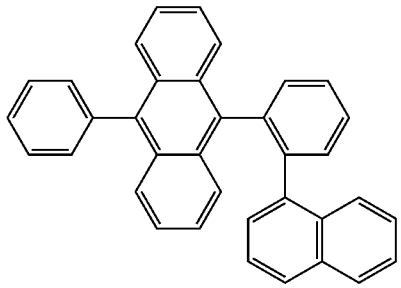
(2-18)
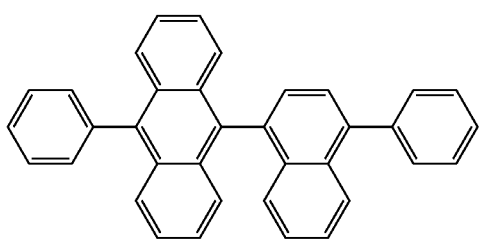
(2-19)
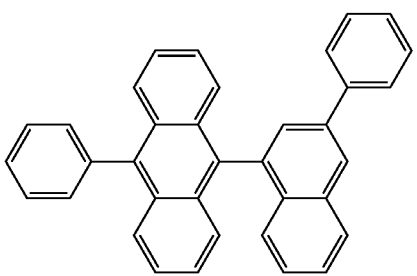
(2-20)
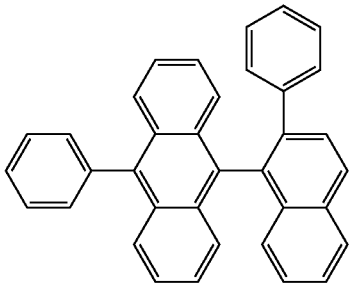
(2-21)
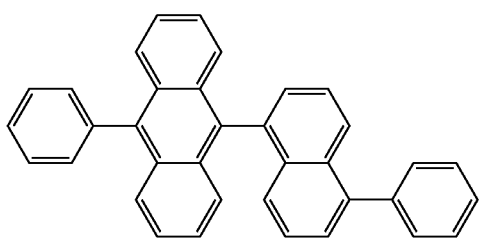

(2-22)
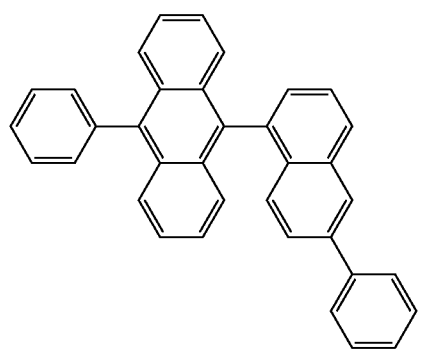
(2-23)
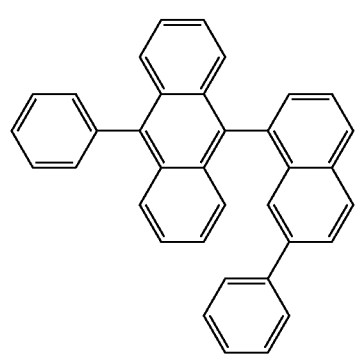
(2-24)
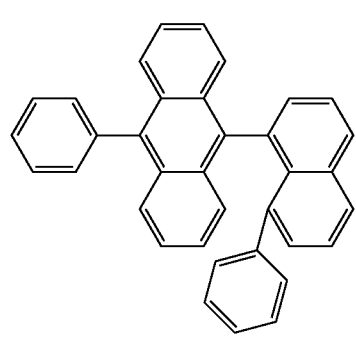
(2-25)
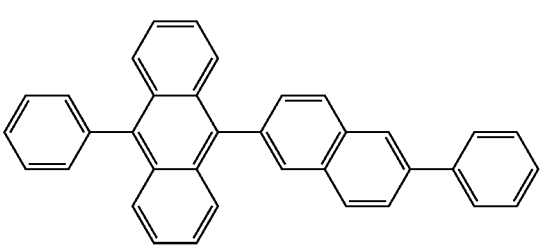
(2-26)
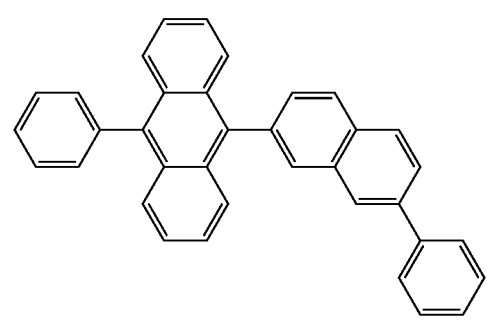
(2-27)
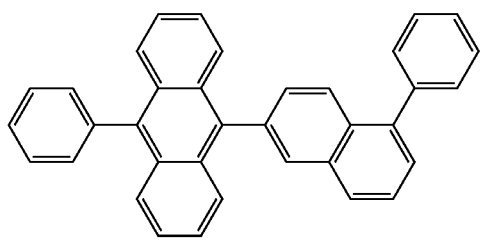
(2-28)
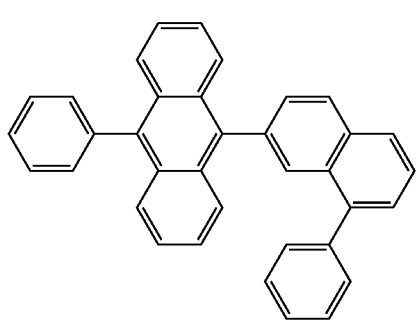
(2-29)
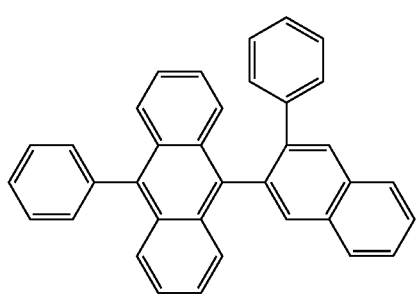
(2-30)
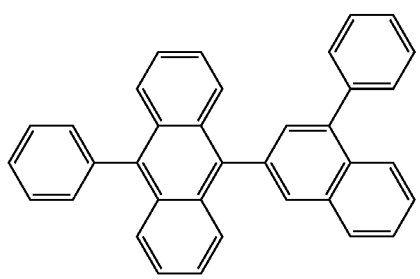
(2-31)
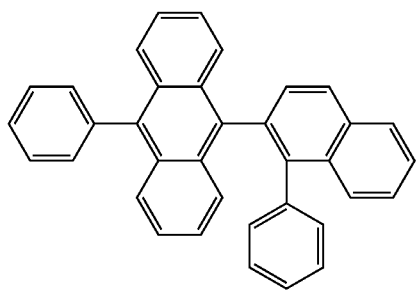

(2-32)
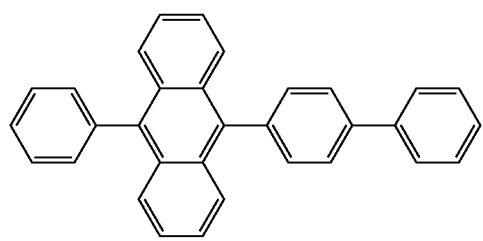
(2-33)
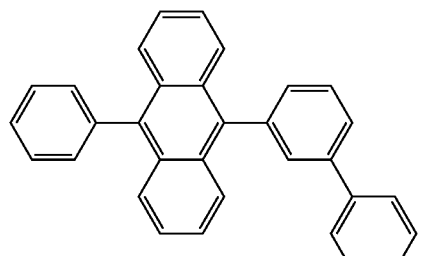
(2-34)
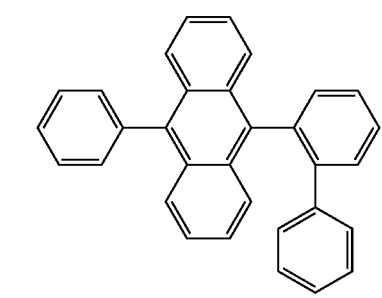
(2-35)
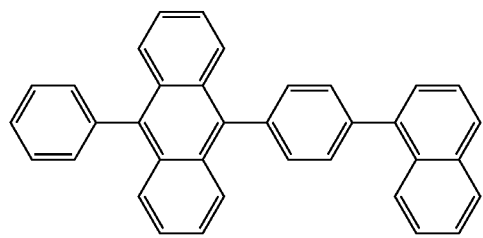
(2-36)
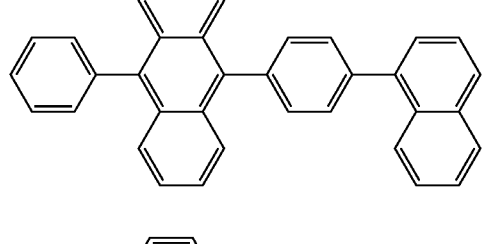
(2-37)
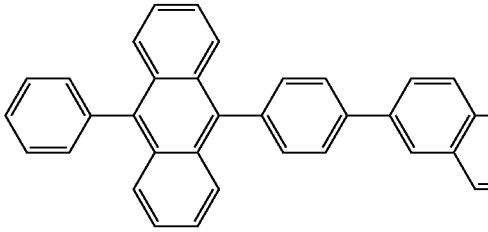
(2-38)
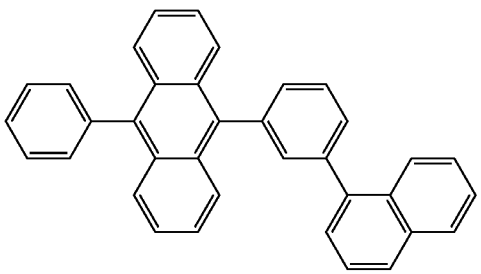
(2-39)
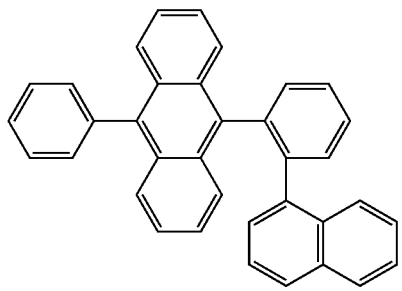
(2-40)
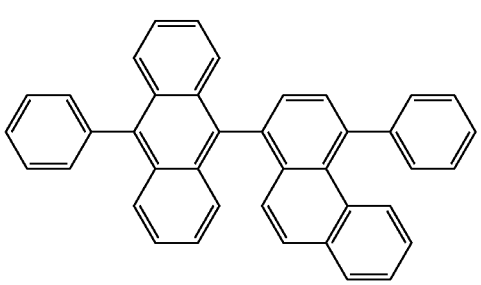
(2-41)
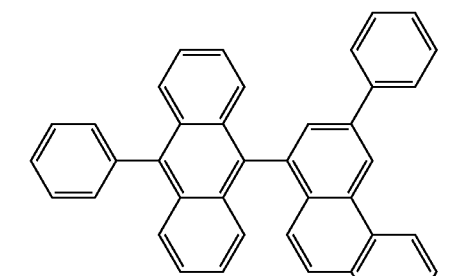
(2-42)
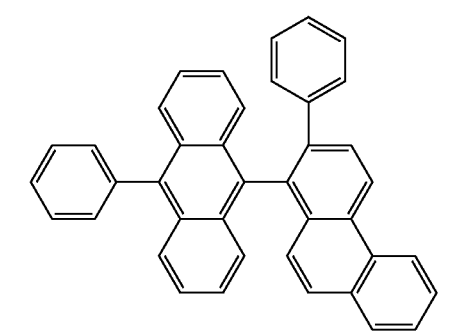
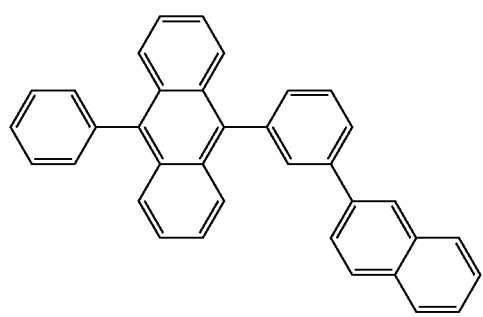

-continued
(2-43)
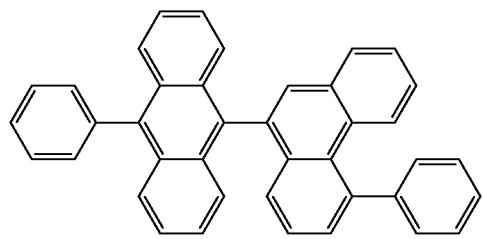
(2-44)
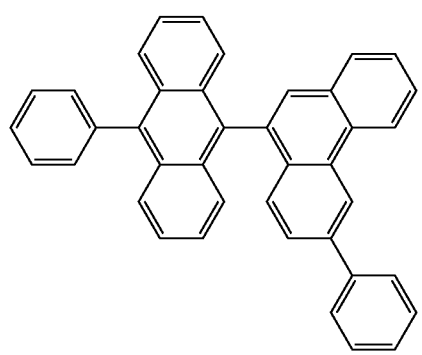
(2-45)
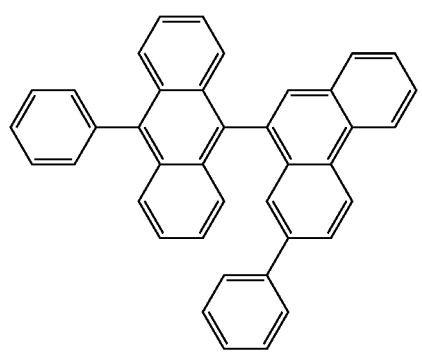
(2-46)
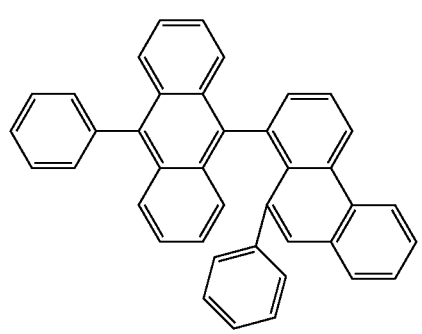
(2-47)
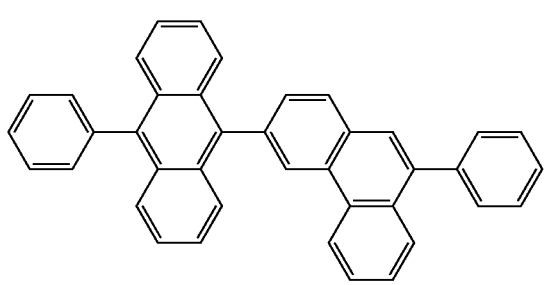
-continued
(2-48)
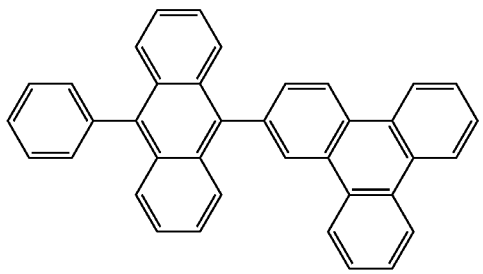
(2-49)
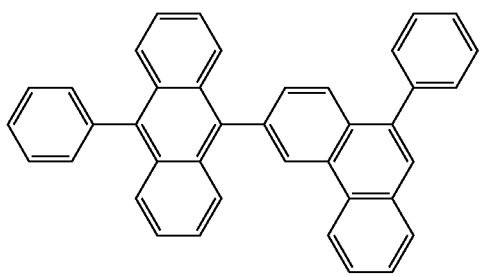
(2-50)
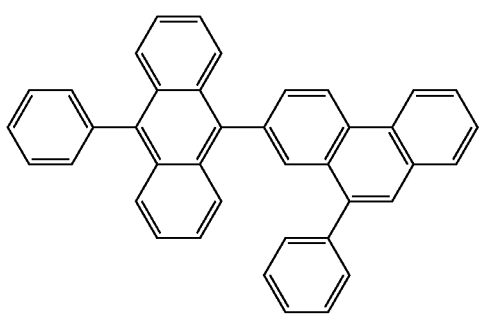
(2-51)
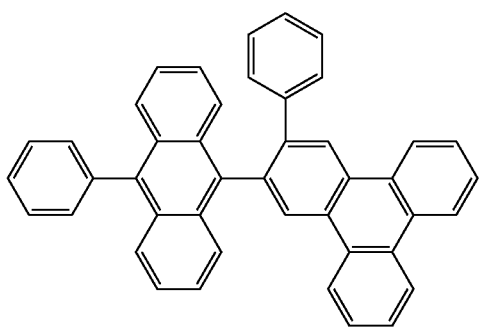
(2-52)
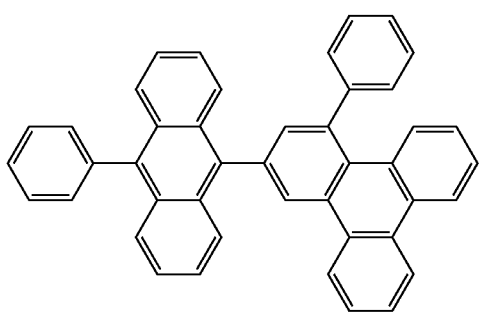

(2-53)
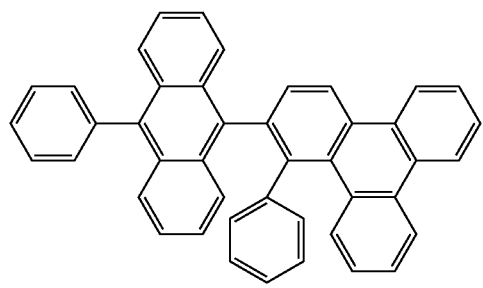
(2-54)
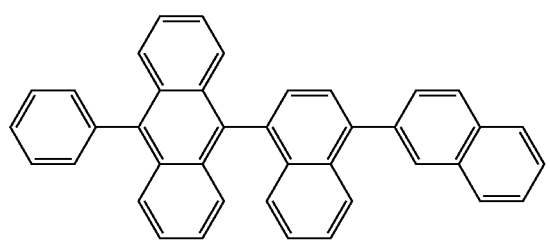
(2-55)
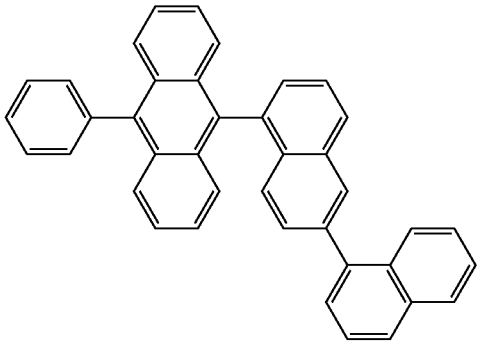
(2-56)
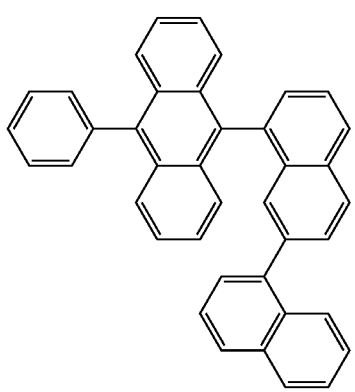
(2-57)
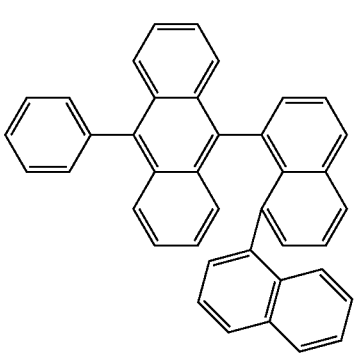
(2-58)
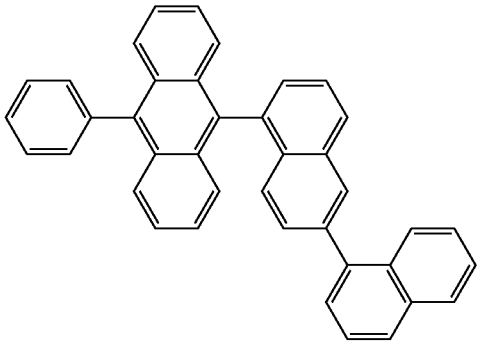
(2-59)
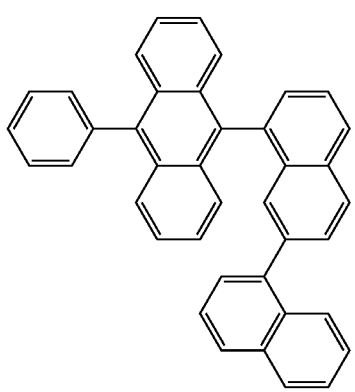
(2-60)
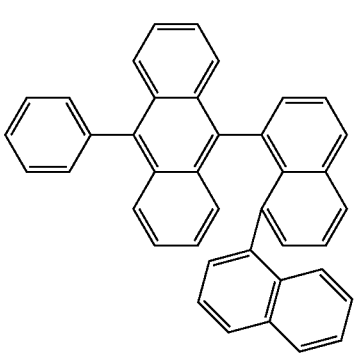
(2-61)
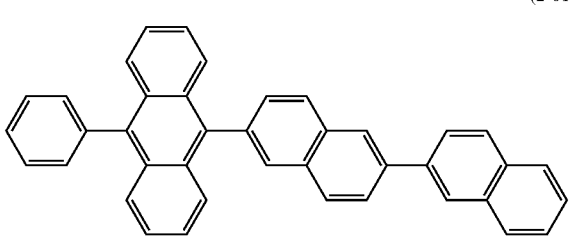
(2-62)
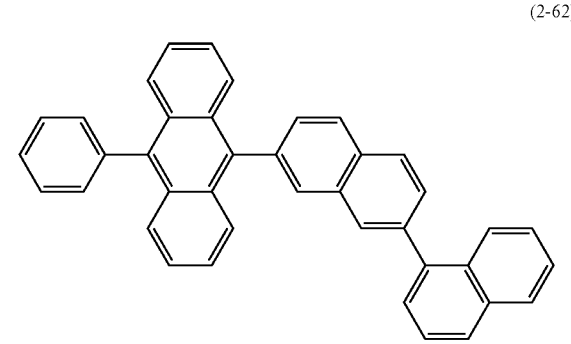

(2-63)
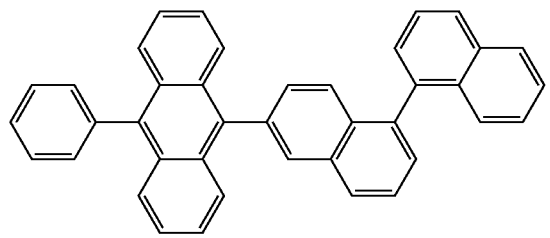
(2-64)
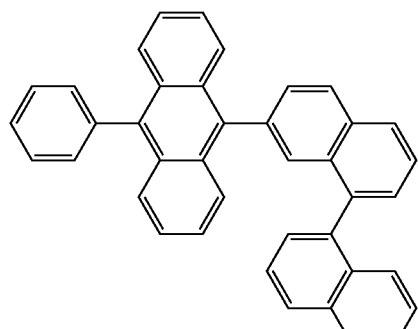
(2-65)
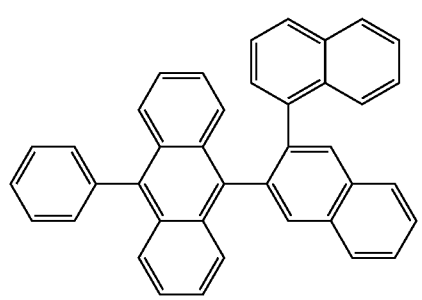
(2-66)
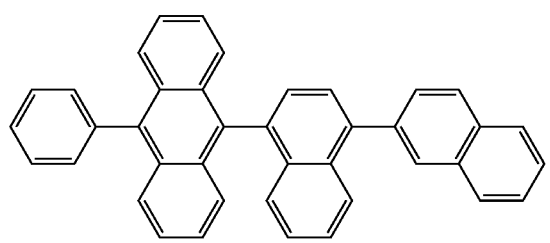
(2-67)
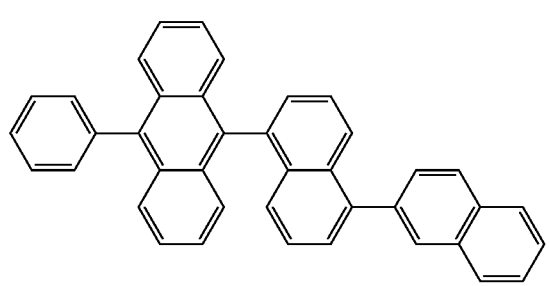
(2-68)
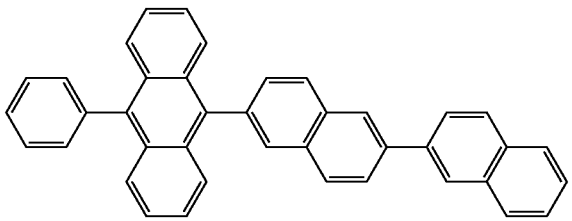
(2-69)
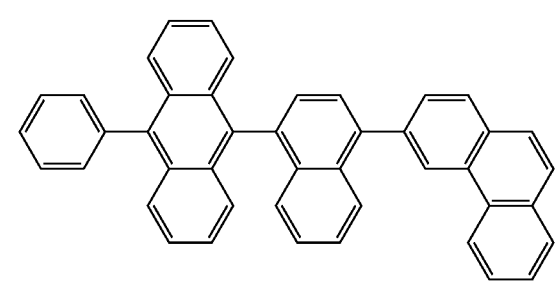
(2-70)
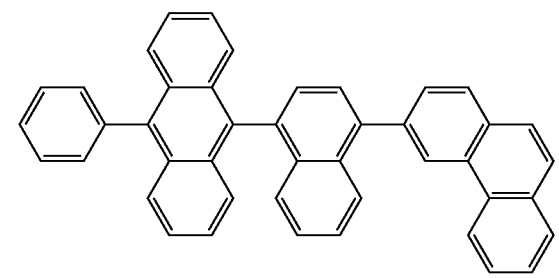
(2-71)
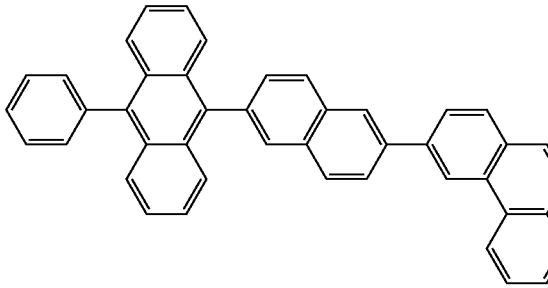
(2-72)
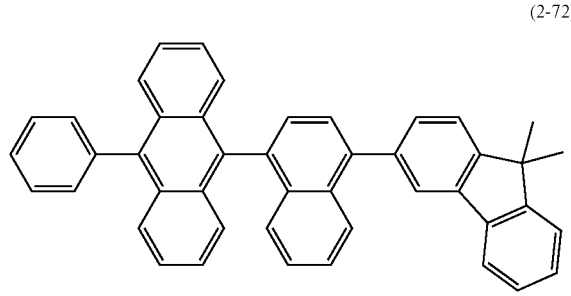

(2-73)
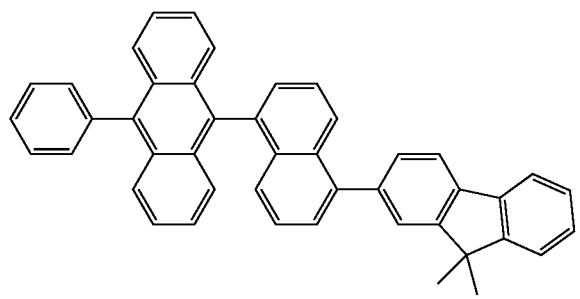
(2-74)
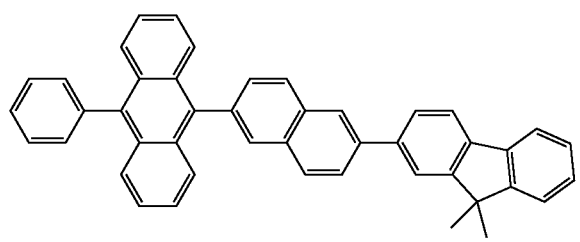
(2-75)
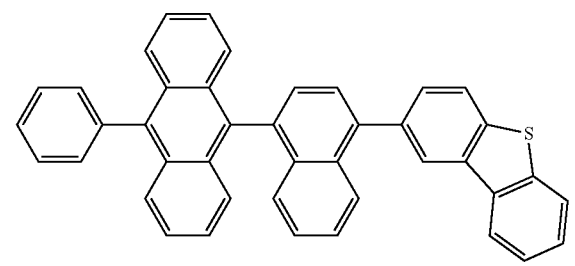
(2-76)
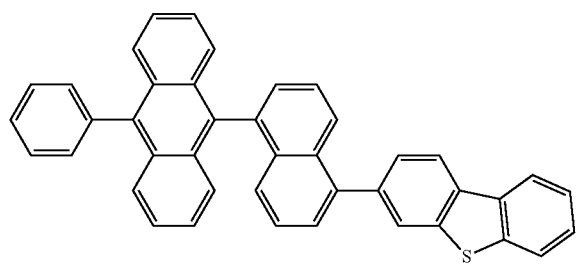
(2-77)
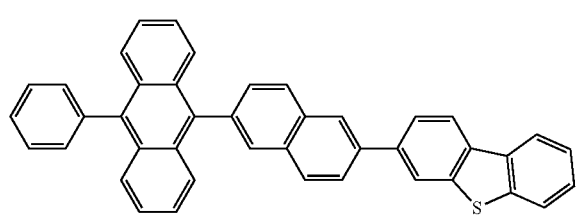
(2-78)
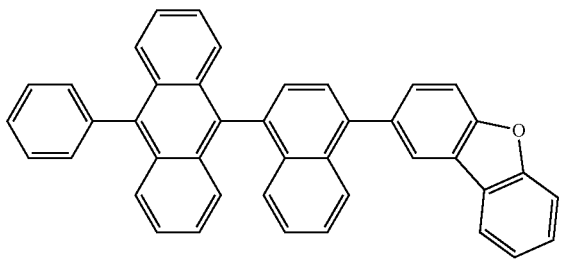
(2-79)
(2-80)
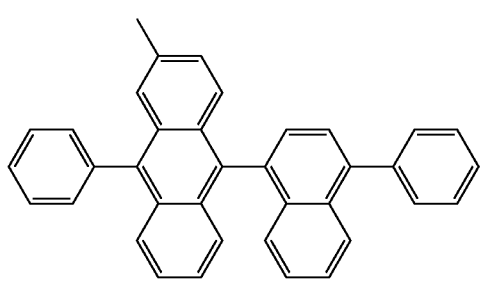
(2-81)
(2-82)
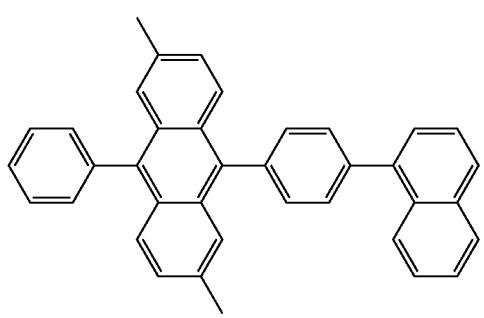

(2-83)
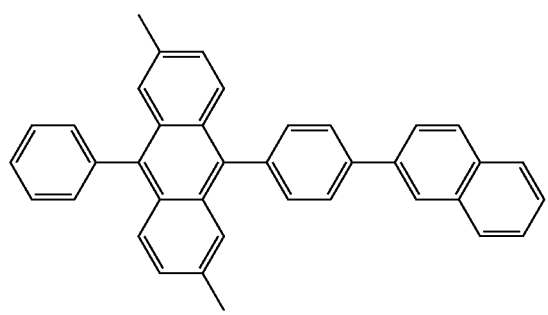
(2-84)
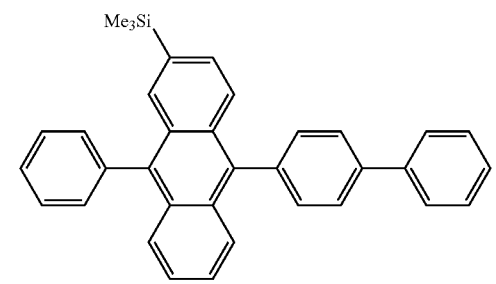
(2-85)
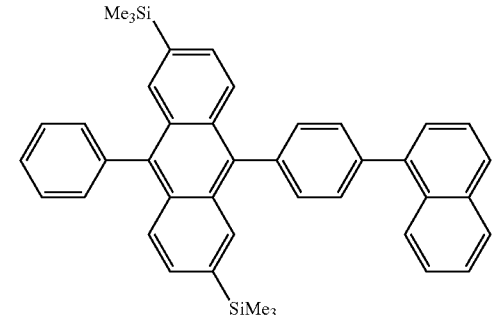
(2-86)
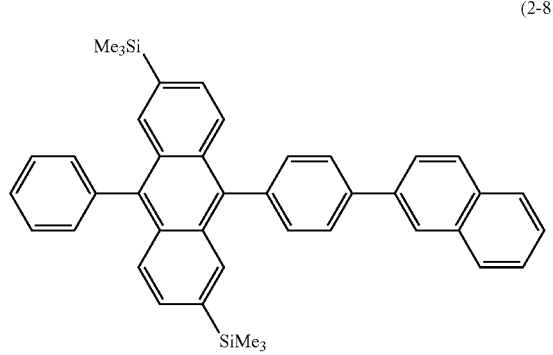
(2-87)
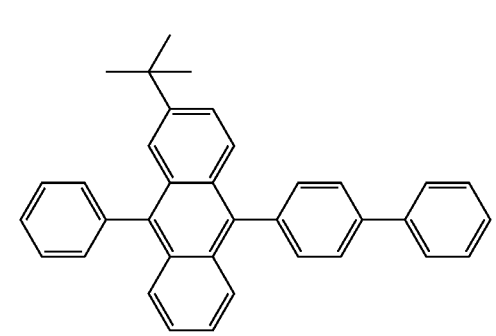
(2-88)
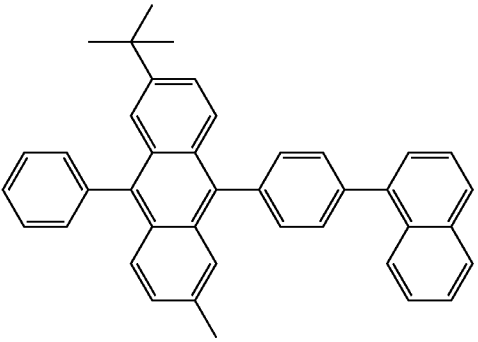
(2-89)
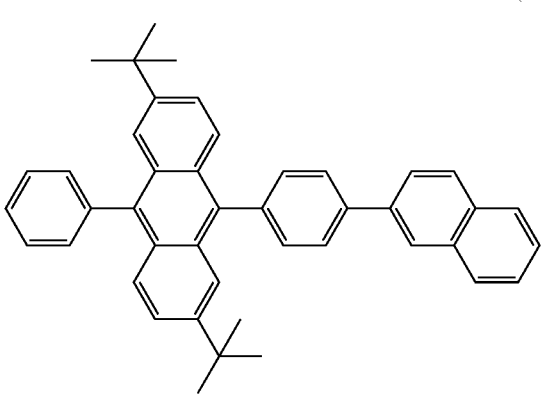
(2-90)
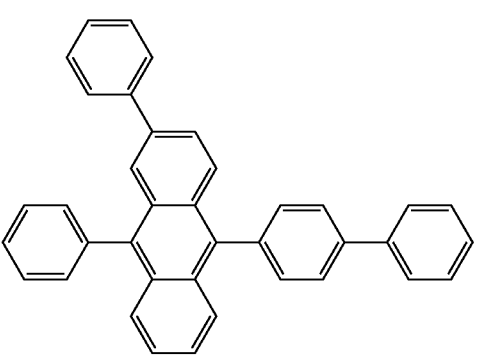
(2-91)
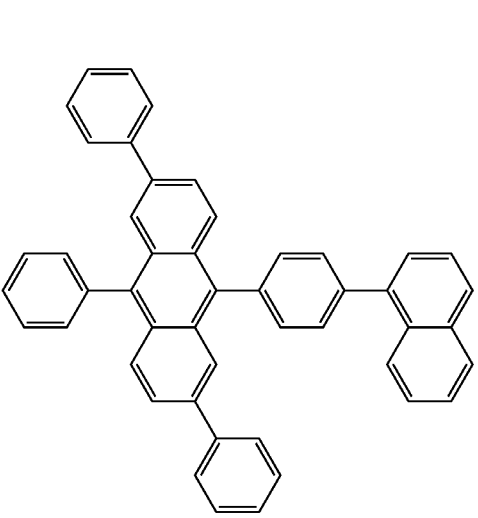

(2-92)
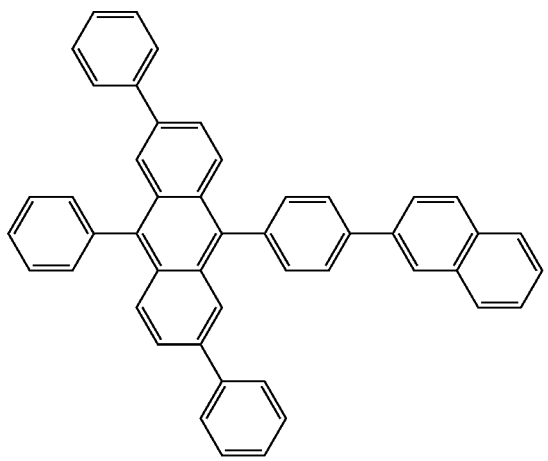

(2-93)
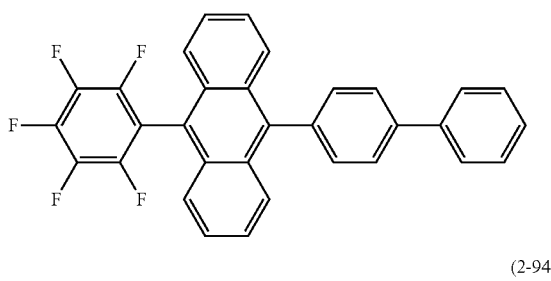

(2-94)
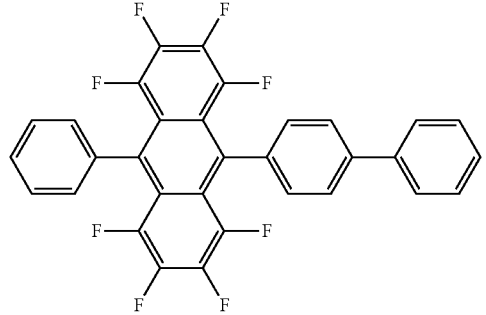

(2-95)
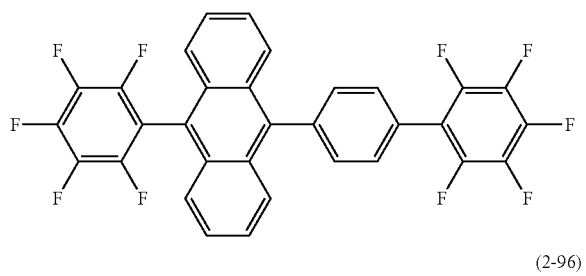

(2-96)
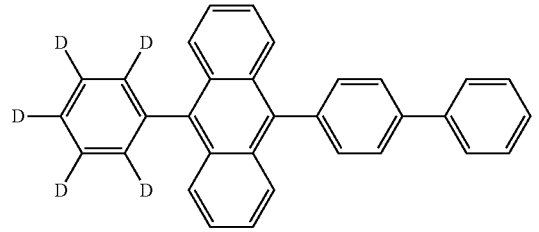

(2-97)
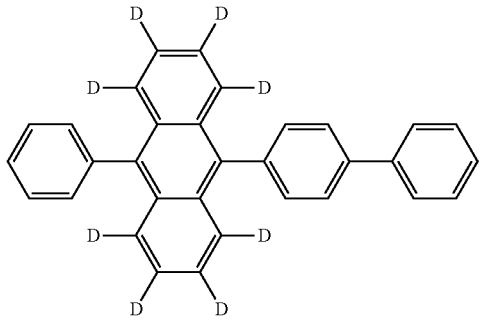

(2-98)
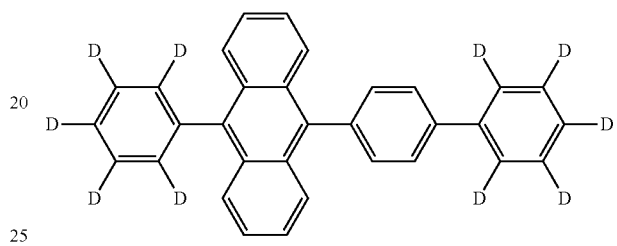

The emission layer 60 may additionally include a dopant material. In an implementation, IDE102 and IDE105 which may be purchased from Idemitsu Co., Ltd. and C545T that may be purchased from Hayashibara Co., Ltd., may be used as a fluorescent dopant, and a red phosphorous dopant PtOEP, RD 61 of UDC Co., Ltd, a green phosphorous dopant Ir(PPy)$_3$(PPy=2-phenylpyridine), a blue phosphorous dopant F$_2$Irpic, and a red phosphorous dopant RD 61 of UDC Co., Ltd. may be used as a phosphorous dopant.

In an implementation, as a dopant of the emission layer 60, Ir(ppy)$_3$, Ir(ppy)$_2$acac, (piq)$_2$Ir(acac), Pt(OEP), or the like may be used.

In an implementation, the dopant may be included in an amount of about 0.01 to about 15 parts by weight, with respect to 100 parts by weight of the host.

In an implementation, the dopant included in the emission layer 60 may be or include a third compound represented by Chemical Formula 3.

[Chemical Formula 3]

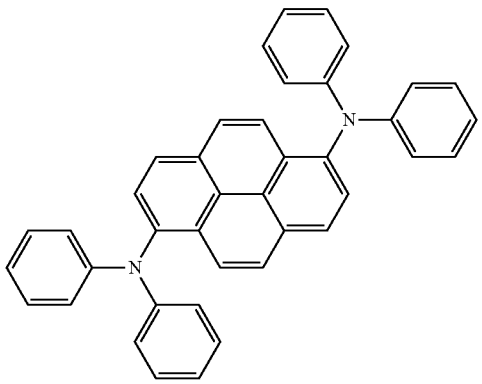

The third compound may be included in an amount of about 1 to about 10 parts by weight, with reference to 100 parts by weight of the host.

The third compound may be included in the emission layer 60 in an amount of up to about 5 wt %.

The second compound and the third compound may be deposited simultaneously when forming the emission layer.

The emission layer 60 may be formed using various methods such as a vacuum deposition method, a spin coating method, a casting method, an LB method, or the like.

When an organic layer, e.g., the emission layer 60 is formed using the vacuum deposition method, the deposition conditions may vary according to the material that is used to form the organic layer, and the structure and thermal characteristics of the organic layer. For example, the deposition conditions may include a deposition temperature of about 100° C. to 500° C., a vacuum pressure of about $10^{-8}$ to about $10^{-3}$ torr, and/or a deposition speed of about 0.01 to about 100 Å/s.

When an organic layer, e.g., the emission layer 60 is formed using the spin coating method, the coating conditions may vary according to the material used to form the organic layer, and the structure and thermal characteristics of the organic layer. For example, the coating conditions may include a coating speed of about 2,000 rpm to about 5,000 rpm, and/or a thermal treatment temperature of about 80° C. to about 200° C. at which the solvent remaining after coating may be removed.

The hole transfer layer 30 may include a suitable hole transfer material, e.g., an arylene-diamine derivative, a star-burst-based compound, a biphenyl-diamine derivative including a spiro group, or a ladder-type compound. For example, the hole transfer layer 30 may include a carbazole derivate including 4,4″,4‴-tris[(3-methylphenyl(phenyl) amino)]triphenylamine (m-MTDATA), 1,3,5-tris[4-(3-methylphenylphenylamine)phenyl]benzene (m-MTDATB), copper phthalocyanine (CuPc), N-phenylcarbazole, polyvinyl carbazole, and the like, and a suitable amine derivate including an aromatic condensed ring such as N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or the like.

In an implementation, the hole transport layer may include a fifth compound represented by Chemical Formula 5.

[Chemical Formula 5]

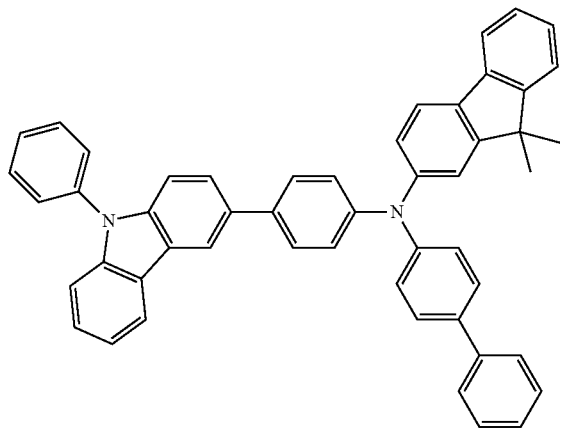

In an implementation, the hole transfer layer 30 may have a thickness of about 50 Å to about 1,000 Å, e.g., about 100 Å to about 600 Å. When the thickness of the hole transfer layer 30 satisfies the above-stated range, an excellent hole transfer characteristic may be acquired without a substantial increase of a driving voltage.

The hole transfer layer 30 may further include an assistant material for improvement of film conductivity, and in this case, the auxiliary material may be evenly or unevenly dispersed in the layers or may be variously deformed.

The hole transfer layer 30 may be formed in an upper portion of the anode 10 using various methods such as a vacuum deposition method, a spin coating method, a casting method, an LB method, or the like. When the vacuum deposition method and the spin coating method are used to form the hole transfer layer 30, deposition conditions and coating conditions may vary according to a compound that is used to form the hole transfer layer 30.

An electron blocking layer may be additionally provided between the hole transfer layer 30 and the emission layer 60. In an implementation, a hole injection layer, which is a material that facilitates injection of holes from the anode, may be layered between the hole transfer layer 30 and the anode 10.

The hole injection material may include a suitable hole injection material, e.g., TCTA, m-MTDATA, m-MTDAPB, Pani/DBSA (polyaniline/dodecylbenzene sulfonic acid), which is a soluble conductive polymer, or PEDOT/PSS (poly(3,4-ethylenedioxythiophene)/poly(4-styrenesulfonate): poly(3,4-ethylenedioxythiophene)/poly(4-styrenesulfonate)), Pani/CSA (polyaniline/camphor sulfonic acid), or PANI/PSS (polyaniline)/Poly (4-styrenesulfonate)).

In an implementation, the hole injection layer may include a fourth compound represented by Chemical Formula 4.

[Chemical Formula 4]

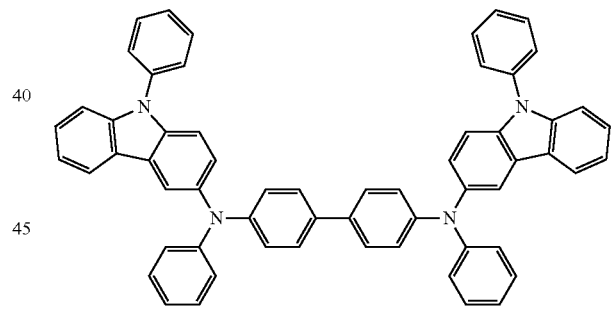

The hole injection layer may be formed using various methods such as a vacuum deposition method, a spin coating method, a casting method, an LB method, or the like. When the hole injection layer is formed according to the vacuum deposition method, the deposition conditions depend on a compound used for a material of the hole injection layer, and a configuration and a thermal characteristic of the target hole injection layer. In an implementation, a deposition temperature may be between 100 and 500° C., a vacuum degree may be between $10^{-8}$ and $10^{-3}$ torr, a deposition speed may be between 0.01 and 100 Å/s, and/or a layer thickness may be between 10 Å and 5 μm.

When the hole injection layer is formed by using the spin coating method, coating conditions depend on a compound used as a material of the hole injection layer, and a configuration and a thermal characteristic of the target hole injection layer, and it is desirable to appropriately select a coating speed substantially between 2,000 and 5,000 rpm and/or a heat treatment temperature for removing a solvent after a coating process substantially between 80 and 200° C.

The deposition conditions and the coating conditions of the hole injection layer may be similarly applicable to formation of the hole transfer layer.

The electron transfer layer 40 may include one or more compounds selected from a quinoline derivative, e.g., tris (8-hydroxyquinolinato)aluminum (Alq3), 3-(4-biphenyl)-4-phenyl-5-(4-tert-butylphenyl)-1,2,4-triazole (TAZ), (2-methyl-8-quninolinato)-4-phenylphenolate (BAlq), bis (10-hydroxybenzo(h)quinolinato)beryllium (Bebq$_2$), or 4,7-diphenyl-1-10-phenanthroline (BPhen). In an implementation, lithium quinolate (Liq) may be doped to the compound selected from the group. In this case, a doping density may be about 50 wt %.

The electron transfer layer 40 may have a thickness of about 100 Å to about 1,000 Å, e.g., about 200 Å to about 500 Å. Maintaining the thickness of the electron transfer layer 40 at about 100 Å or greater may help ensure that an electron transfer characteristic is not deteriorated. Maintaining the thickness of the electron transfer layer at about 1,000 Å or less may help prevent an increase in a driving voltage.

The electron transfer layer 40 may be formed using various methods such as a vacuum deposition method, a spin coating method, a casting method, an LB method, or the like. The vacuum deposition method and the spin coating method may be used to form the electron transfer layer 40, and conditions thereof may be changed according to a compound used.

In addition, an electron injection layer, which is a material that facilitates injection of electrons from a cathode, may be layered between the electron transfer layer and the cathode. As a material for forming the electron injection layer, suitable materials, e.g., LiF, NaCl, CsF, Li$_2$O, BaO, or the like may be used. The deposition conditions and the coating conditions of the electron injection layer may vary according to a compound that is used to form the electron injection layer. In an implementation, the condition ranges for forming the electron injection layer may be almost the same as the conditions for forming the hole injection layer.

The hole blocking layer 50 may be between the electron transfer layer 40 and the emission layer 60, and may act as a barrier that blocks movement of holes. The hole blocking layer 50 may also be referred to as a buffer layer.

In an implementation, the hole blocking layer 50 may include a first compound represented as at least one of the following Chemical Formulae 1-A to 1-D.

[Chemical Formula 1-A - Chemical Formula I-D]

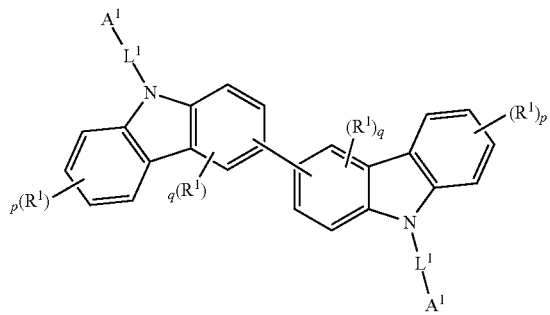

(1-A)

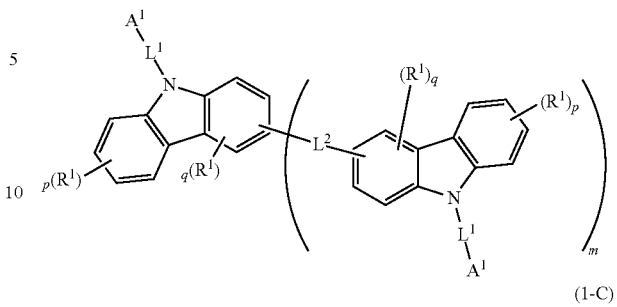

(1-B)

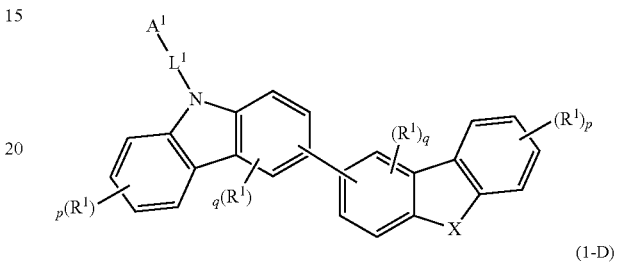

(1-C)

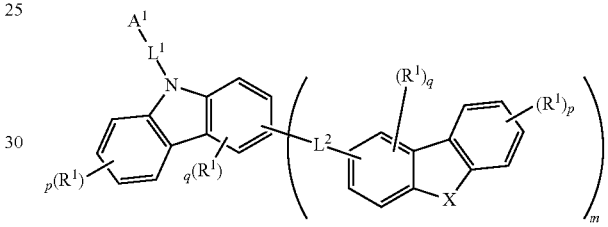

(1-D)

In Chemical Formula 1-A to 1-D, each A$^1$ may independently be or include, e.g., a substituted or unsubstituted ring-type C1 to C30 aromatic hydrocarbon group or a substituted or unsubstituted ring-type C1 to C30 condensed aromatic heterocyclic group. For example, in Chemical Formula 1-A to 1-D, each A$^1$ may independently be or include, e.g., a substituted or unsubstituted C6 to C30 aromatic hydrocarbon group or a substituted or unsubstituted C1 to C30 condensed aromatic heterocyclic group.

L$^1$ and L$^2$ may be a connection group. L$^1$ and L$^2$ may each independently be or include individual single bonds, a substituted or unsubstituted C6 to C30 aromatic hydrocarbon group, a substituted or unsubstituted ring-type C6 to C30 condensed aromatic hydrocarbon group, a substituted or unsubstituted C2 to C30 aromatic heterocyclic group, or a substituted or unsubstituted ring-type C2 to C30 condensed aromatic heterocyclic group. For example, L$^1$ and L$^2$ may each independently be or include individual single bonds, a substituted or unsubstituted C6 to C30 aromatic hydrocarbon group, a substituted or unsubstituted C6 to C30 condensed aromatic hydrocarbon group, a substituted or unsubstituted C2 to C30 aromatic heterocyclic group, or a substituted or unsubstituted C2 to C30 condensed aromatic heterocyclic group.

Each X may independently be S, O, N—R$^1$, or C(R$^1$)$_2$.

Each R$^1$ may independently be or include, e.g., hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted ring-type C6 to C30 aromatic hydrocarbon group, a substituted or unsubstituted ring-type C6 to C30 condensed aromatic hydrocarbon group, a substituted or unsubstituted ring-type C2 to C30 aromatic heterocyclic group, or a substituted or unsubstituted C2 to C30 condensed aromatic heterocyclic group. For example, each $R^1$ may independently be or include hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted C6 to C30 aromatic hydrocarbon group, a substituted or unsubstituted C6 to C30 condensed aromatic hydrocarbon group, a substituted or unsubstituted C2 to C30 aromatic heterocyclic group, or a substituted or unsubstituted C2 to C30 condensed aromatic heterocyclic group.

p may be an integer of 1 to 4.

q may be an integer of 1 to 3.

When p is an integer of 2 to 4, e.g., 2, 3, or 4, and/or q is 2 or 3, each $R^1$ may be the same as or different from one another.

m may be an integer of 1 to 3, and when m is 2 or 3, each $R^1$, $L^1$, $A^1$, and/or $L^2$ may be the same as or different from one another.

The first compound may include a compound represented by one of the following Chemical Formulae 1-1 to 1-227.

(1-1)

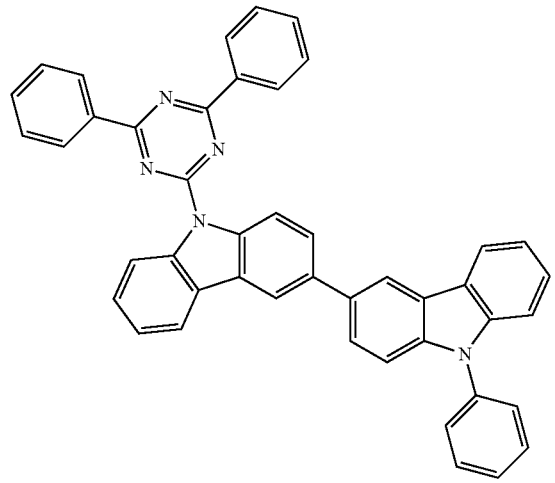

(1-2)

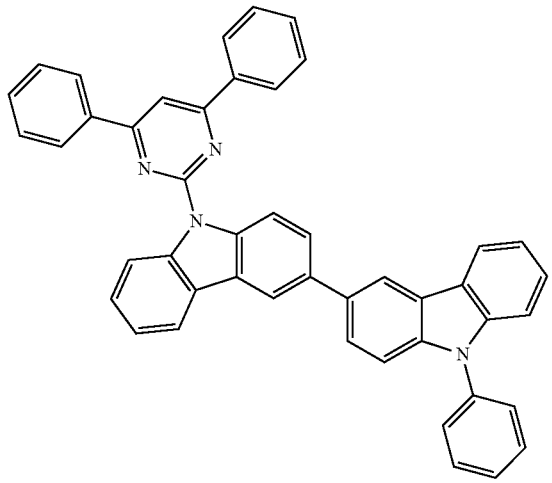

(1-3)

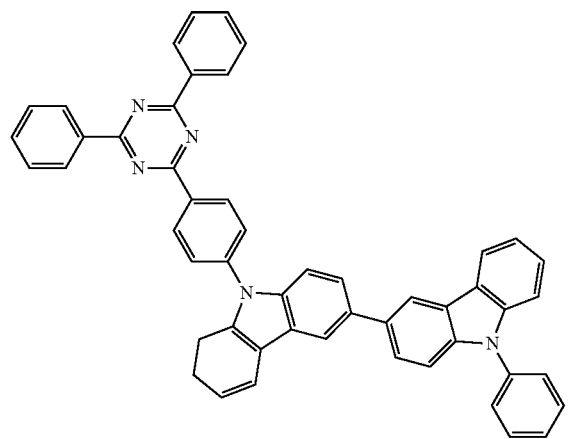

(1-4)

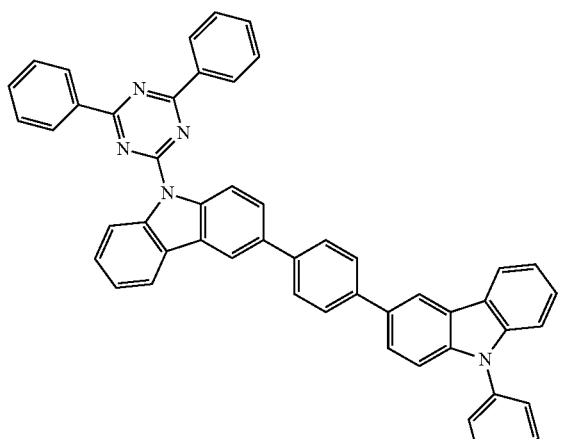

-continued
(1-5)
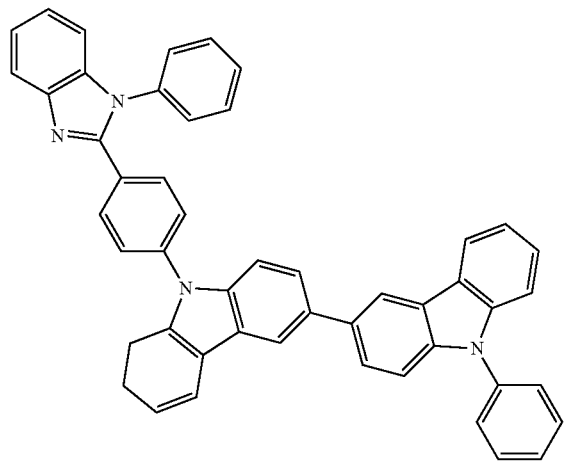
(1-6)
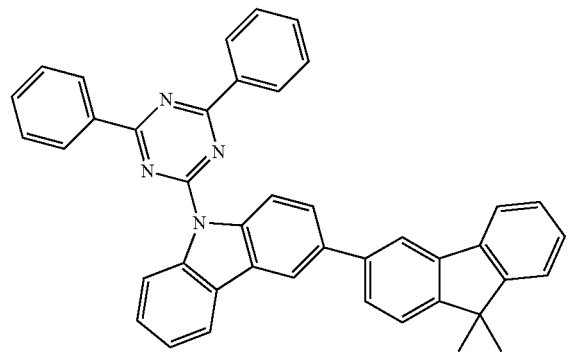
(1-7)
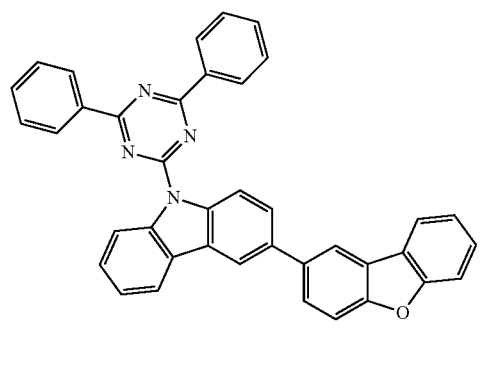
(1-8)
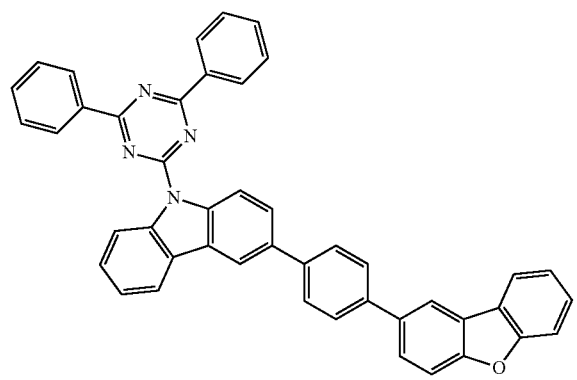
(1-9)
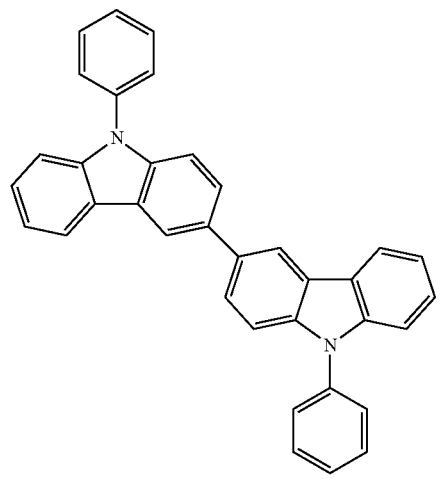
(1-10)
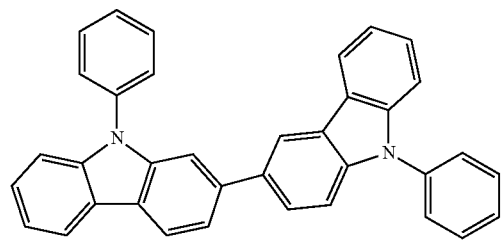

-continued
(1-11)
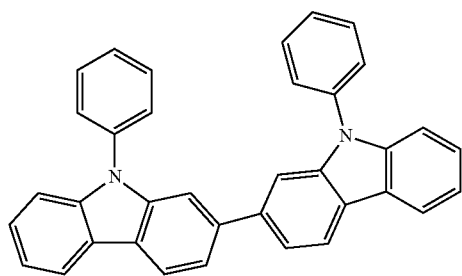
(1-12)
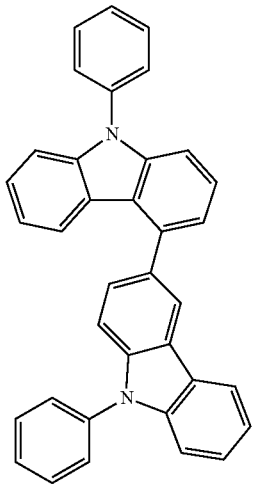
(1-13)
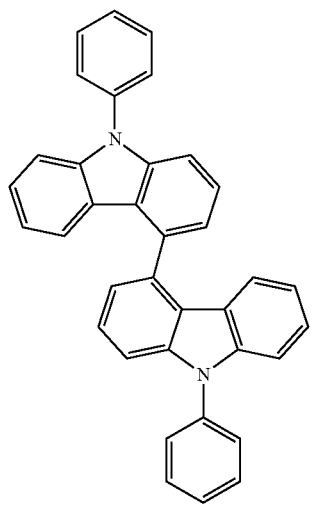
(1-14)
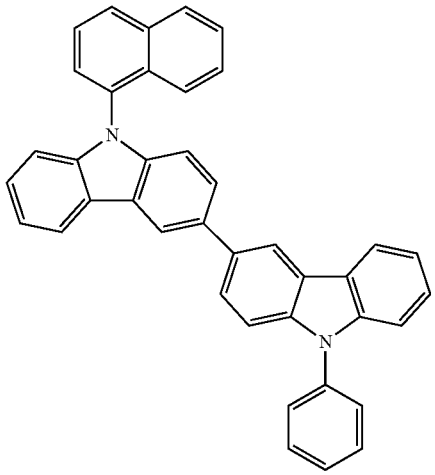
(1-15)
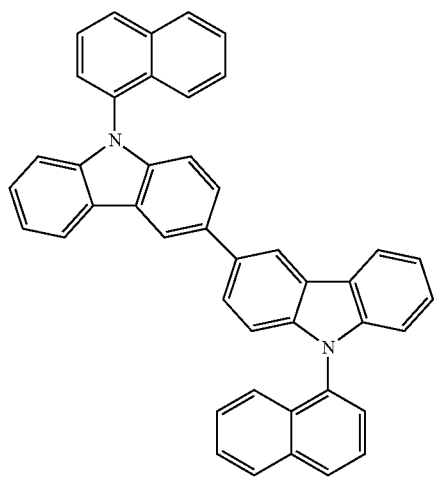
(1-16)
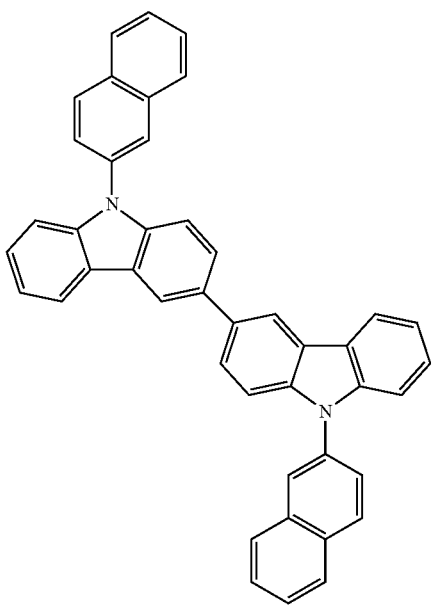

-continued
(1-17)
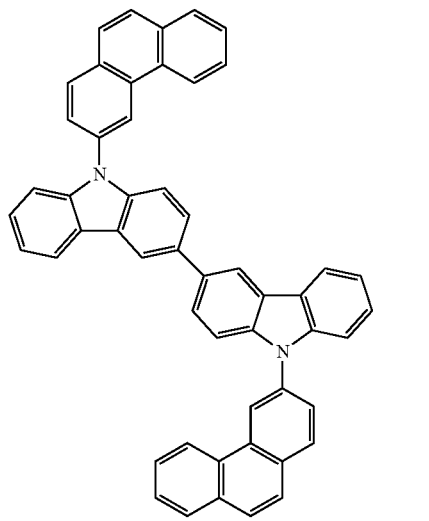
(1-18)
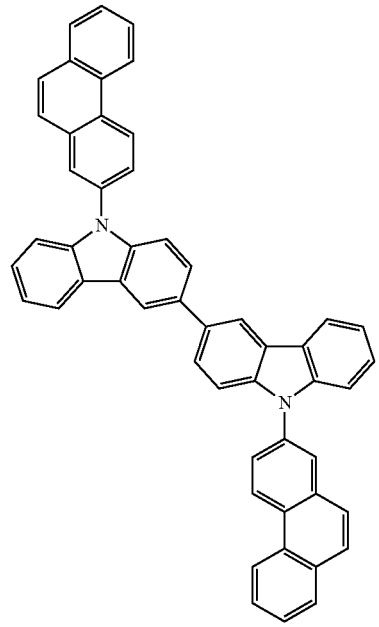
(1-19)
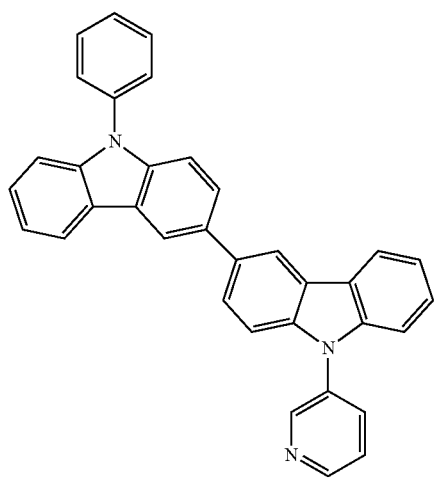
(1-20)
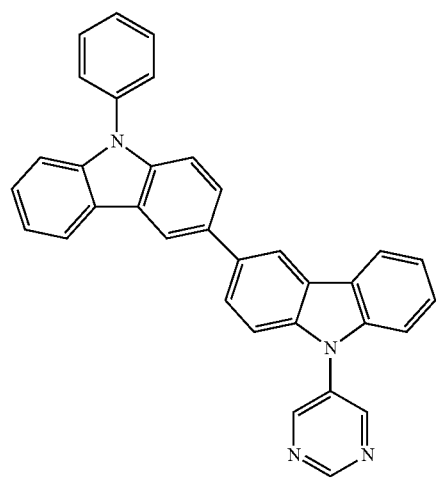
(1-21)
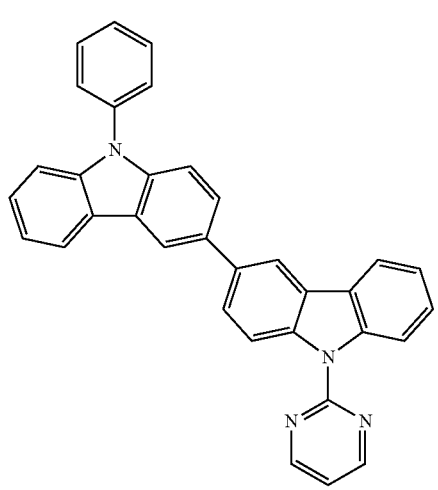
(1-22)
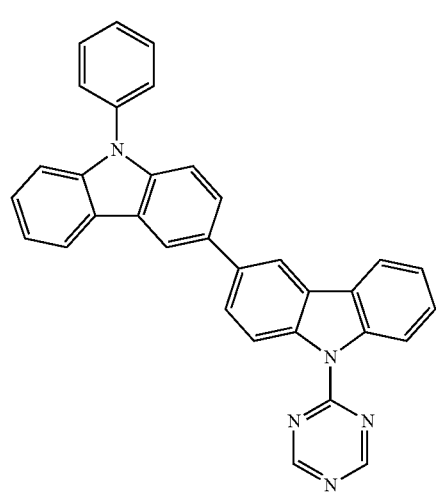

-continued
(1-23)
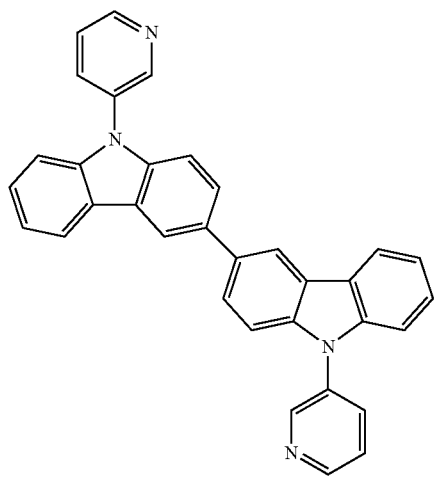
(1-24)
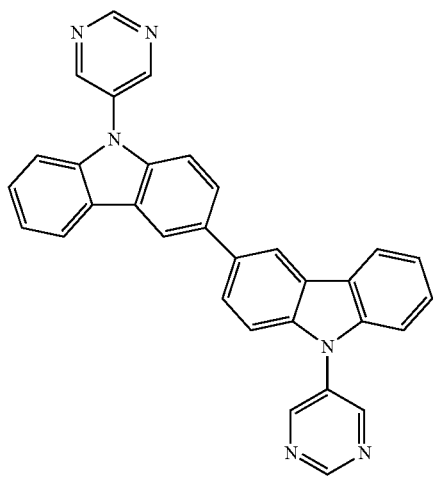
(1-25)
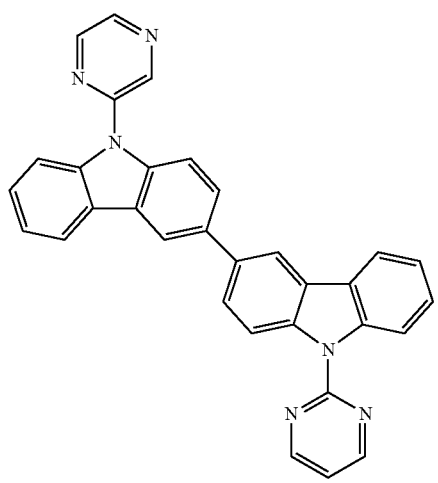
(1-26)
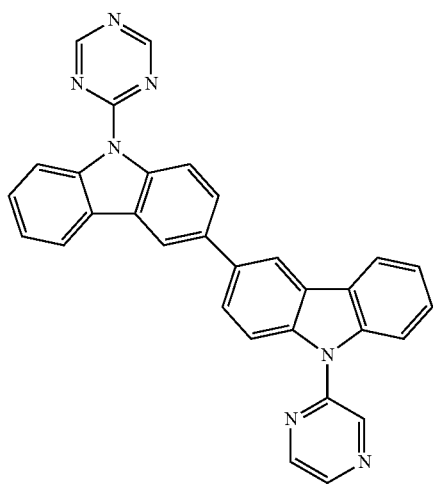
(1-27)
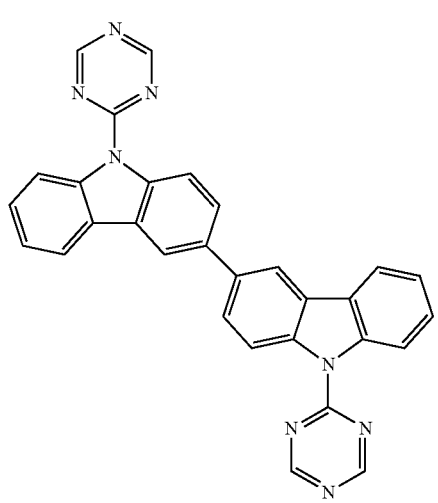
(1-28)
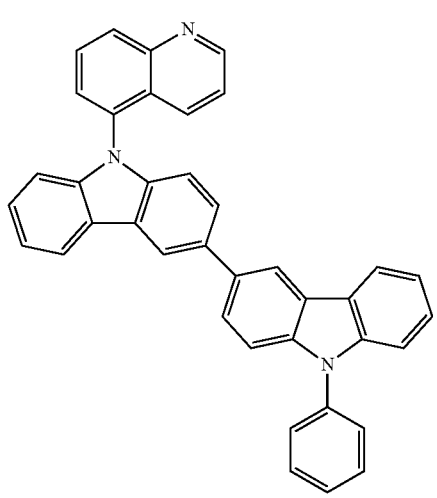

(1-29)
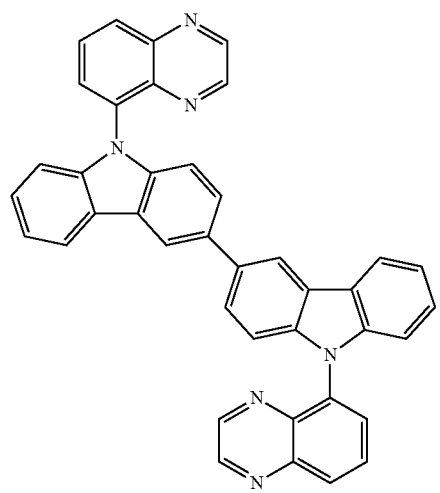
(1-30)
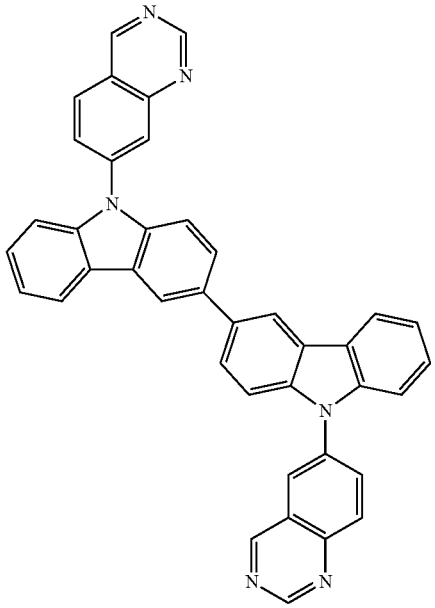
(1-31)
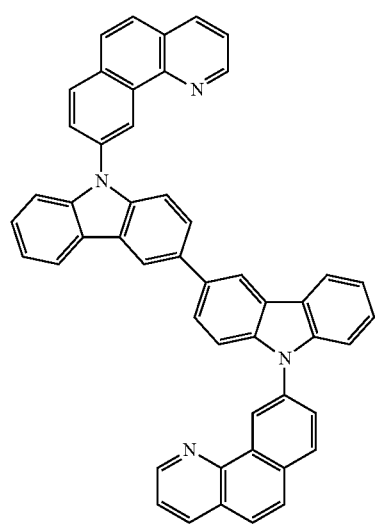
(1-32)
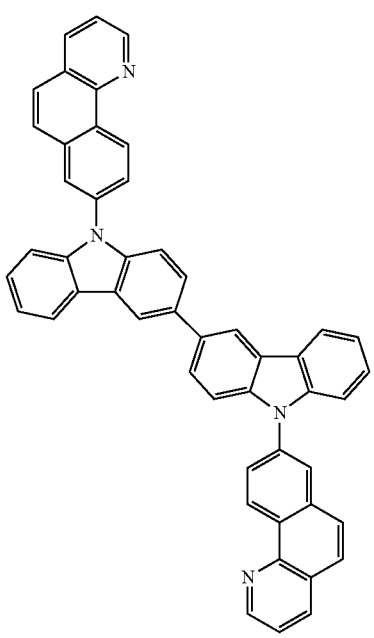

-continued
(1-33)
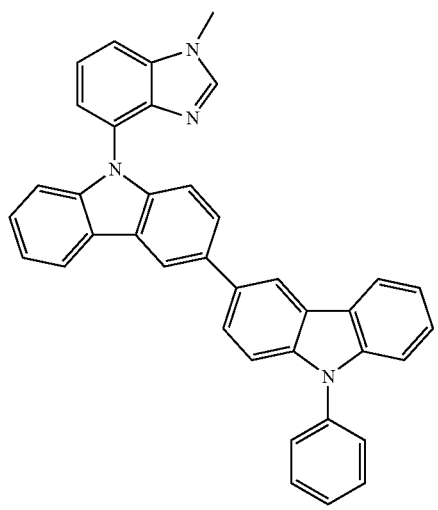
(1-34)
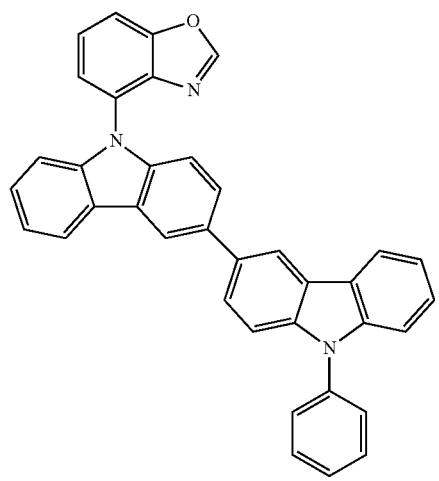
(1-35)
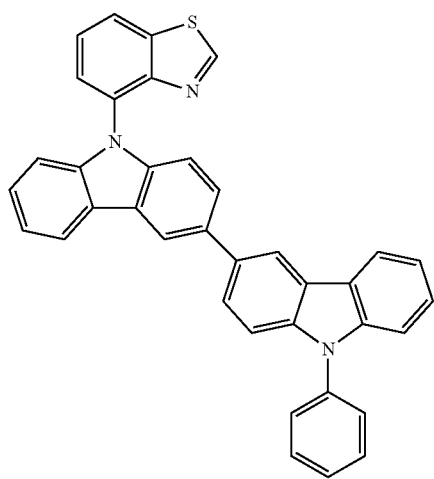
(1-36)
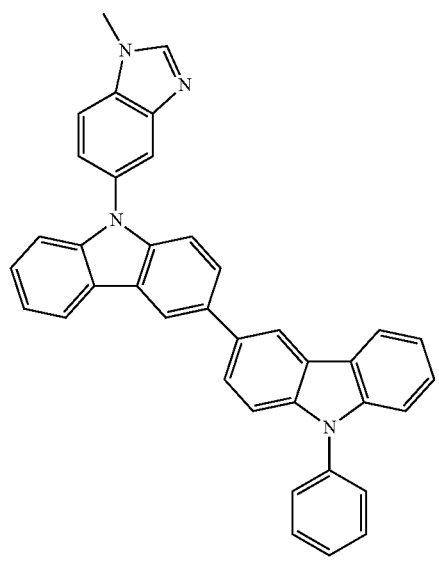
(1-37)
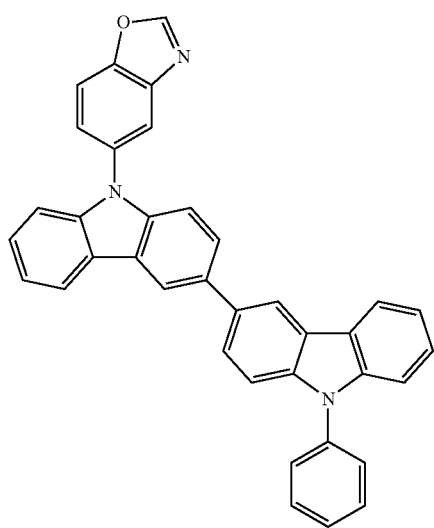
(1-38)
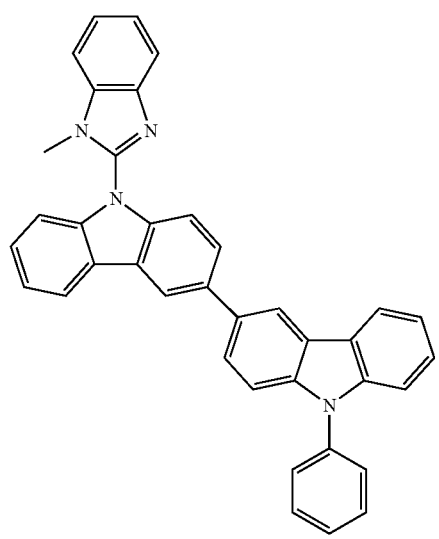

-continued
(1-39)
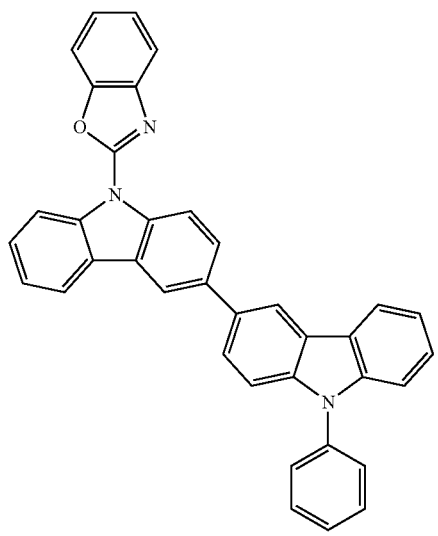
(1-40)
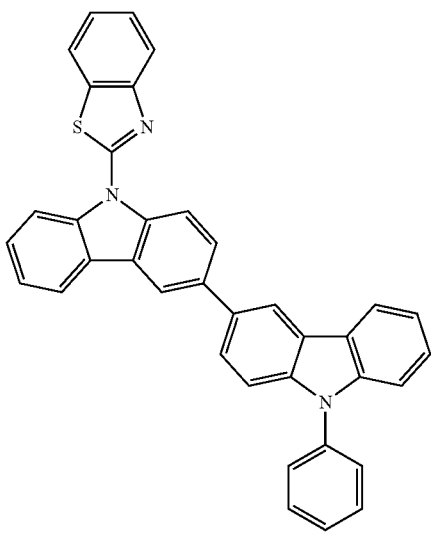
(1-41)
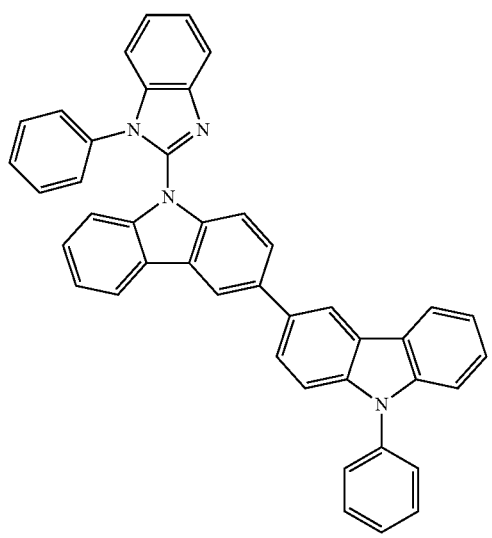
(1-42)
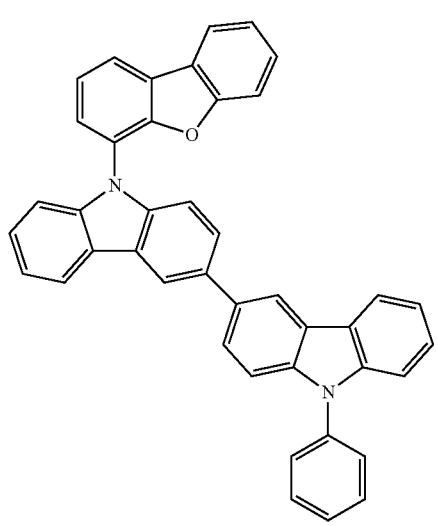
(1-43)
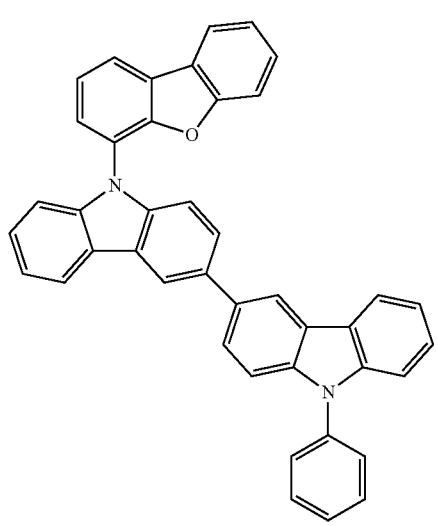
(1-44)
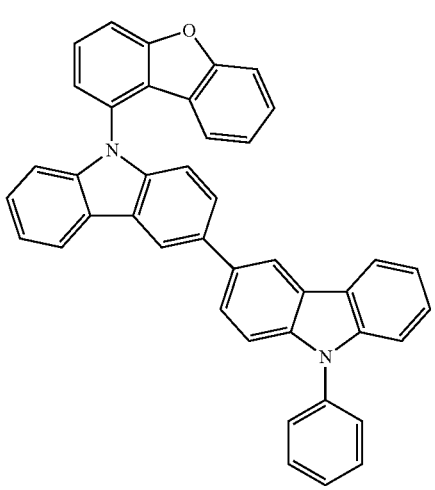

-continued
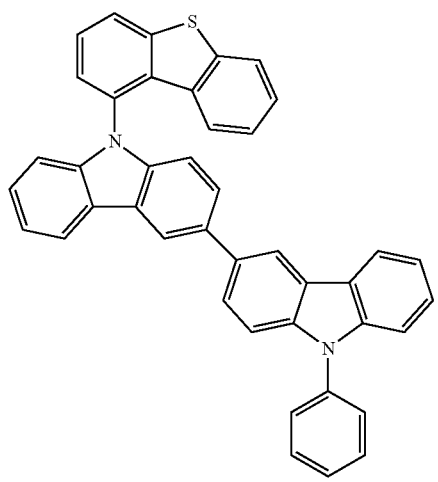
(1-45)
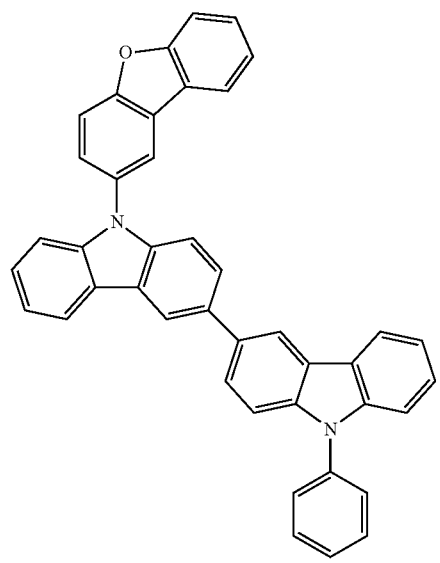
(1-46)
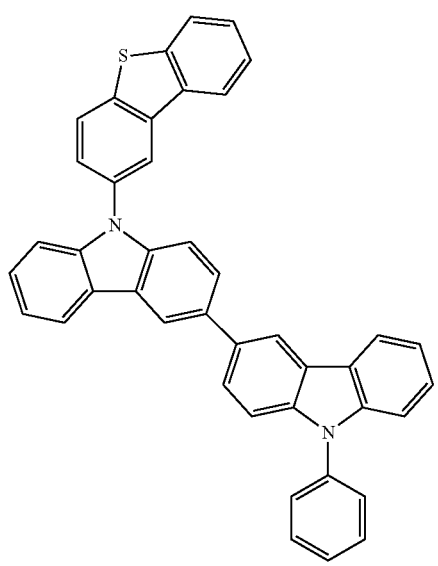
(1-47)
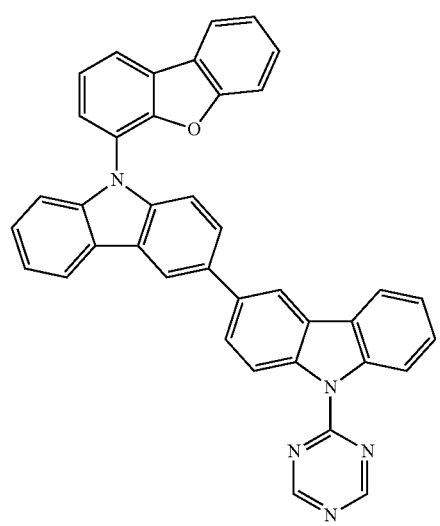
(1-48)
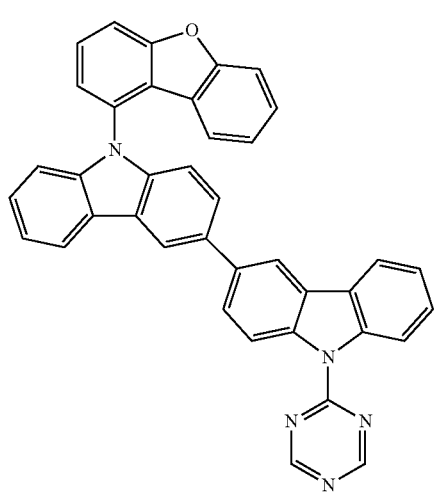
(1-49)
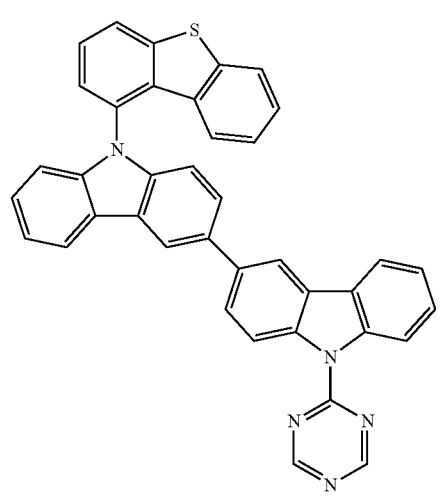
(1-50)

-continued
(1-51)
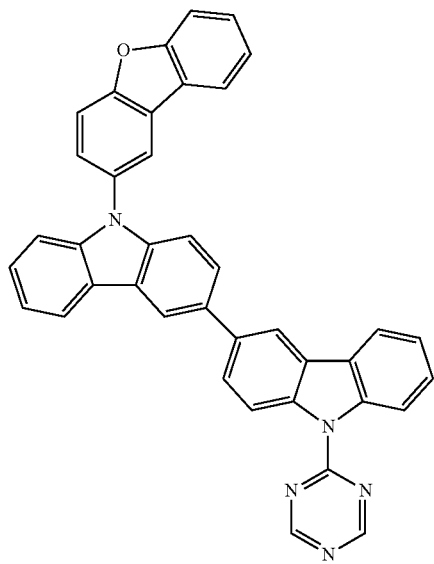
(1-52)
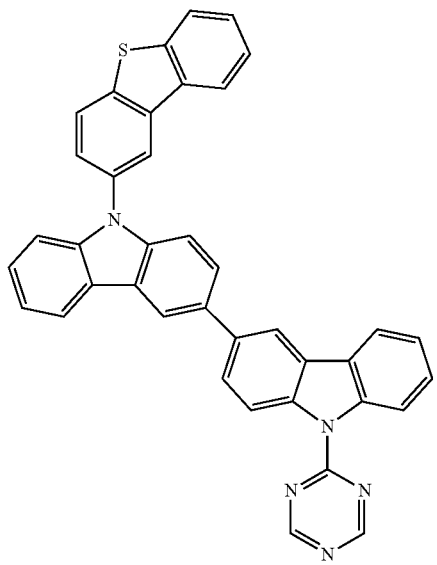
(1-53)
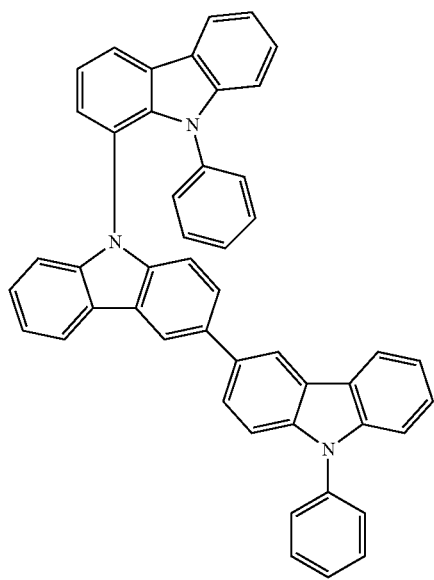
(1-54)
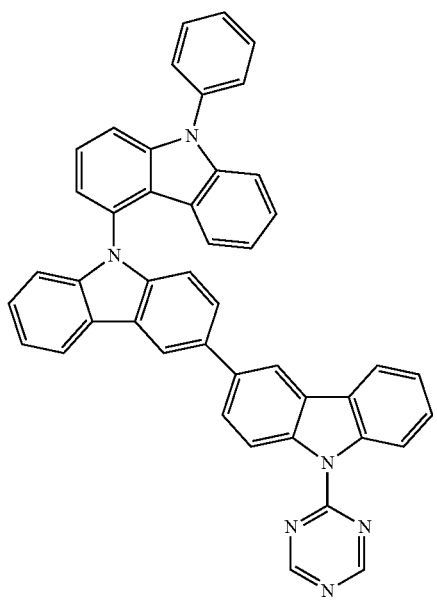

(1-55)
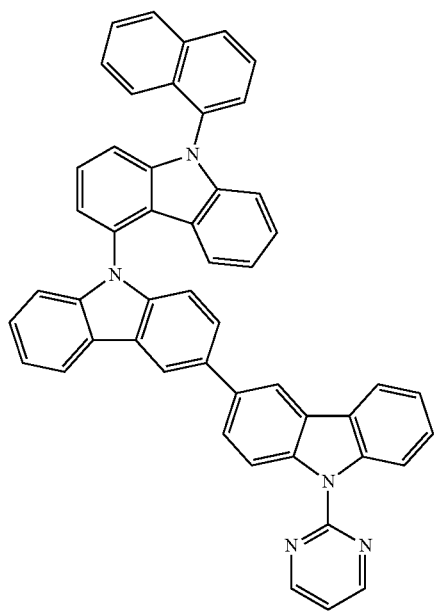
(1-56)
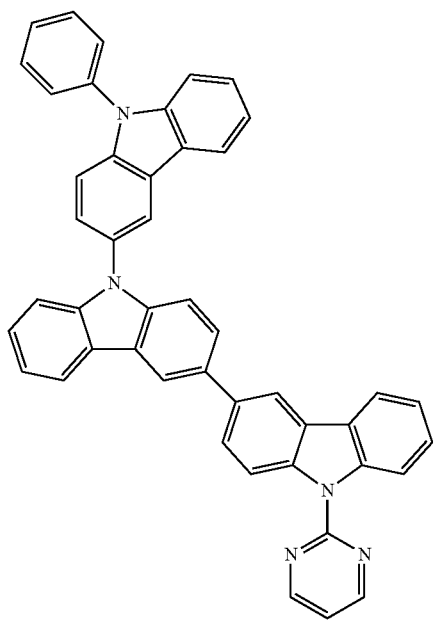
(1-57)
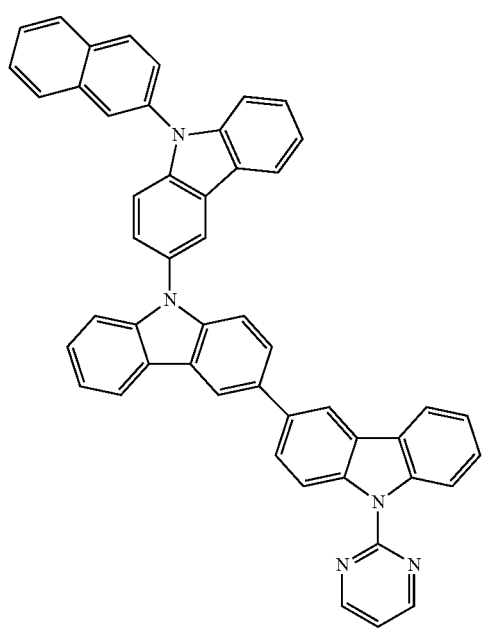
(1-58)
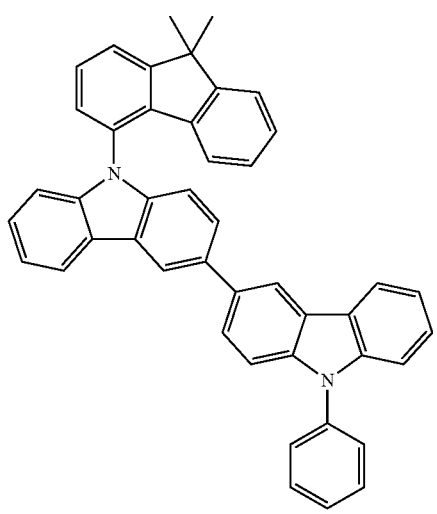

-continued
(1-59)
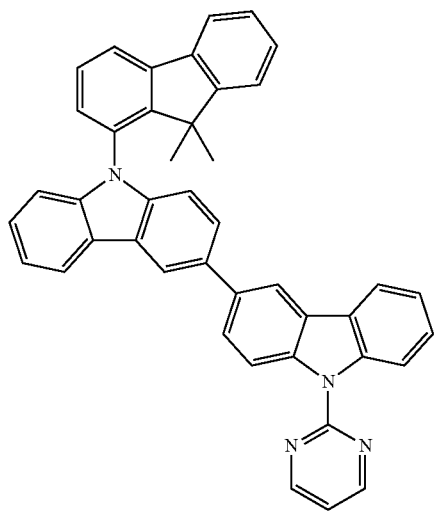
(1-60)
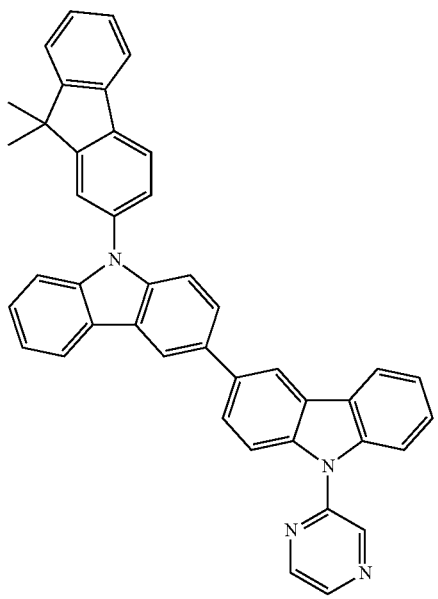
(1-61)
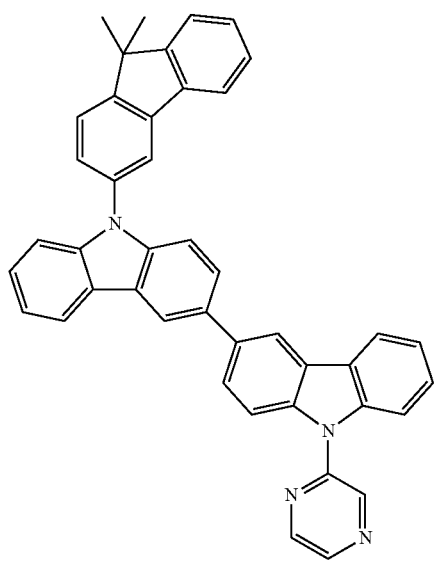
(1-62)
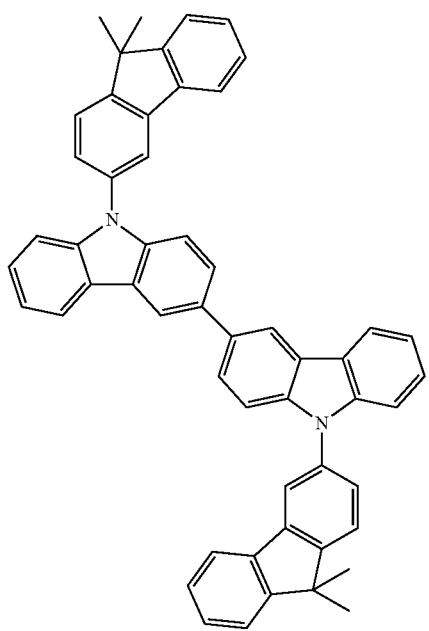

(1-63)
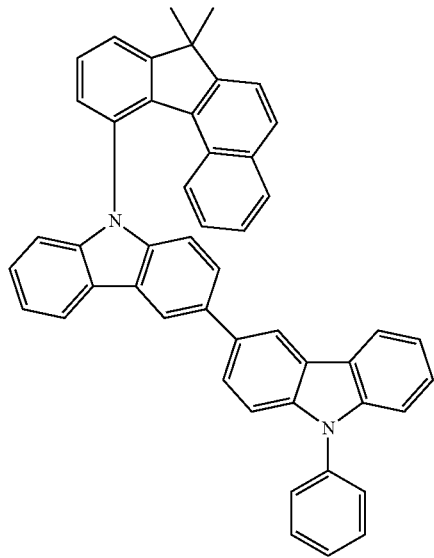
(1-64)
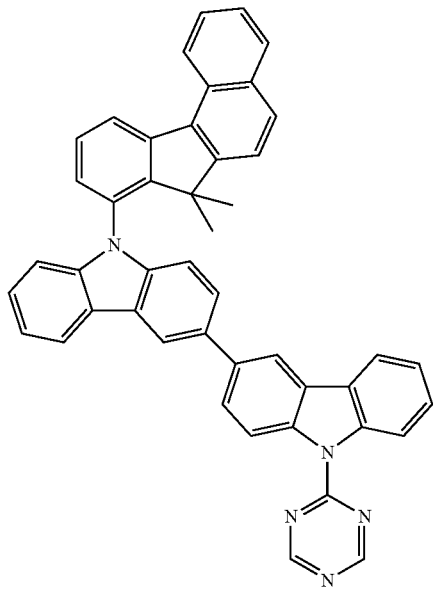
(1-65)
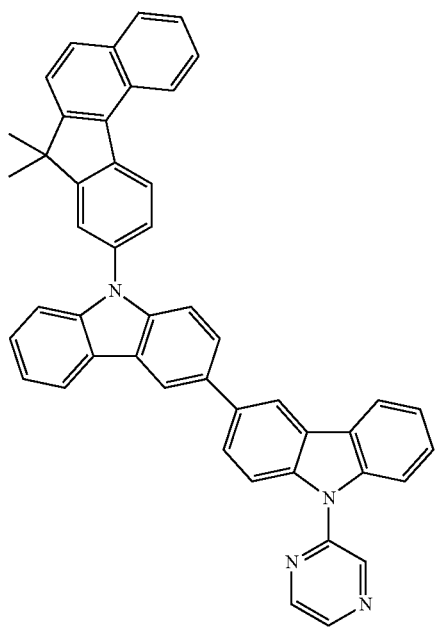
(1-66)
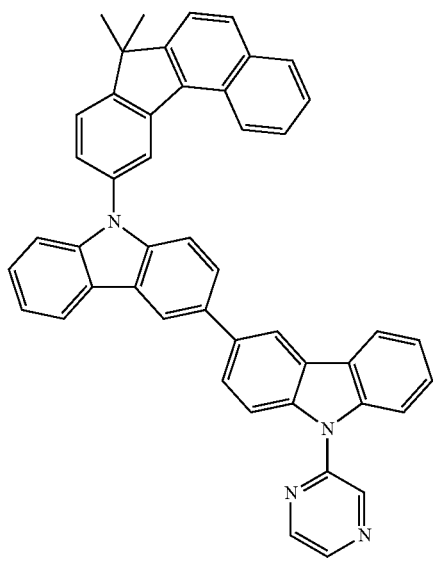

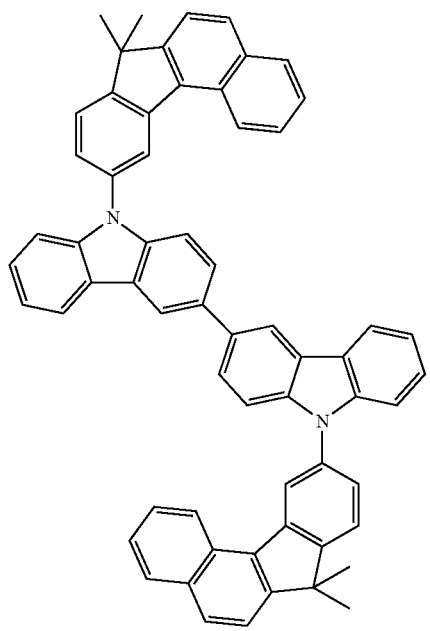
(1-67)
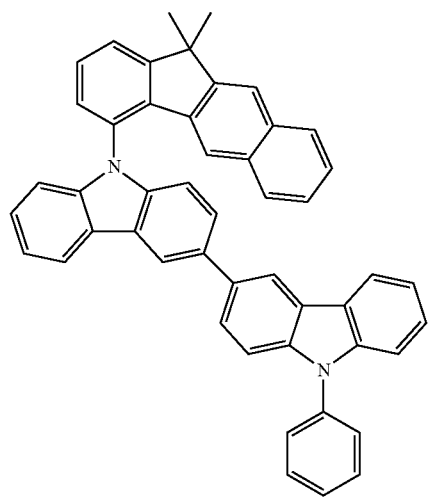
(1-68)
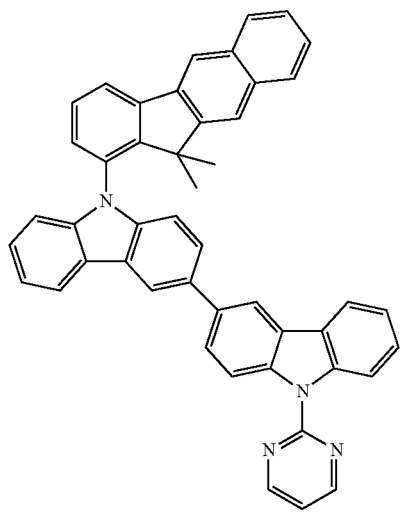
(1-69)
(1-70)

-continued
(1-71)
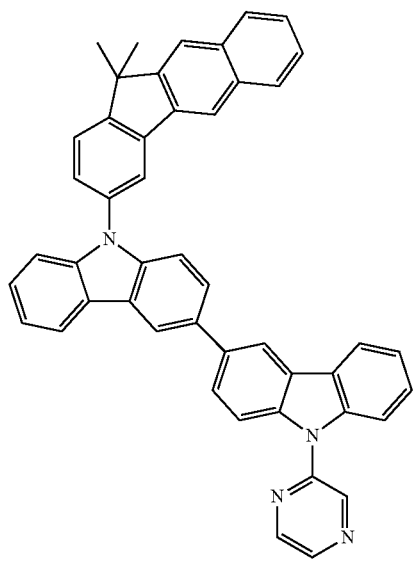
(1-72)
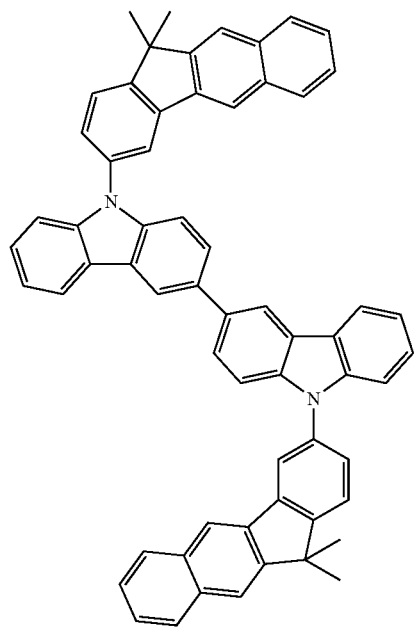
(1-73)
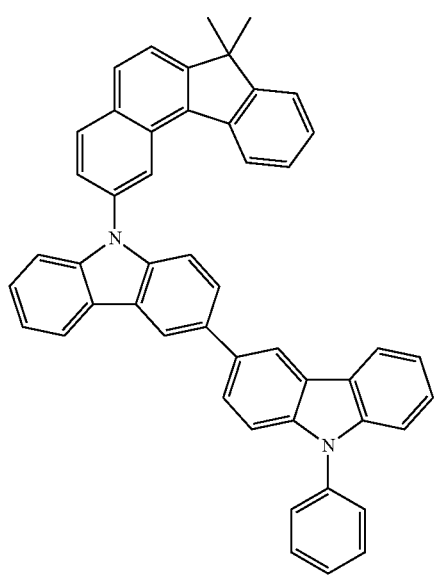
(1-74)
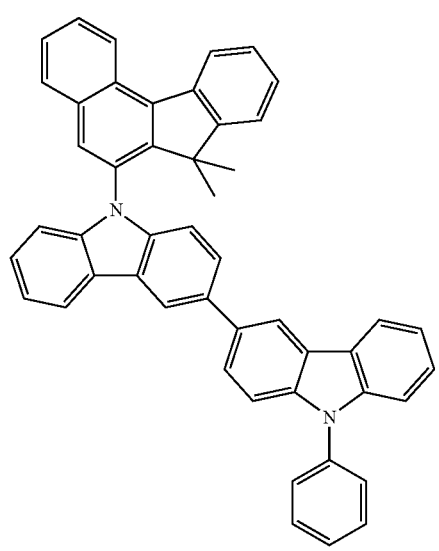

-continued
(1-75)
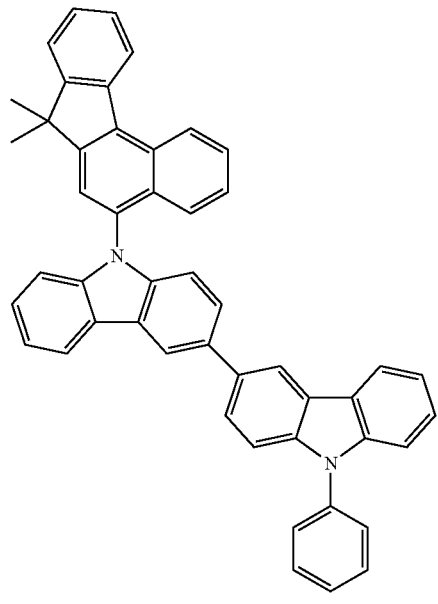
(1-76)
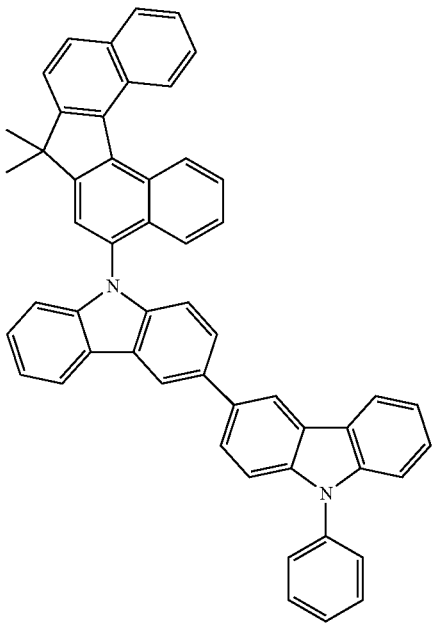
(1-77)
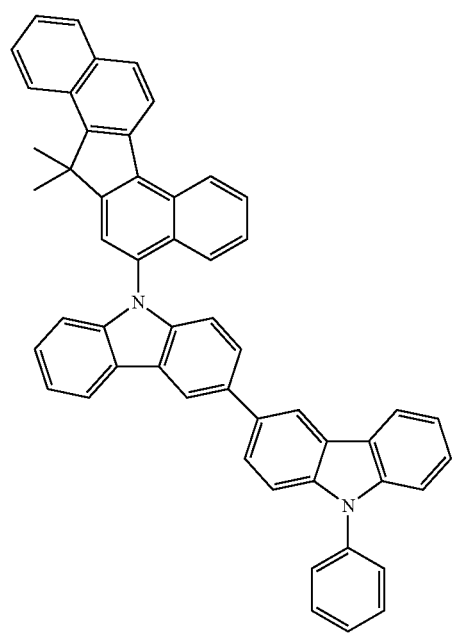
(1-78)
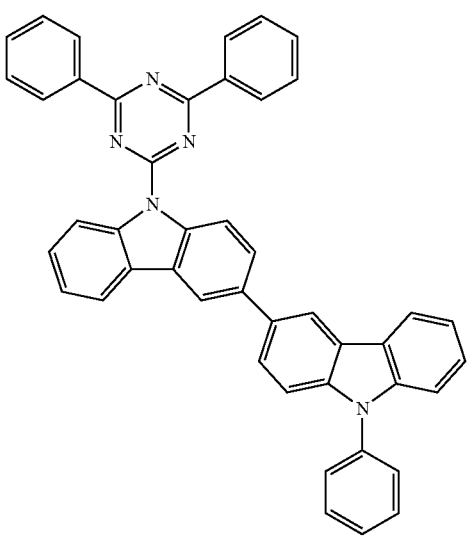

-continued
(1-79)
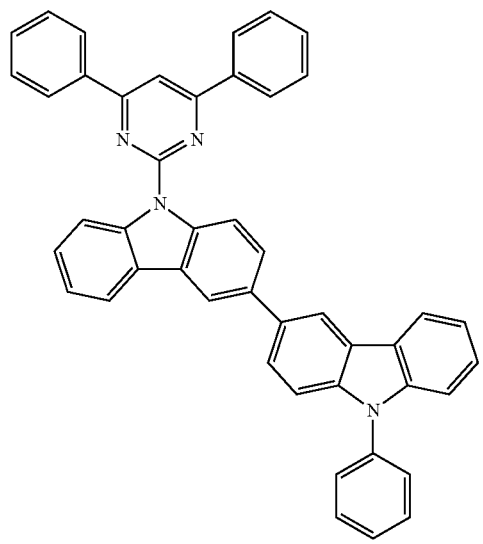
(1-80)
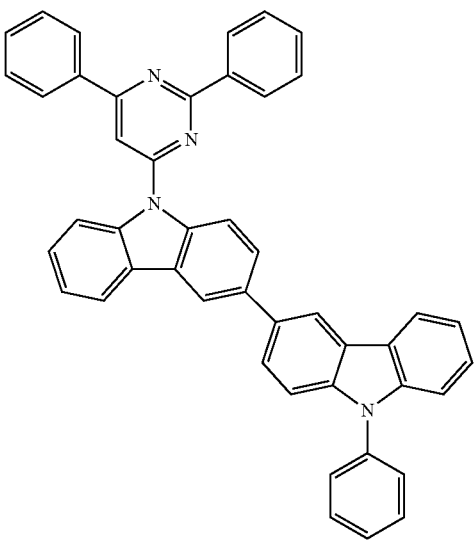
(1-81)
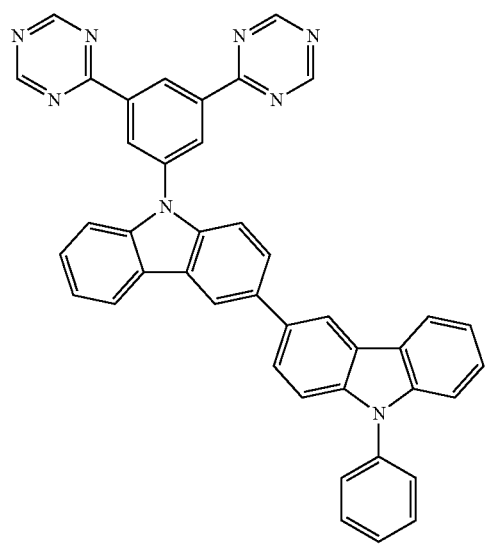
(1-82)
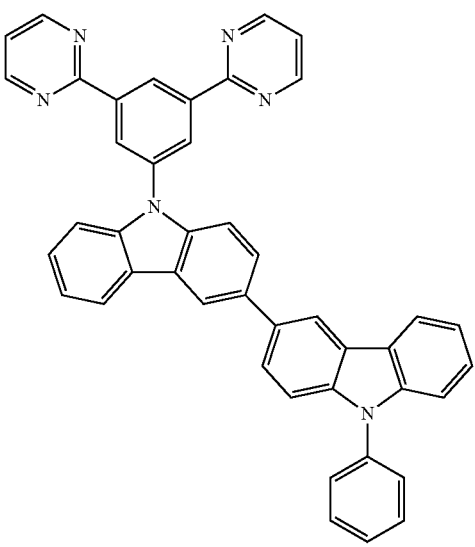

-continued
(1-83)
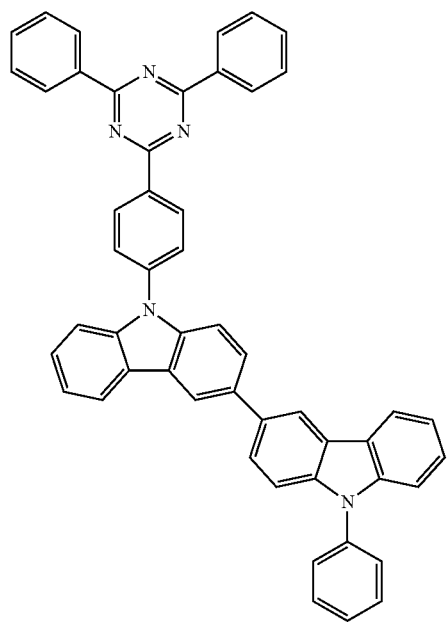
(1-84)
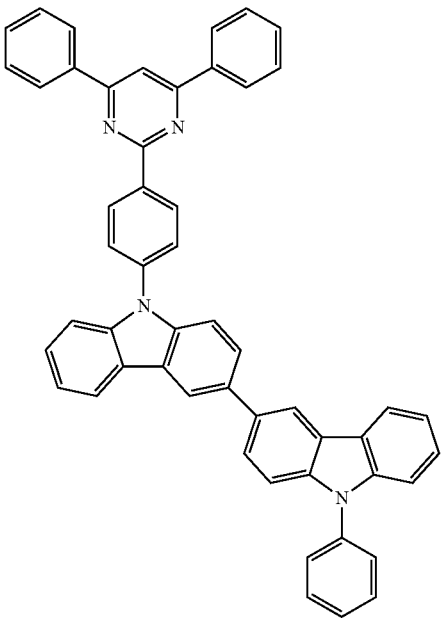
(1-85)
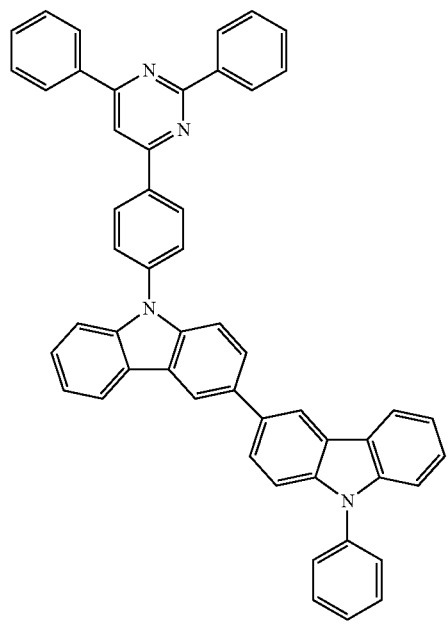
(1-86)
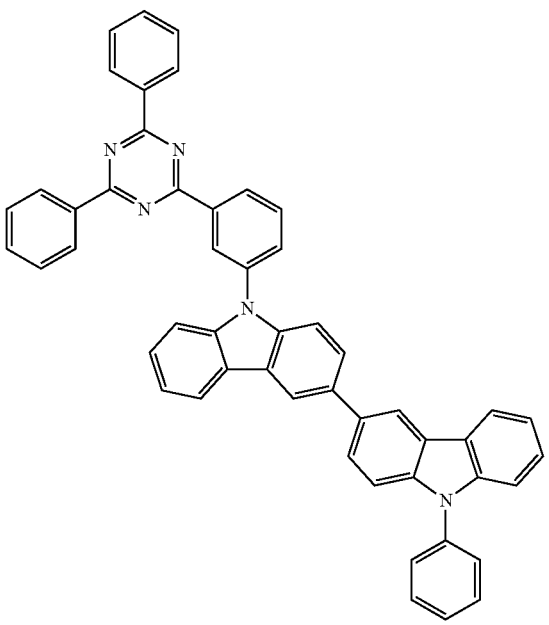

(1-87)
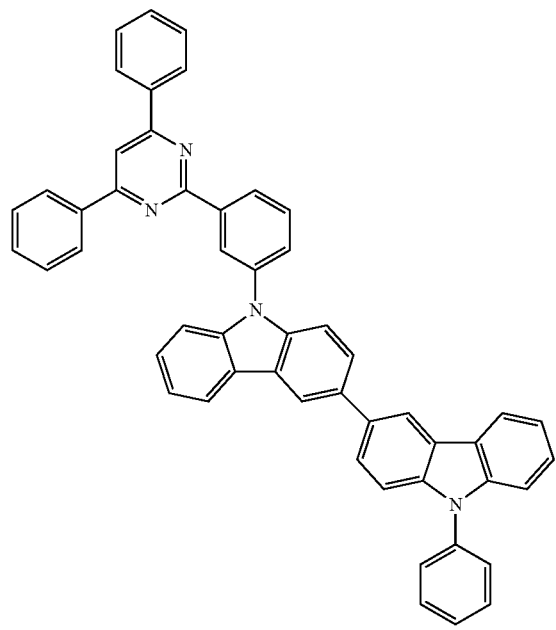
(1-88)
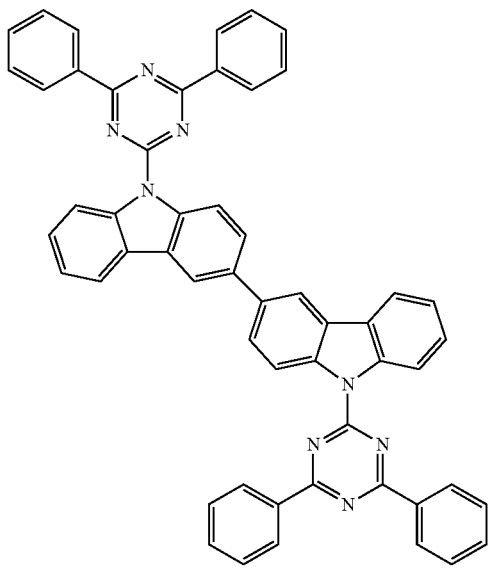
(1-89)
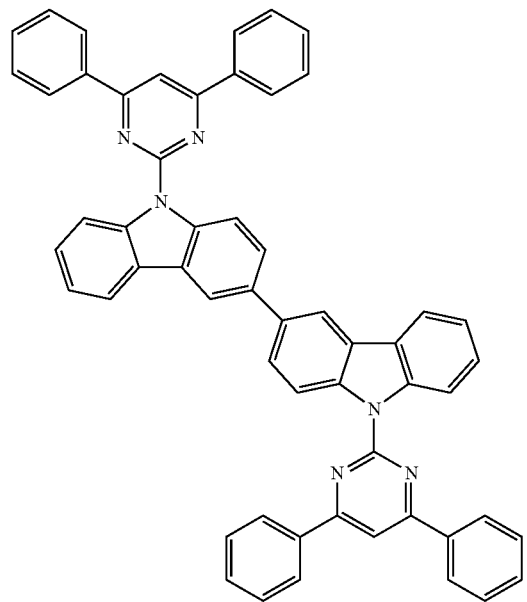
(1-90)
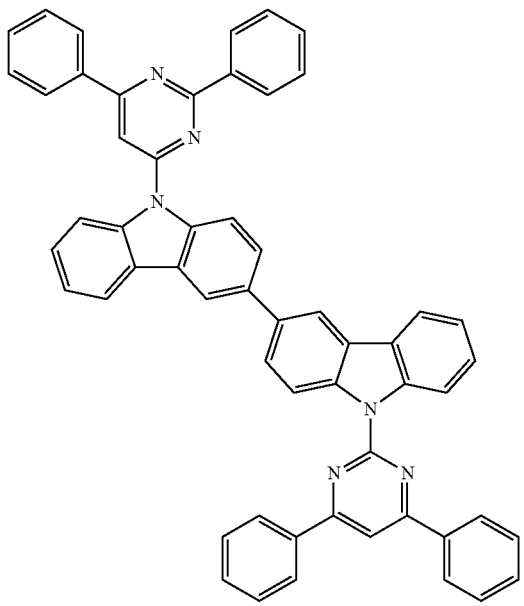

-continued
(1-91)
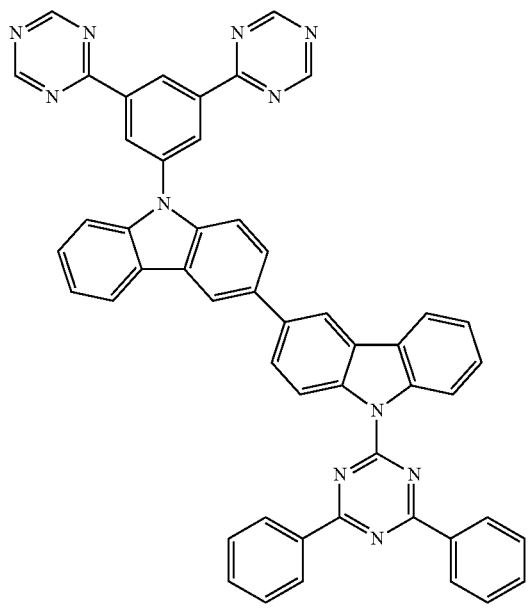
(1-92)
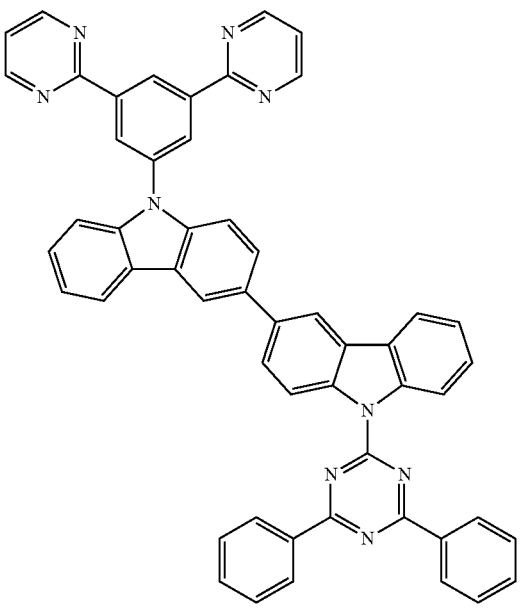
(1-93)
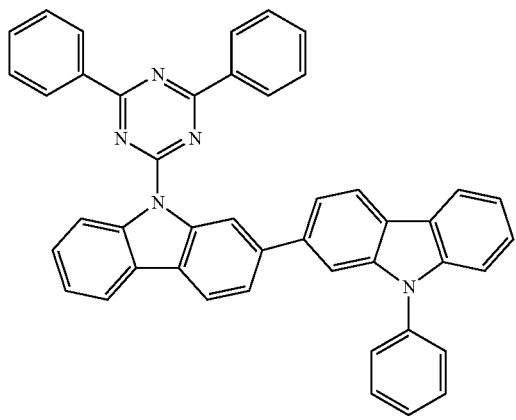
(1-94)
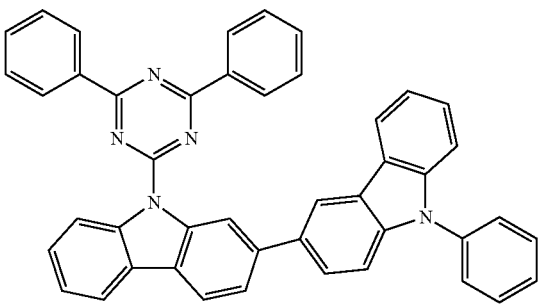
(1-95)
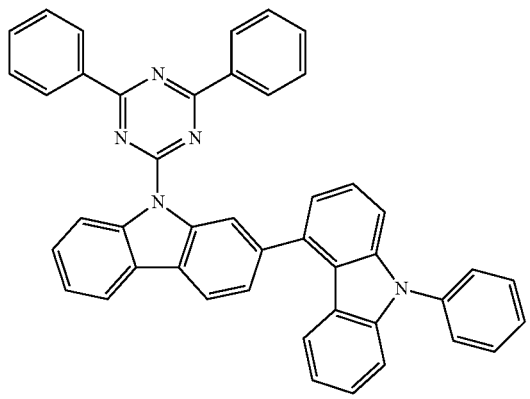
(1-96)
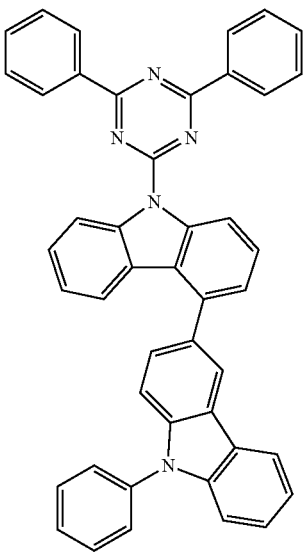

-continued
(1-97)
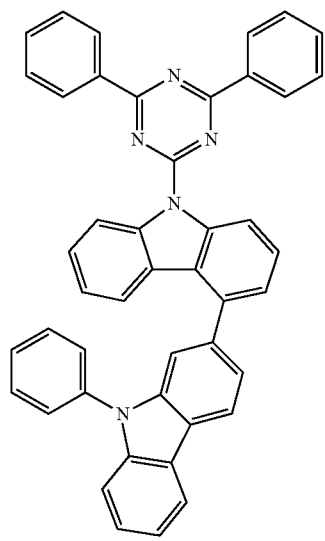
(1-98)
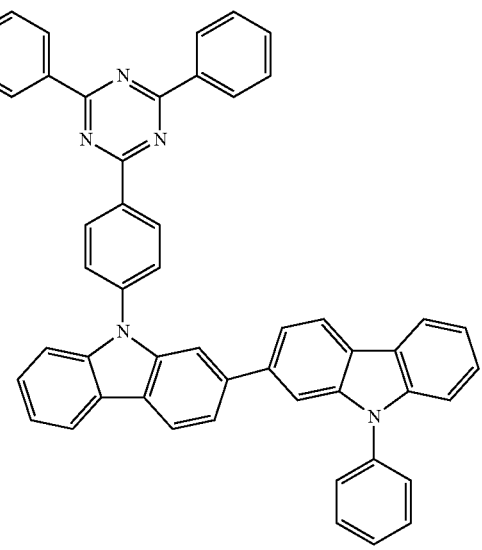
(1-99)
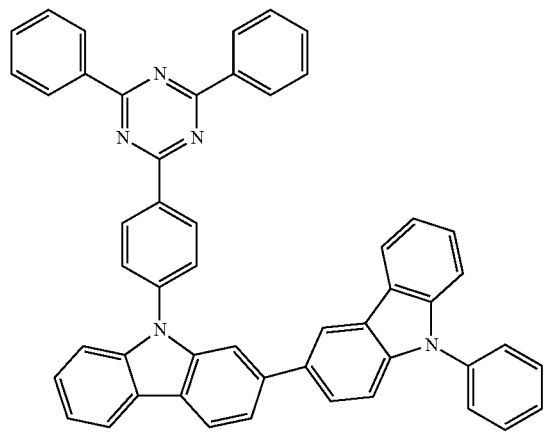
(1-100)
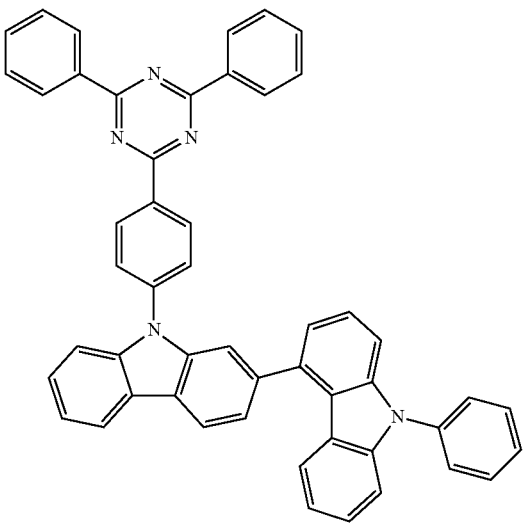

(1-101)
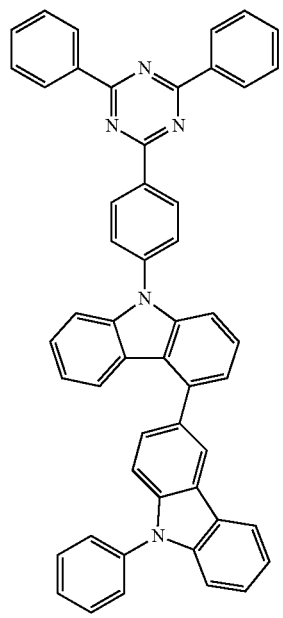
(1-102)
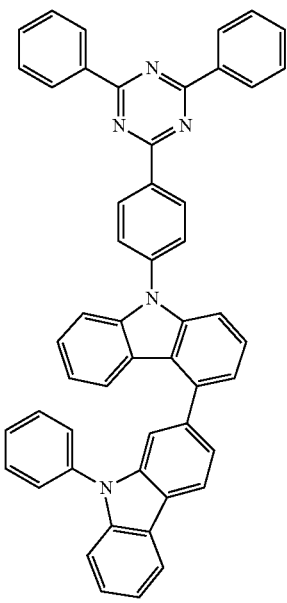
(1-103)
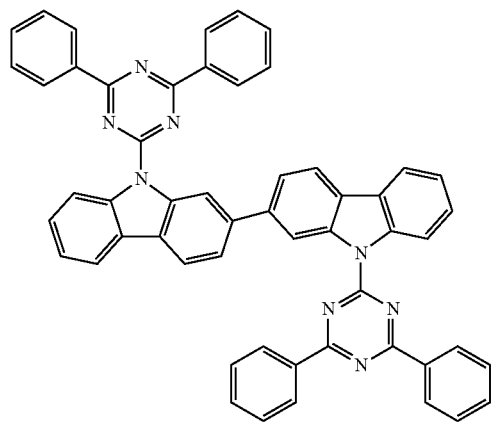
(1-104)
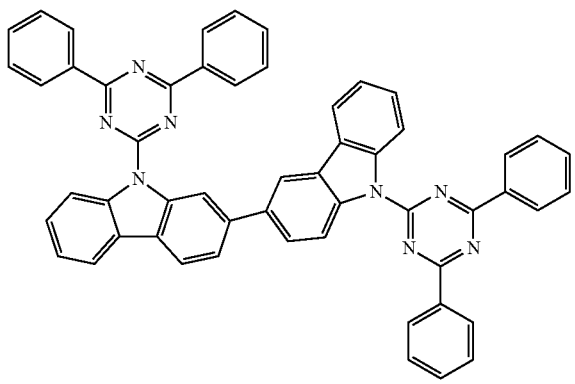
(1-105)
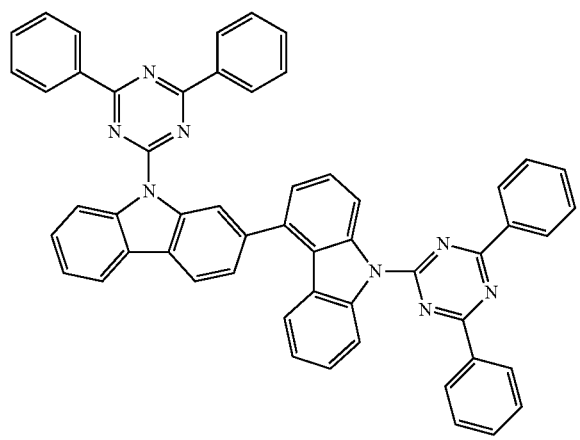
(1-106)
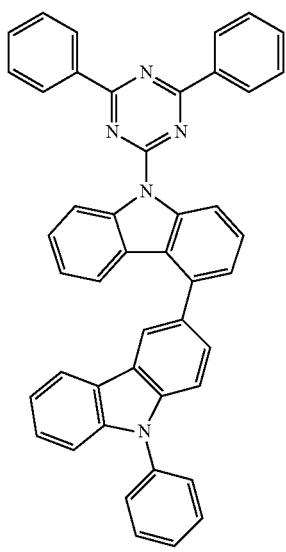

-continued
(1-107)
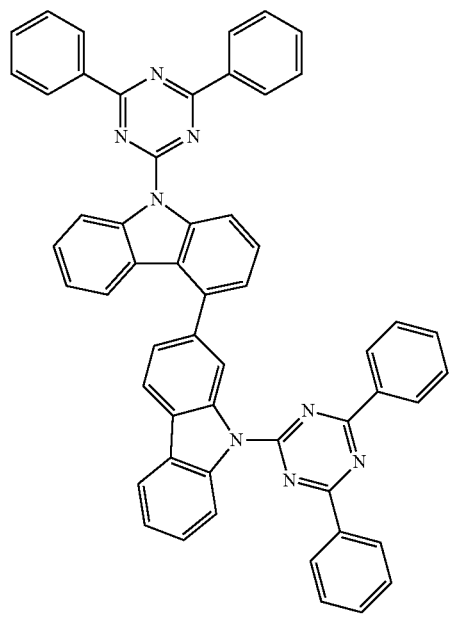
(1-108)
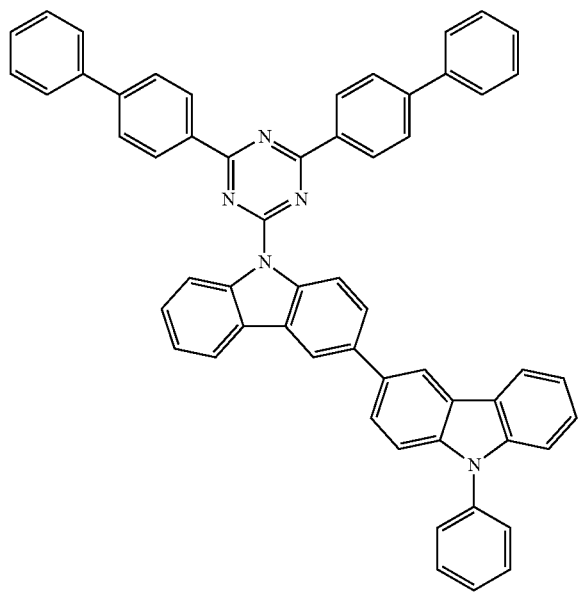
(1-109)
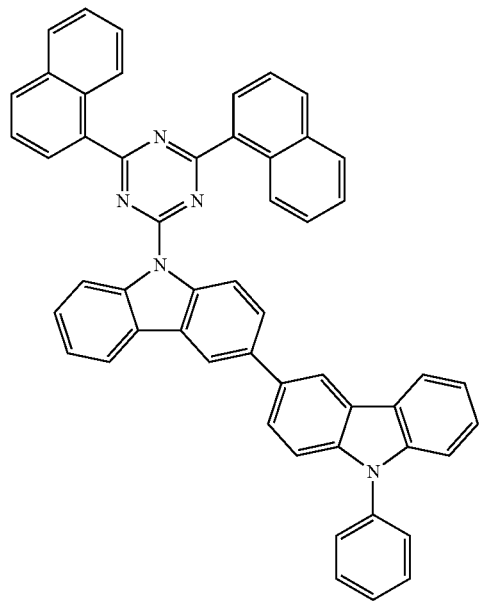
(1-110)
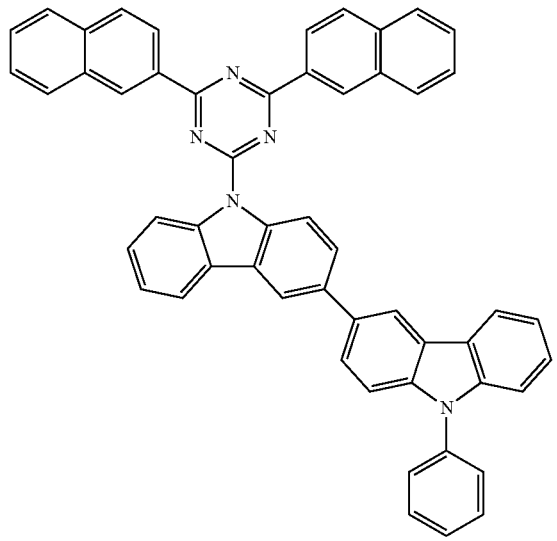

-continued
(1-111)
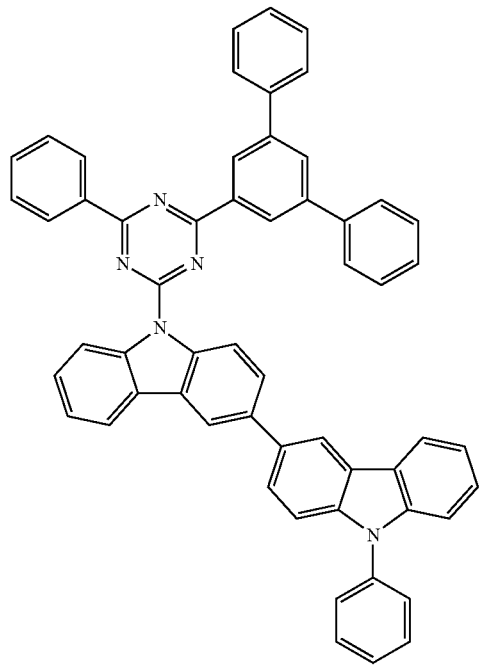
(1-112)
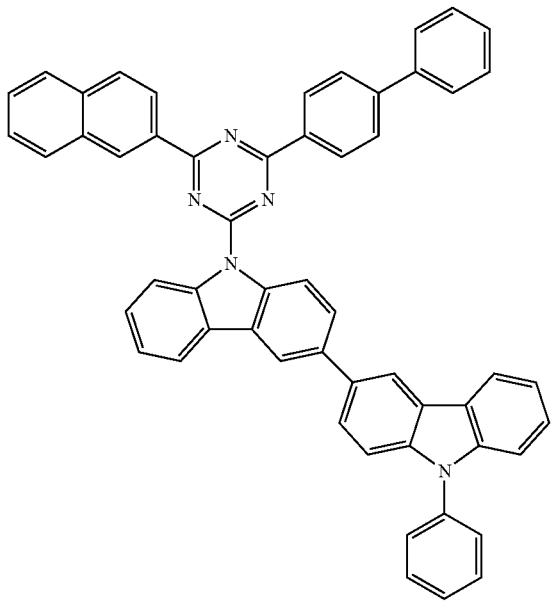
(1-113)
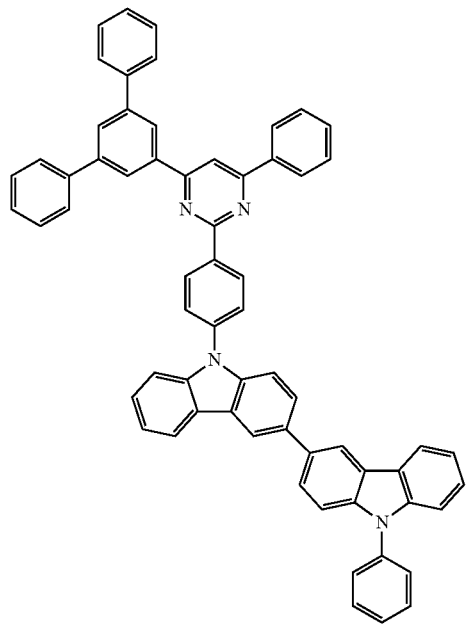
(1-114)
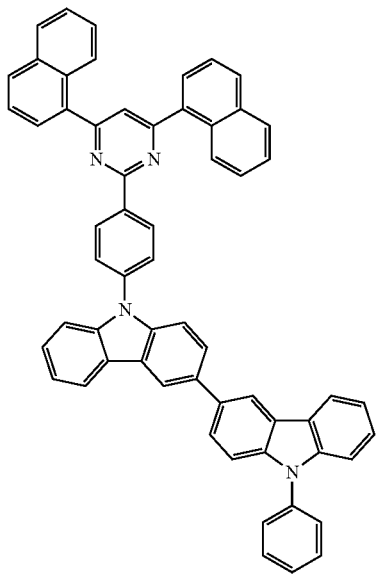

-continued
(1-115)
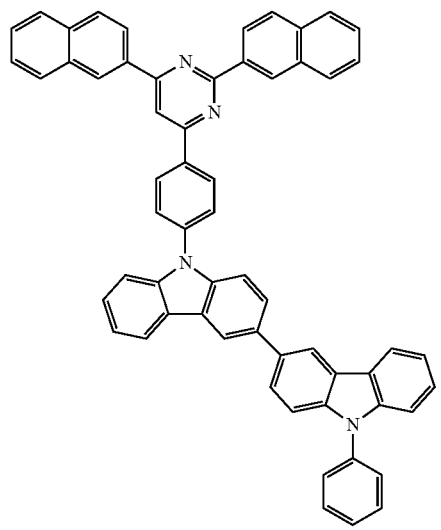
(1-116)
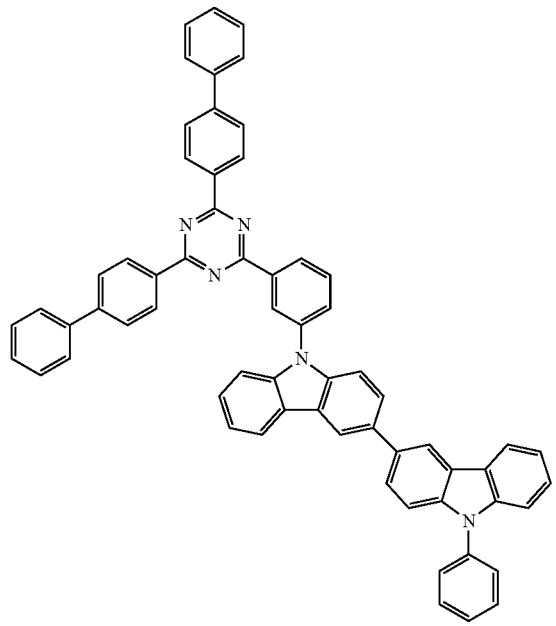
(1-117)
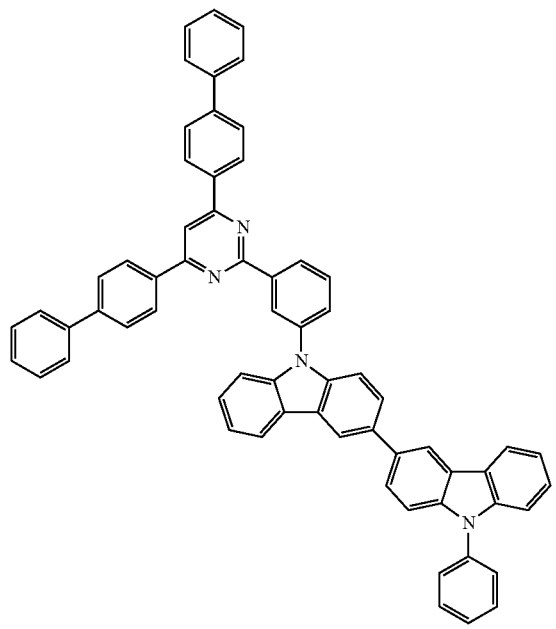
(1-118)
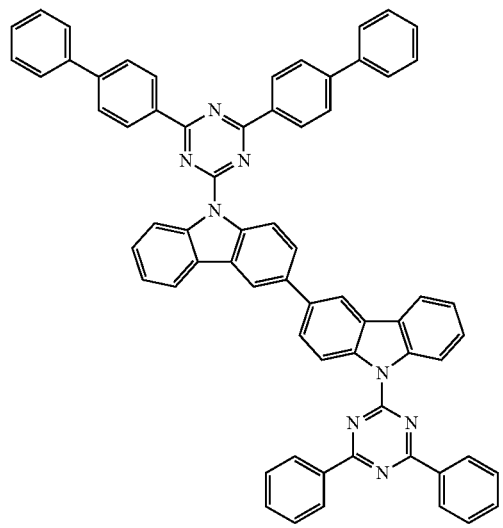

-continued
(1-119)
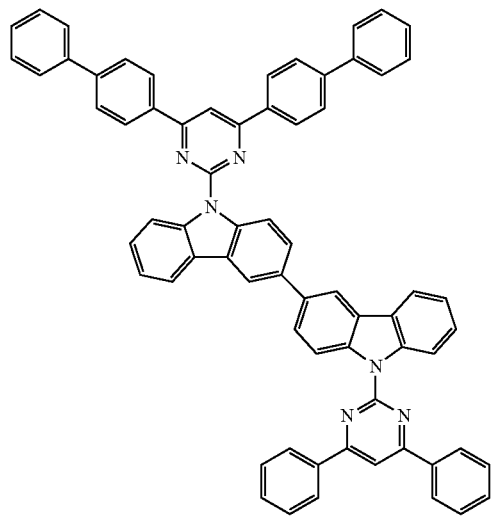
(1-120)
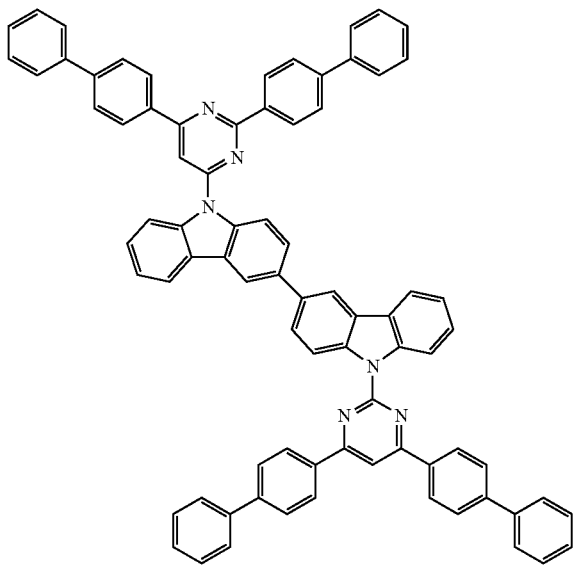
(1-121)
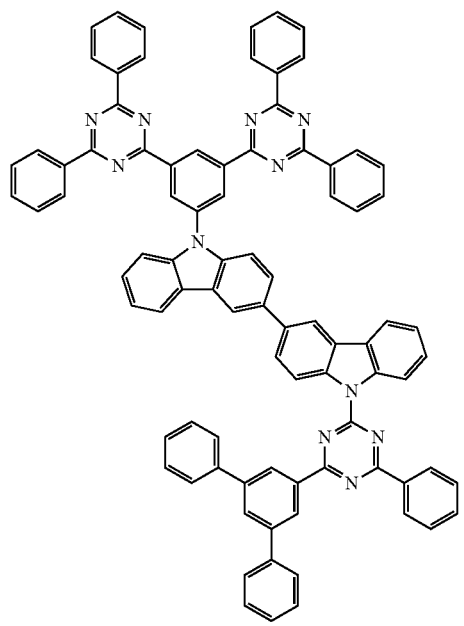
(1-122)
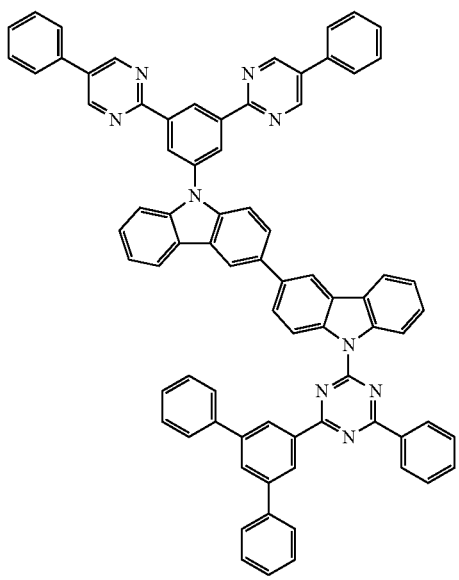

(1-123)
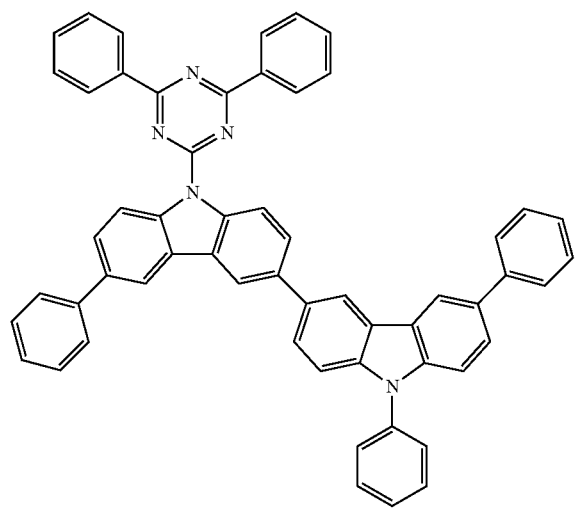
(1-124)
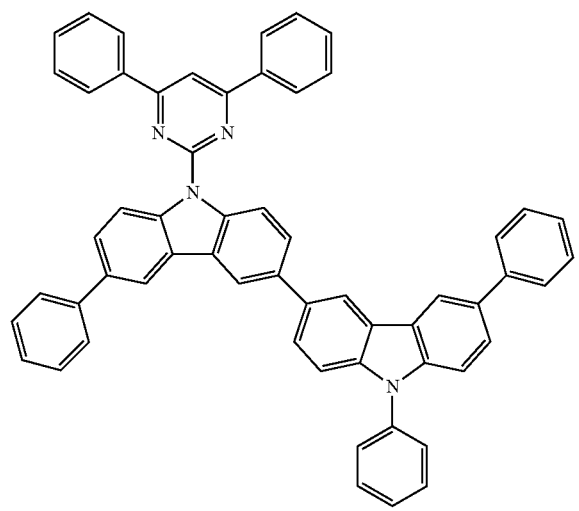
(1-125)
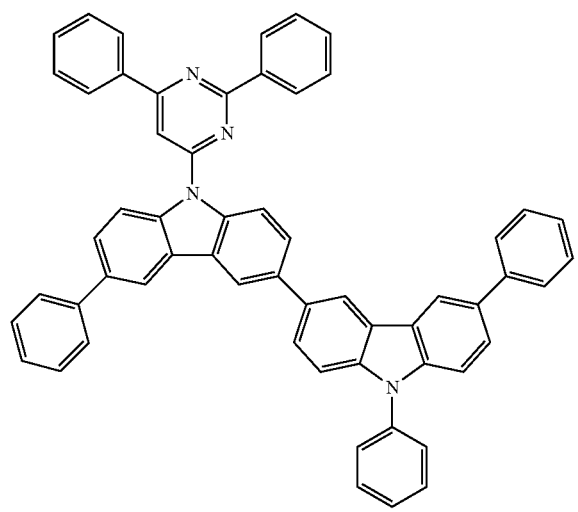
(1-126)
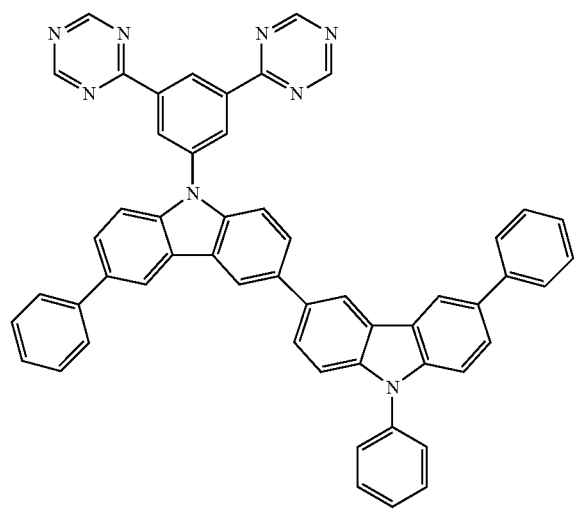

(1-127)
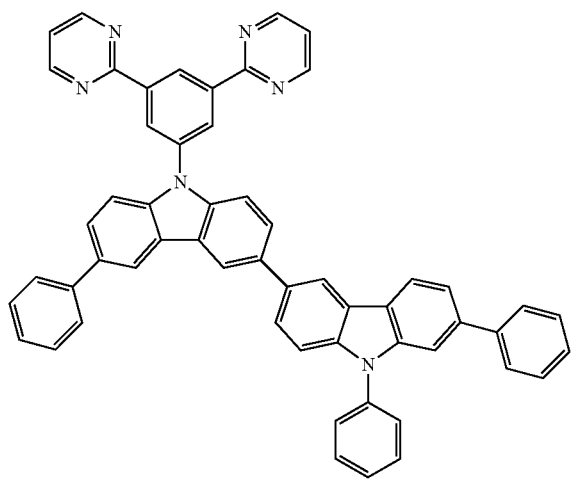
(1-128)
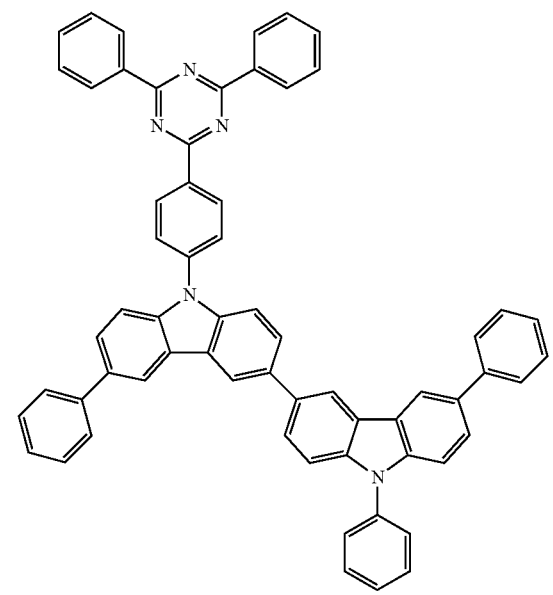
(1-129)
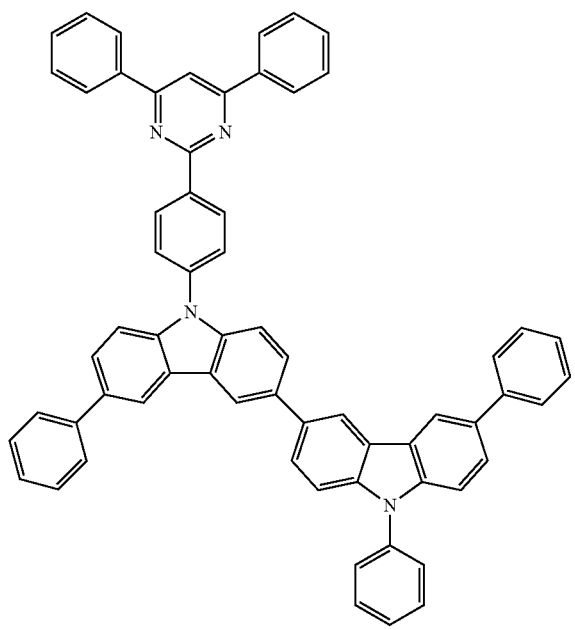
(1-130)
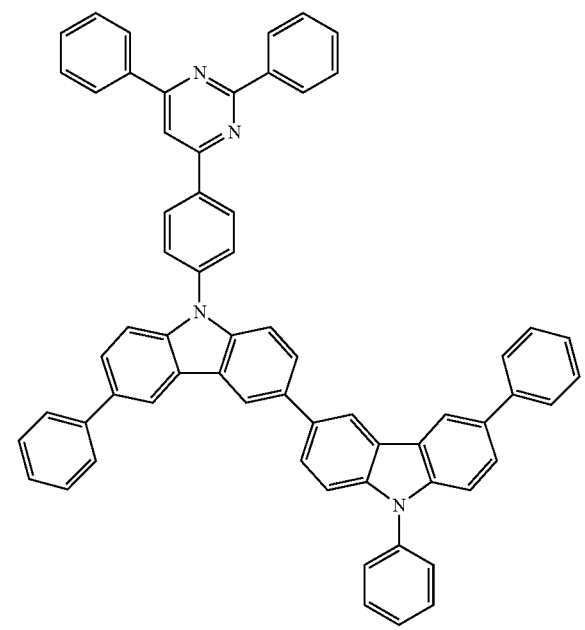

(1-131)
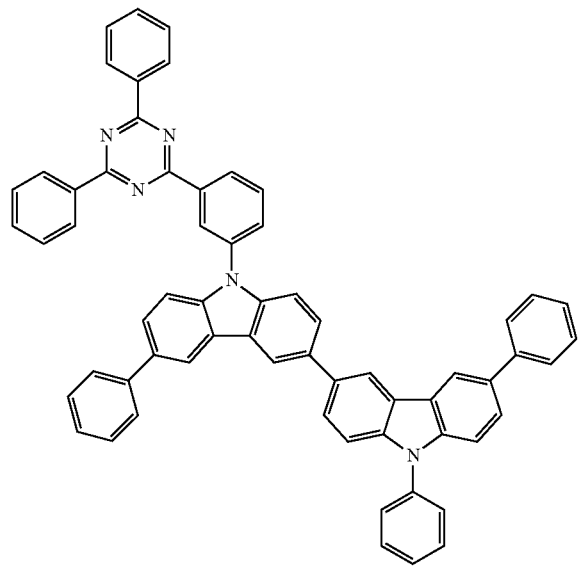
(1-132)
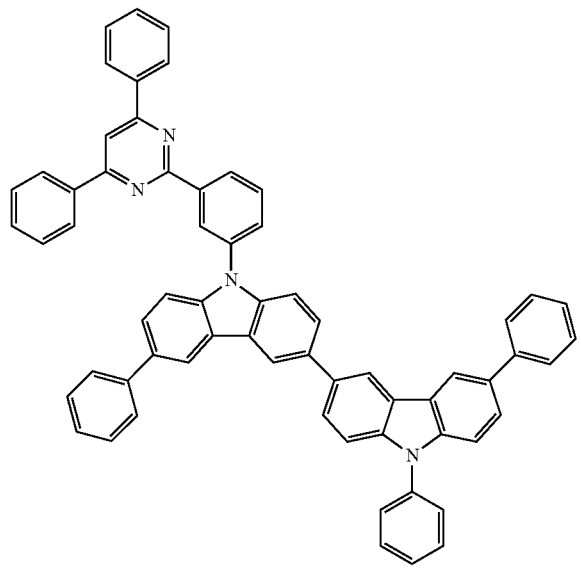
(1-133)
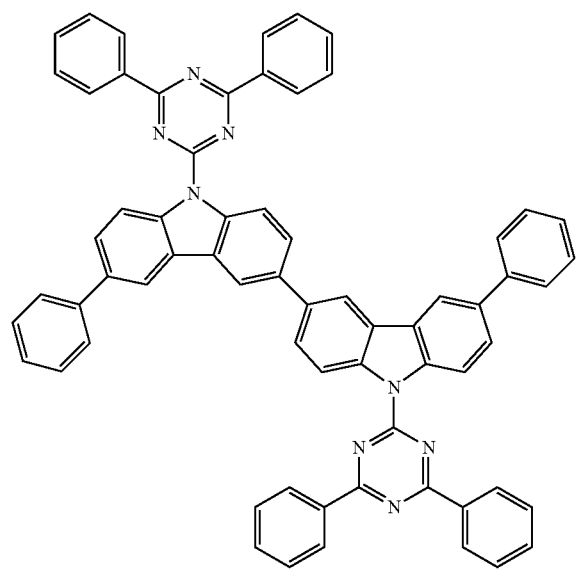
(1-134)
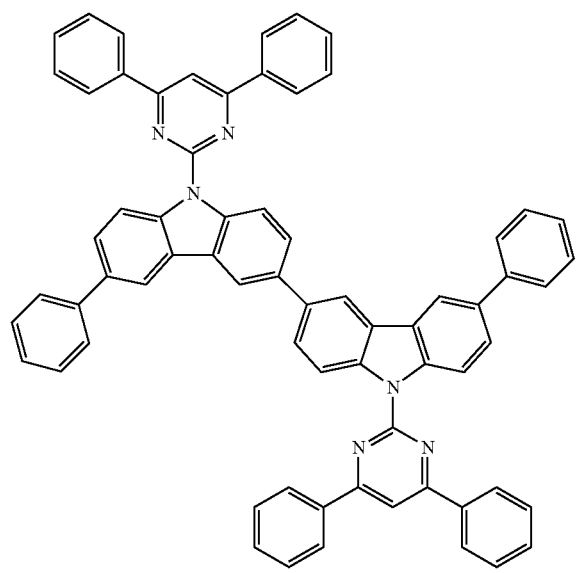

(1-135)
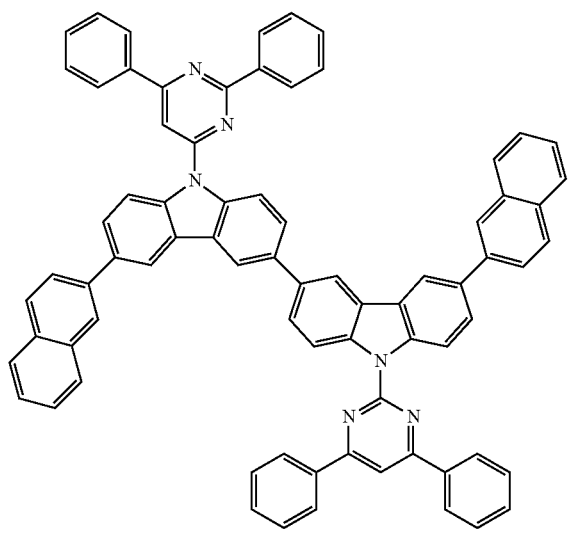
(1-136)
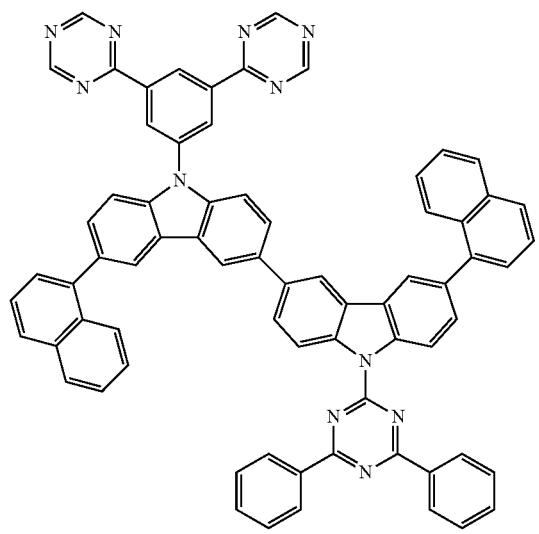
(1-137)
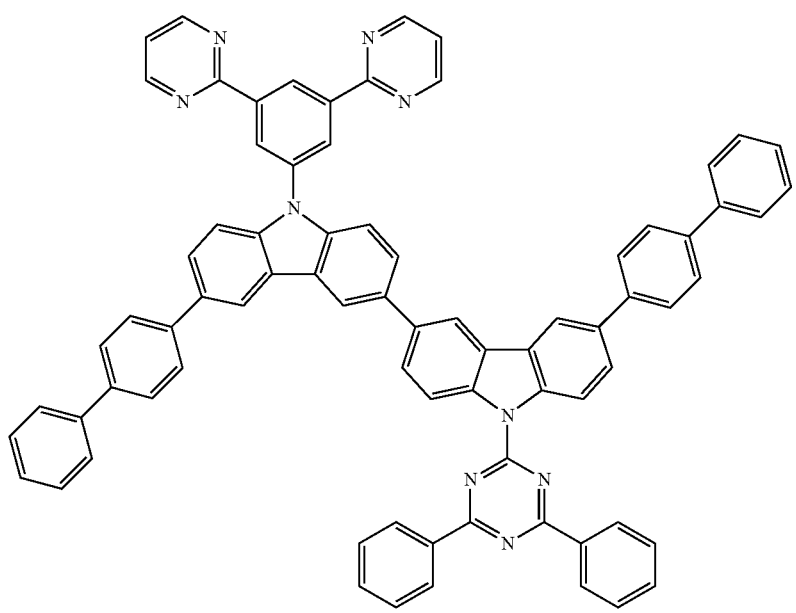

(1-138)
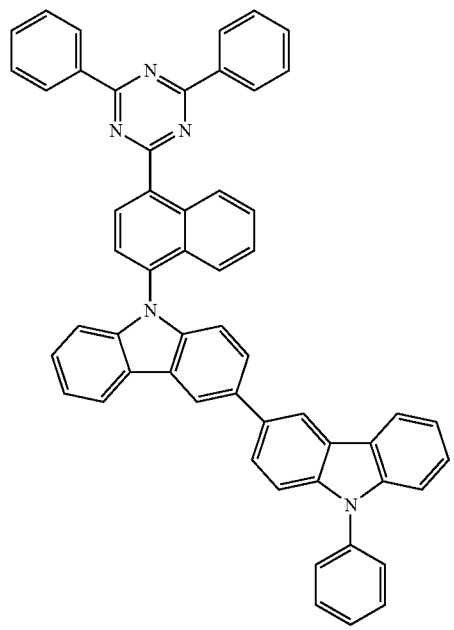
(1-139)
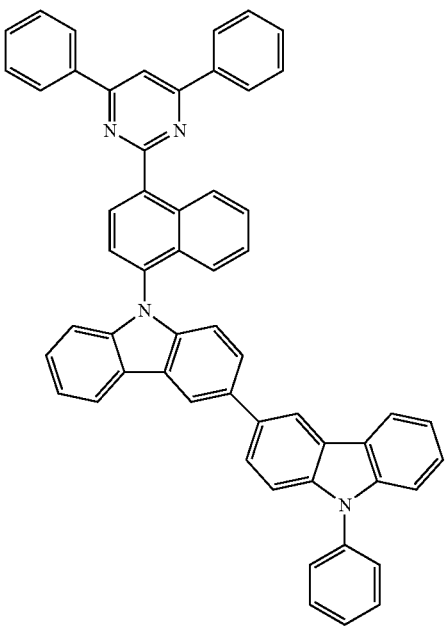
(1-140)
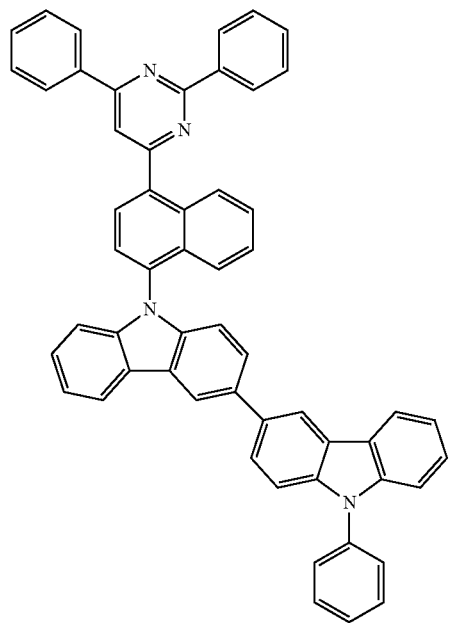
(1-141)
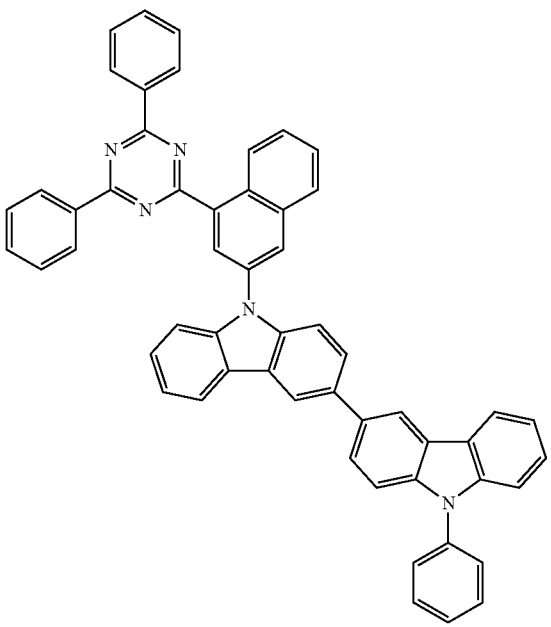

-continued
(1-142)
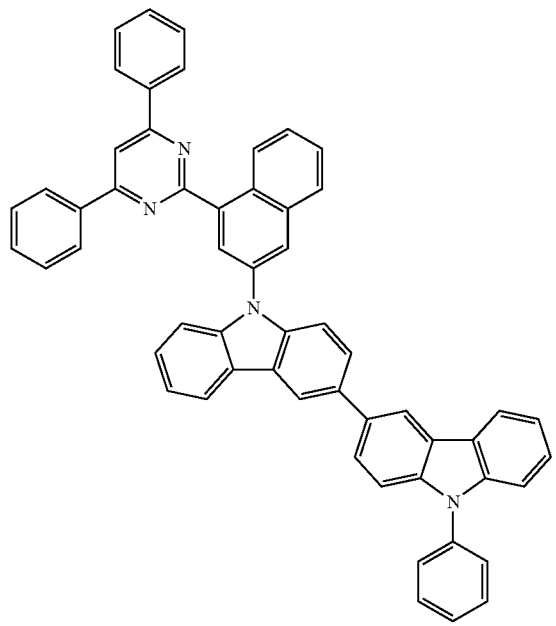
(1-143)
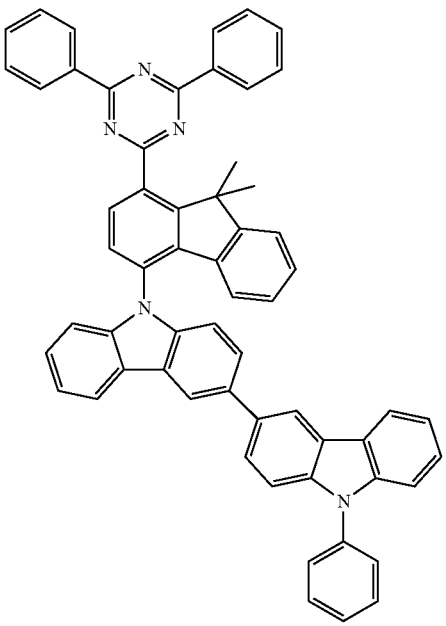
(1-144)
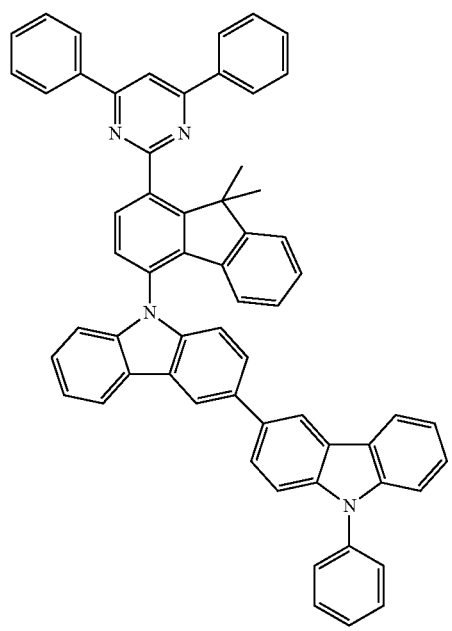
(1-145)
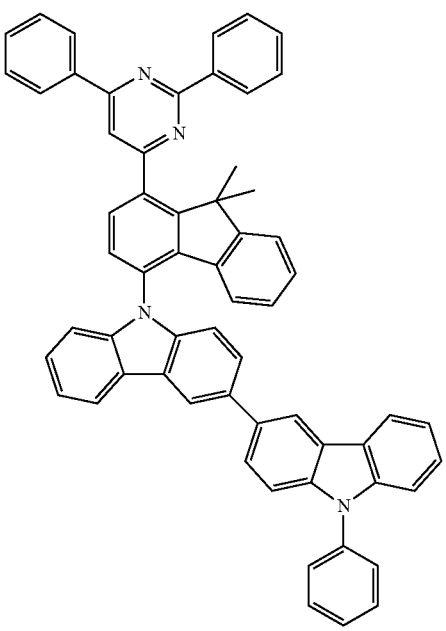

-continued
(1-146)
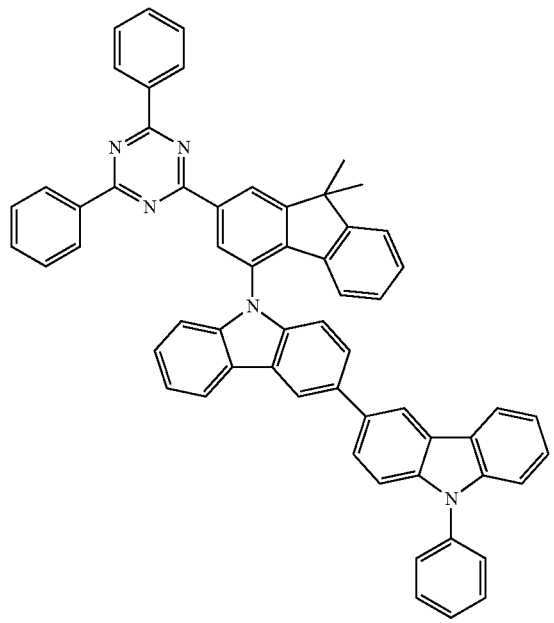
(1-147)
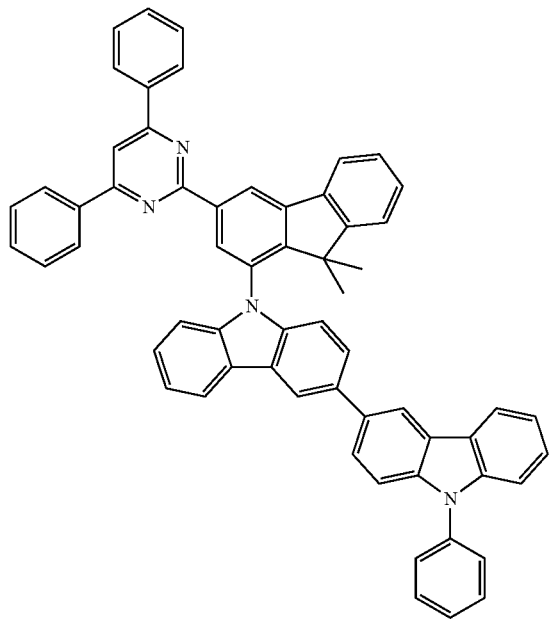
(1-148)
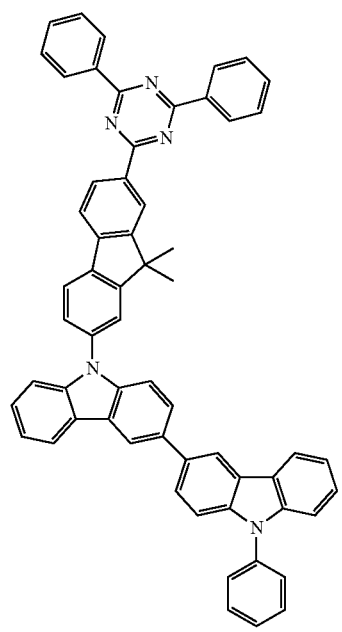
(1-149)
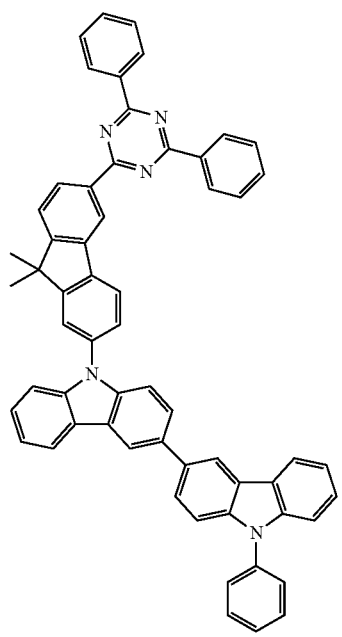

-continued
(1-150)
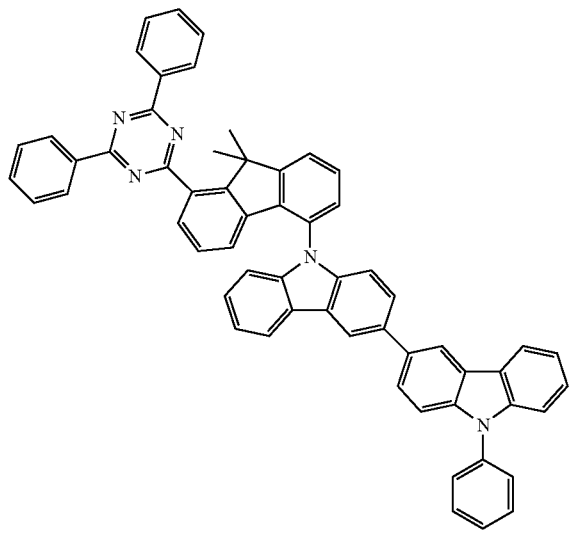
(1-151)
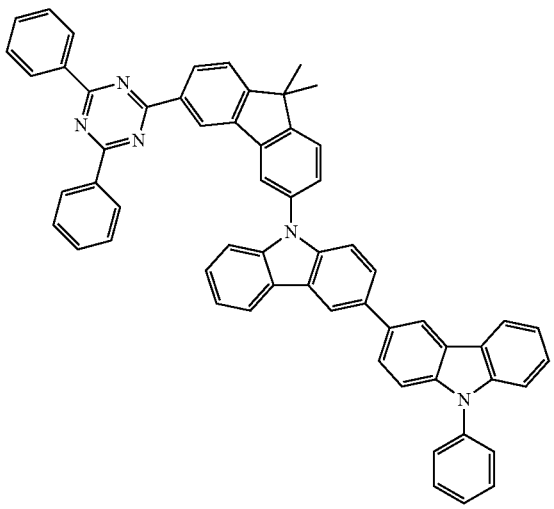
(1-152)
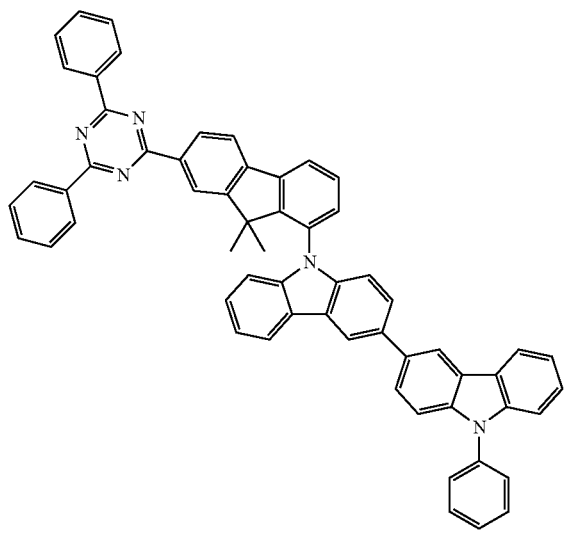
(1-153)
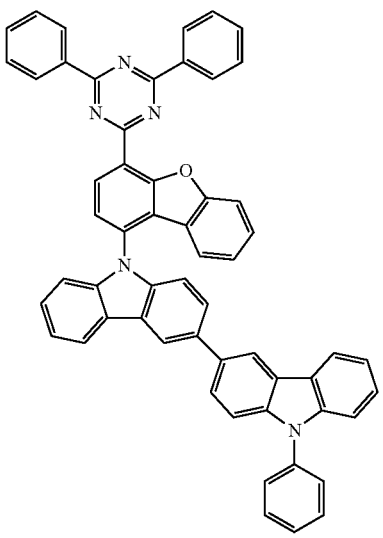
(1-154)
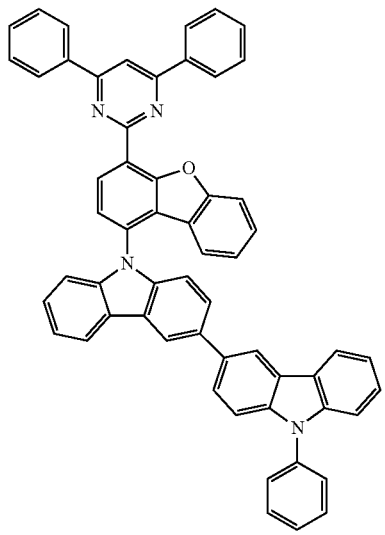
(1-155)
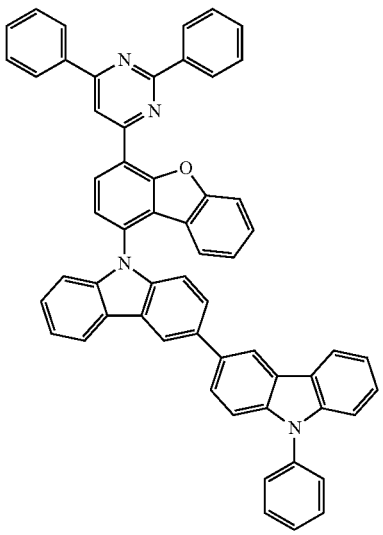

(1-156)
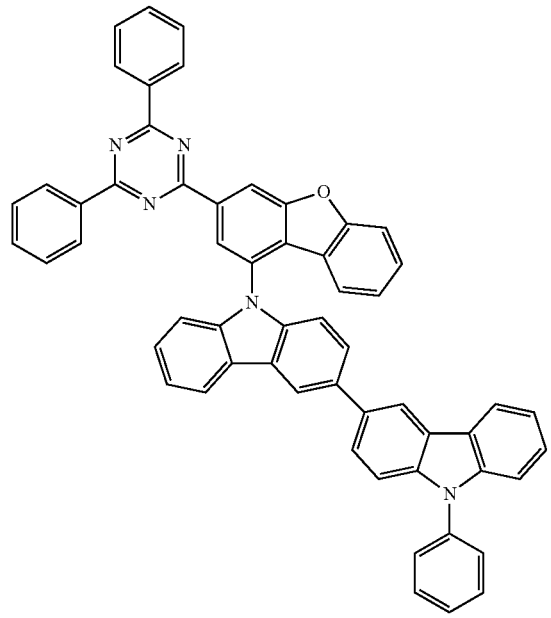
(1-157)
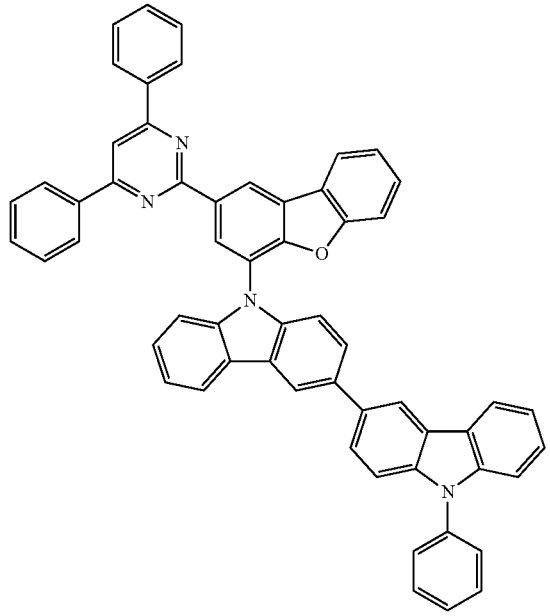
(1-158)
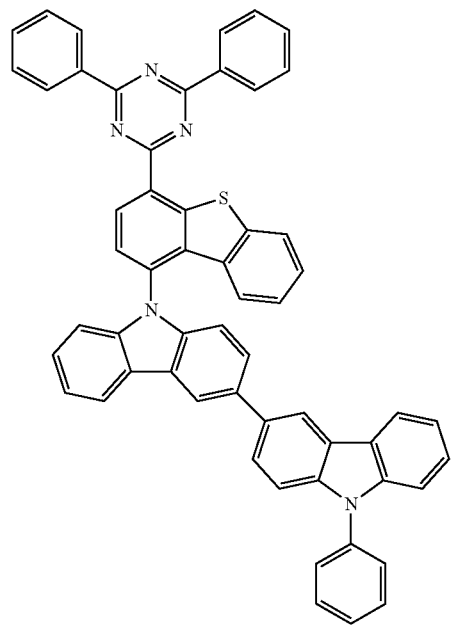
(1-159)
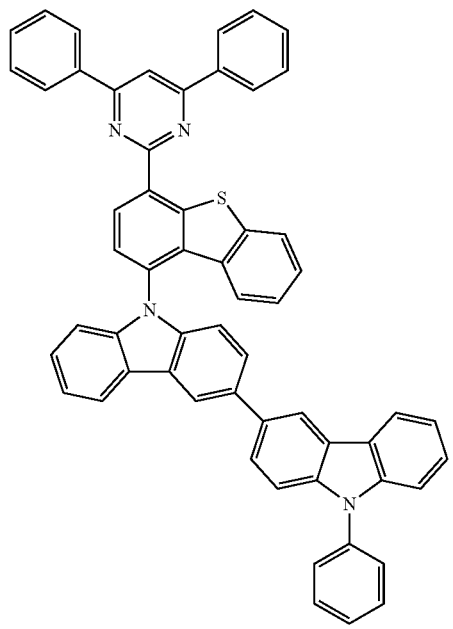

(1-160)
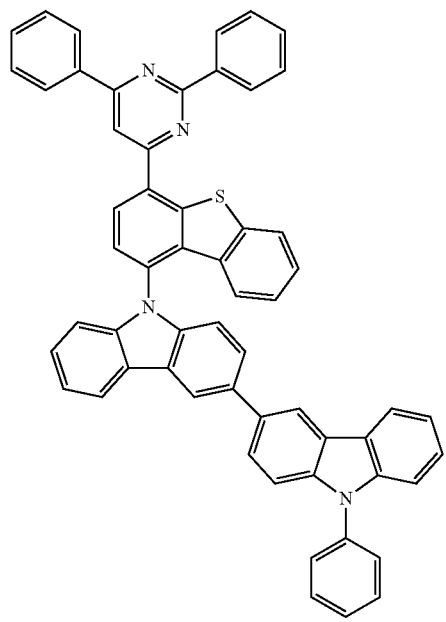
(1-161)
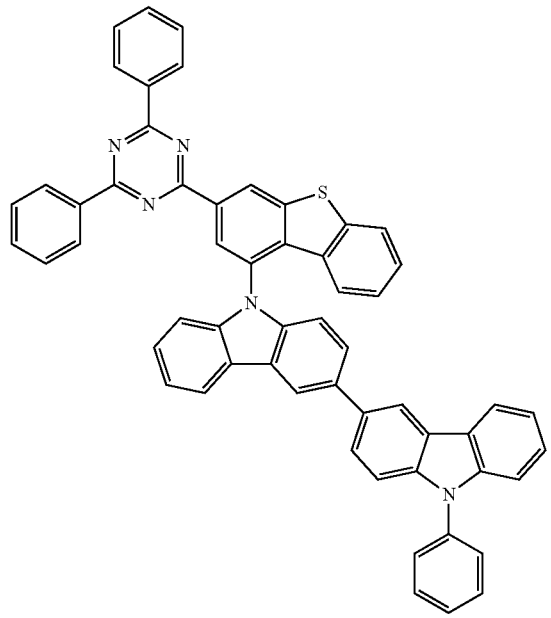
(1-162)
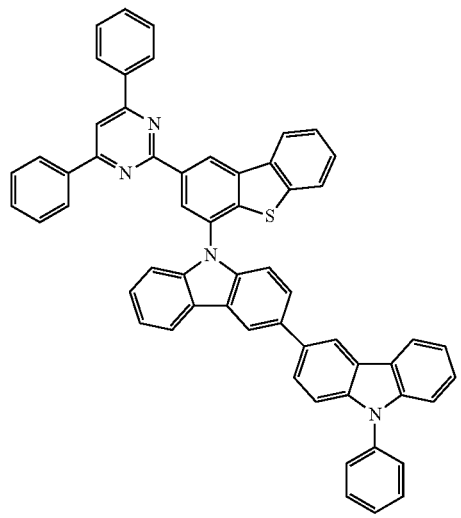
(1-163)
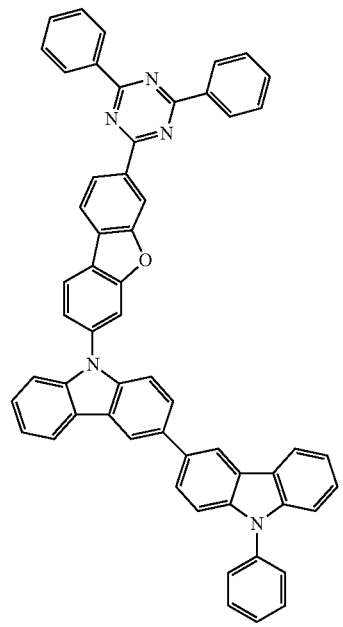

(1-164)
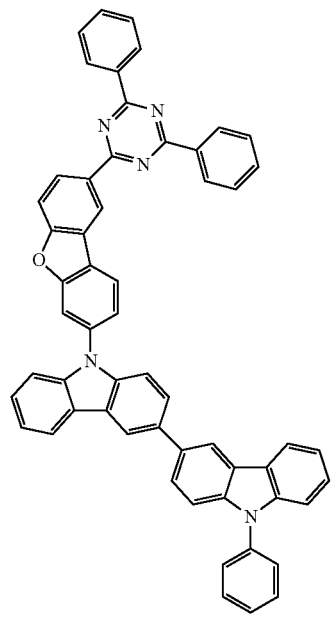
(1-165)
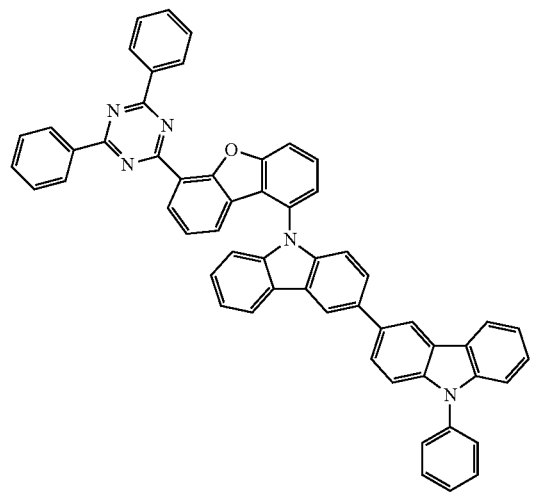
(1-166)
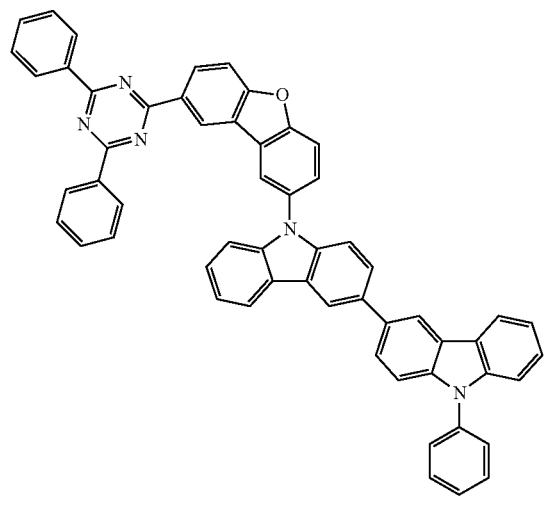
(1-167)
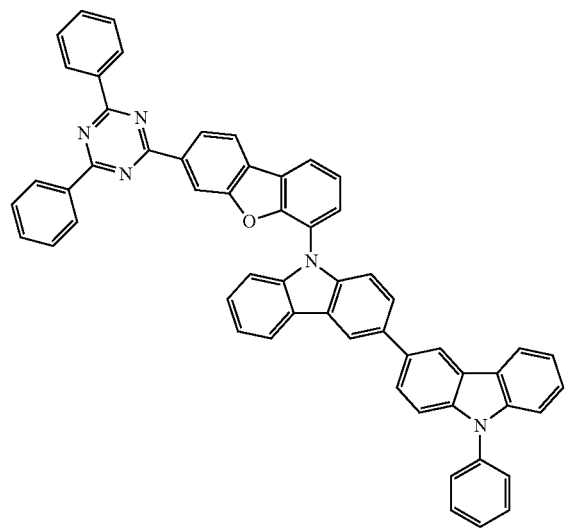

-continued
(1-168)
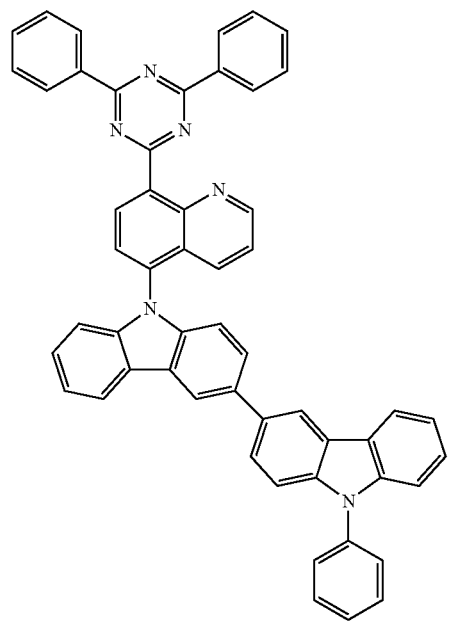
(1-169)
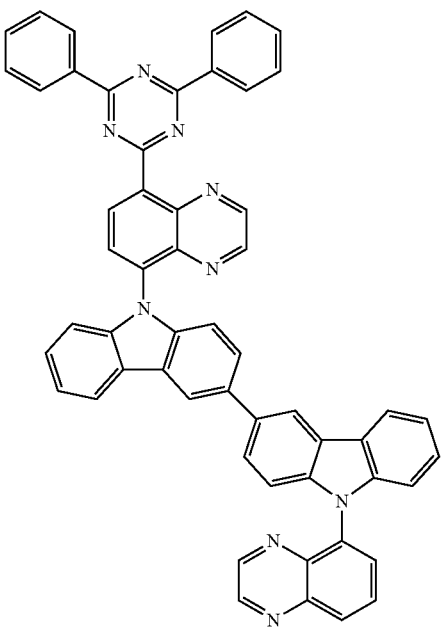
(1-170)
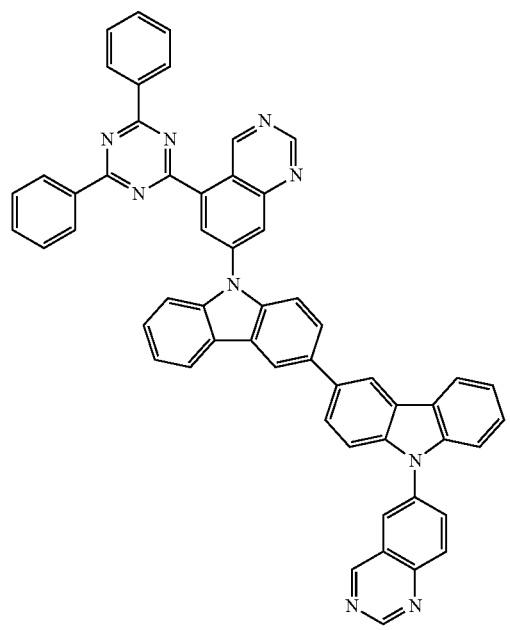
(1-171)

-continued
(1-172)
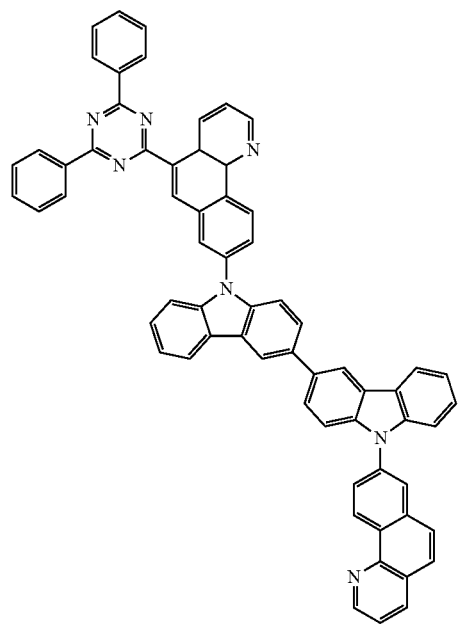
(1-173)
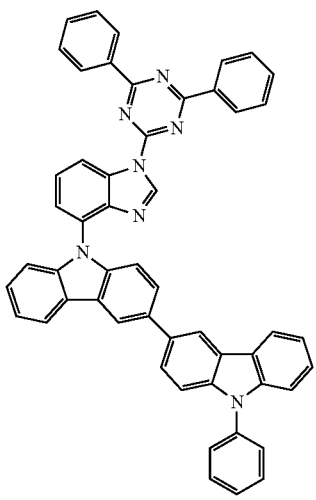
(1-174)
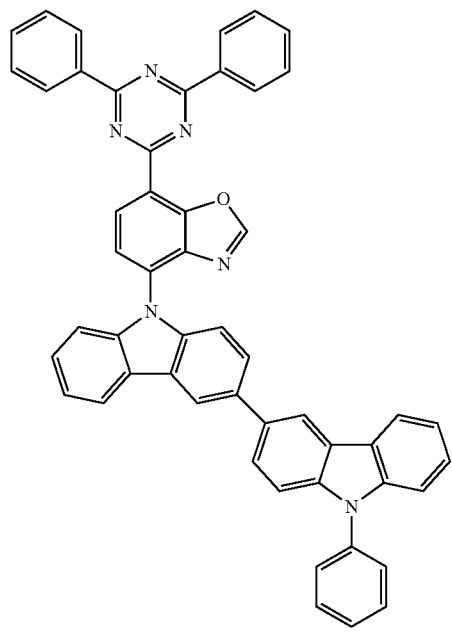
(1-175)
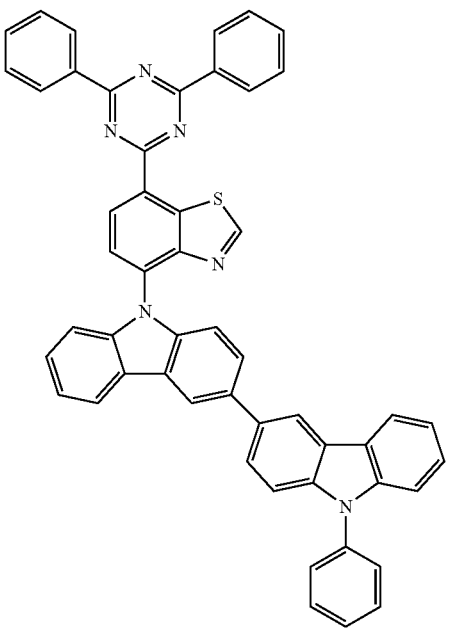

-continued
(1-176)
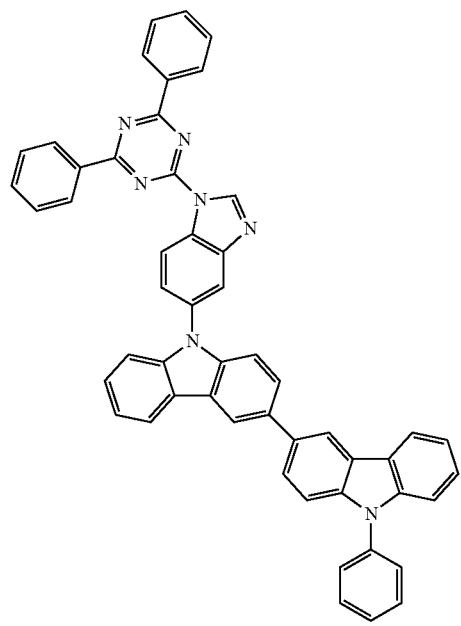
(1-177)
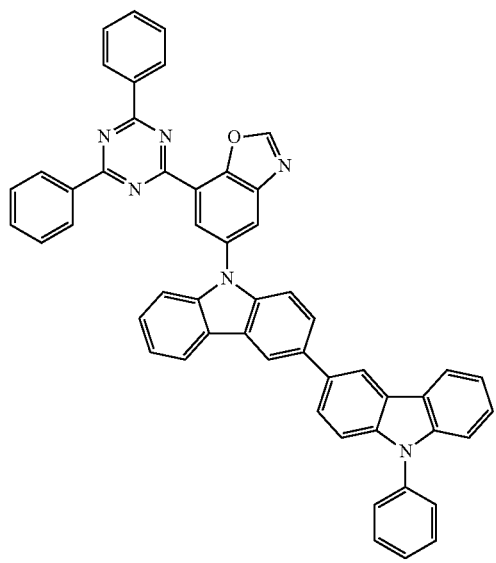
(1-178)
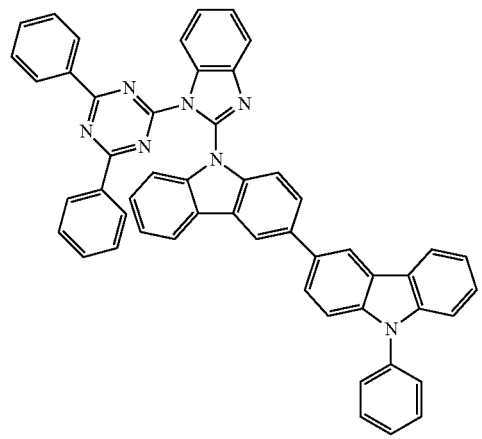
(1-179)
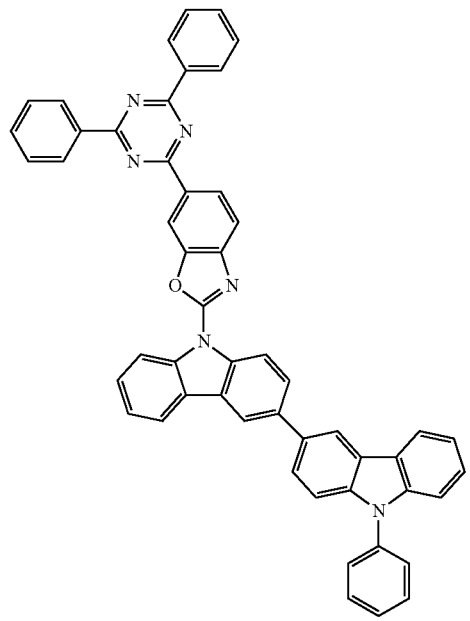

-continued
(1-180)
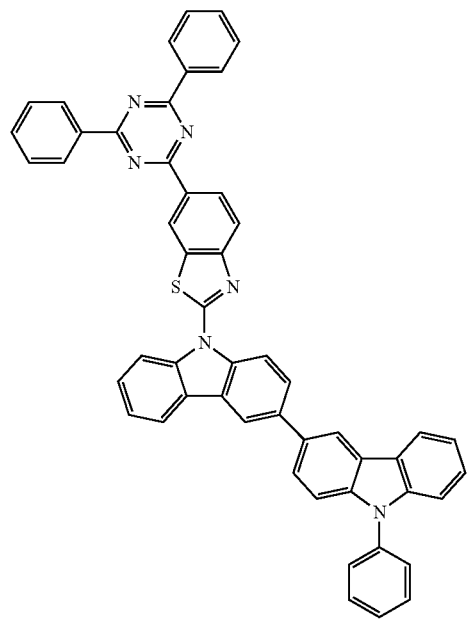
(1-181)
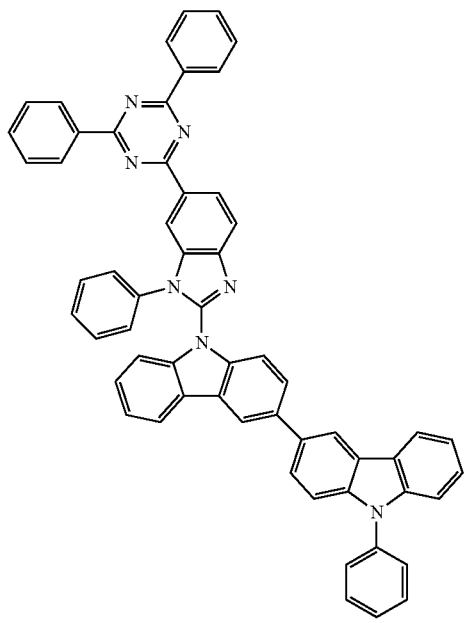
(1-182)
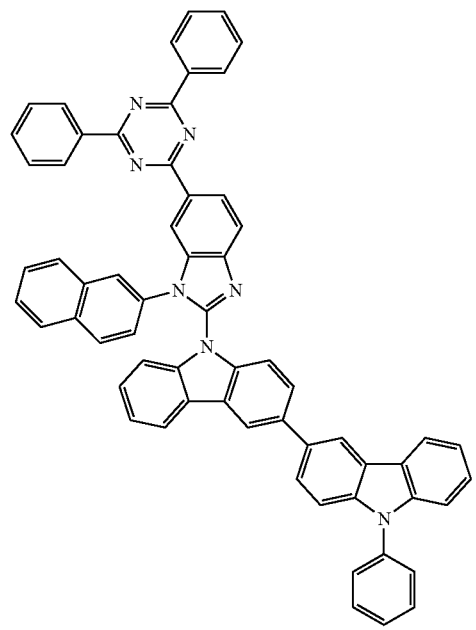
(1-183)
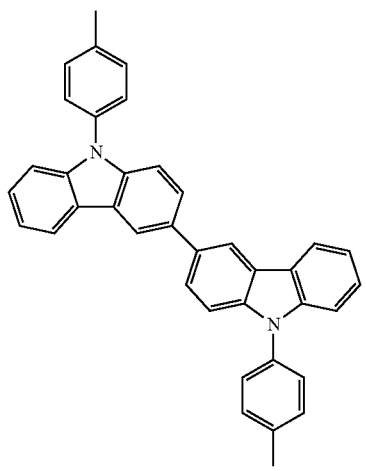

-continued
(1-184)
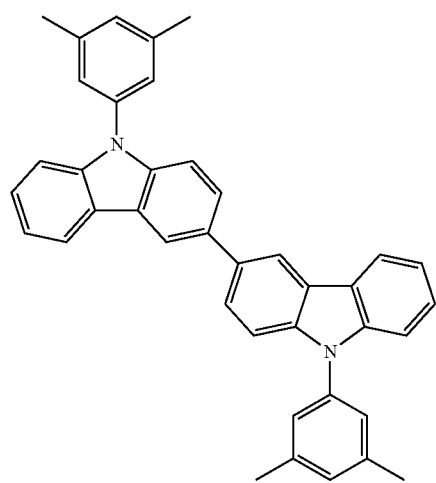
(1-185)
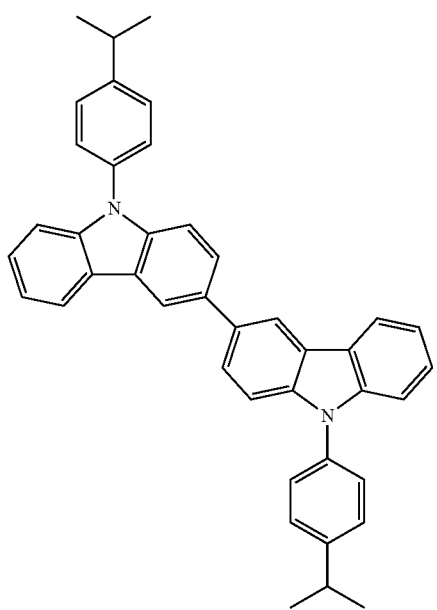
(1-186)
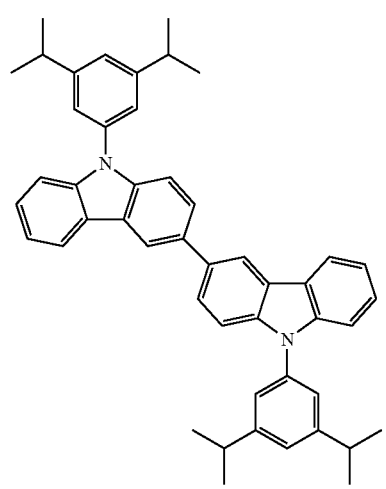
(1-187)
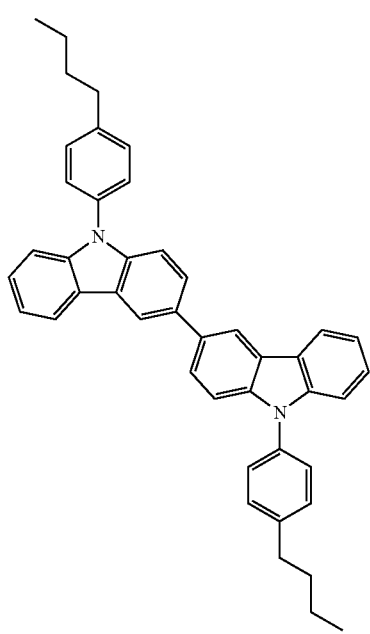

-continued
(1-188)
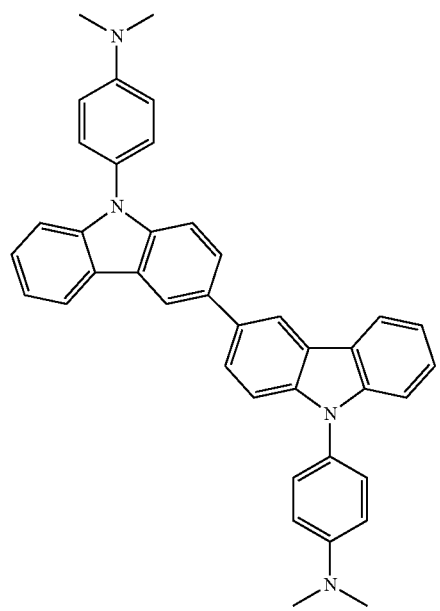
(1-189)
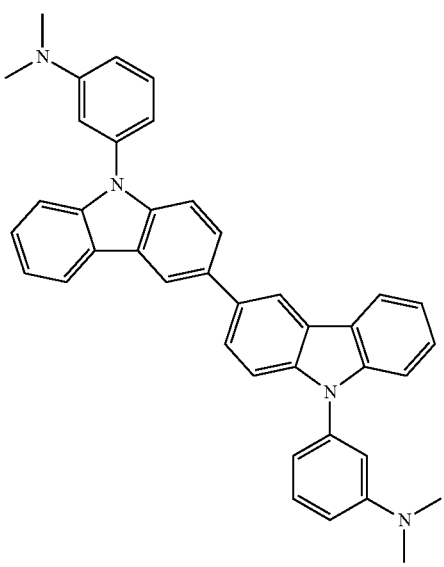
(1-190)
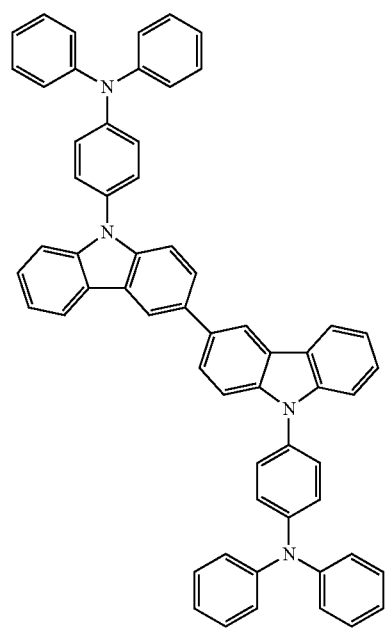
(1-191)

-continued
(1-192)
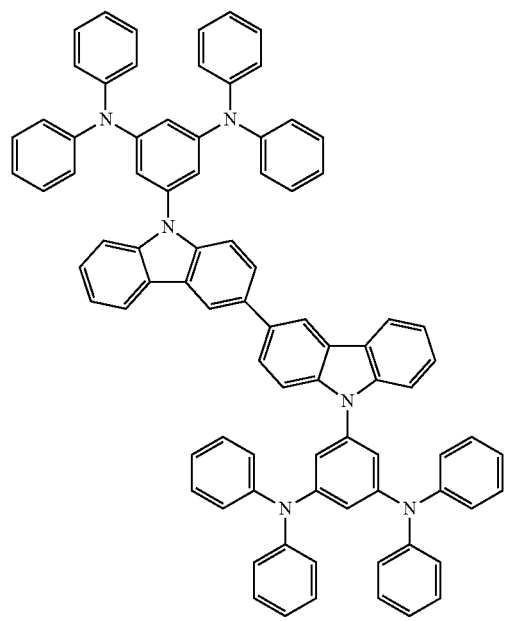
(1-193)
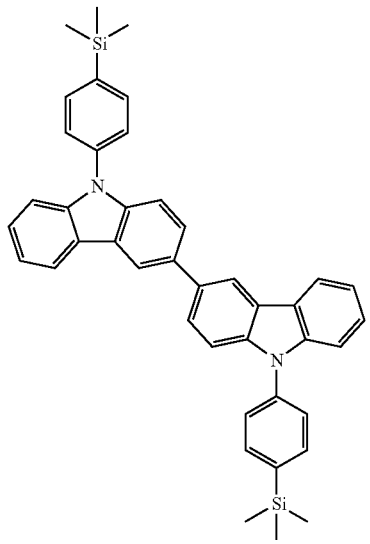
(1-194)
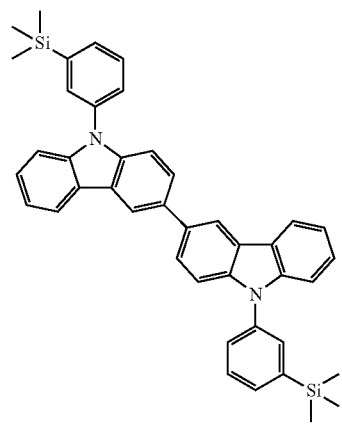
(1-195)
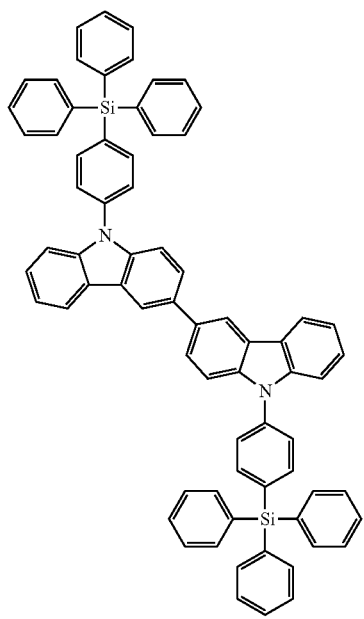

-continued
(1-196)
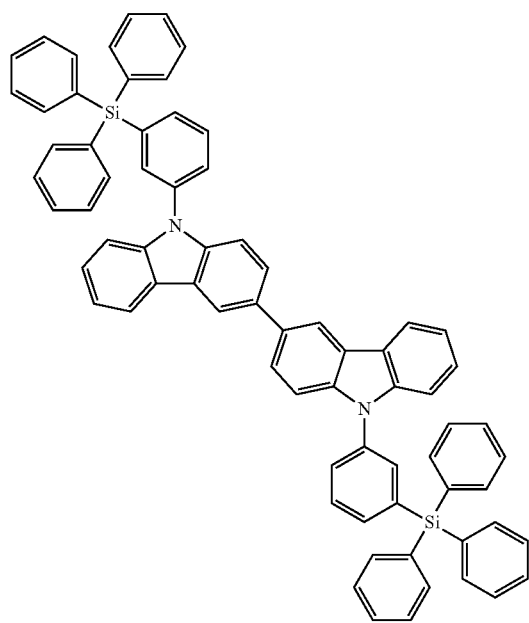
(1-197)
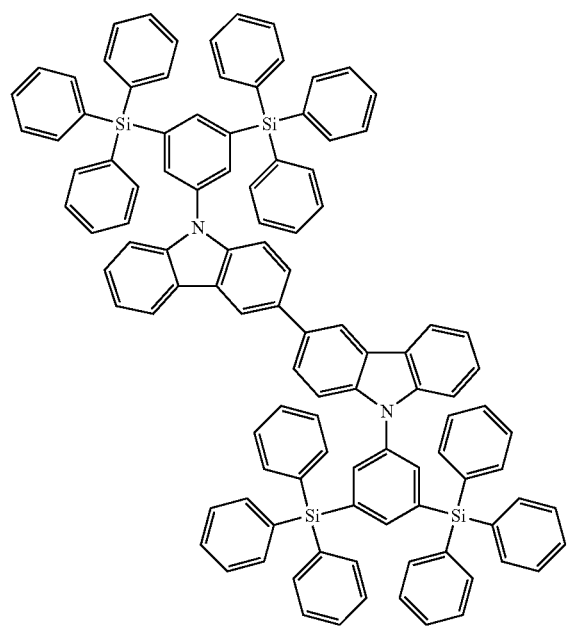
(1-198)
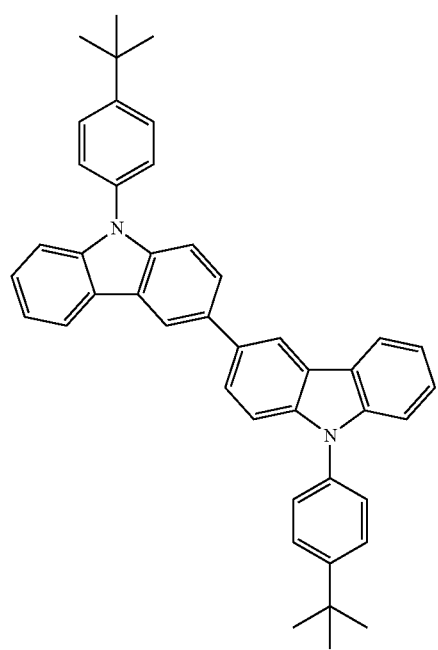
(1-199)
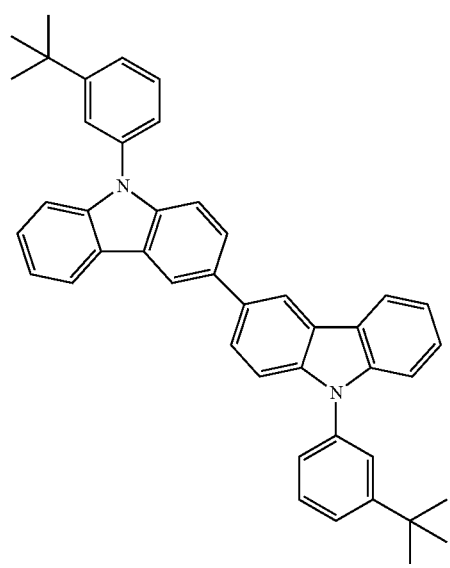

-continued
(1-200)
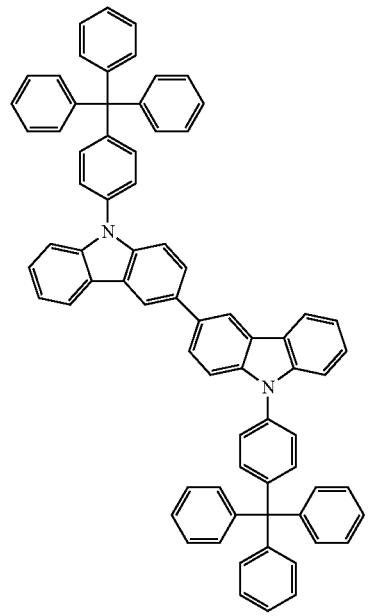
(1-201)
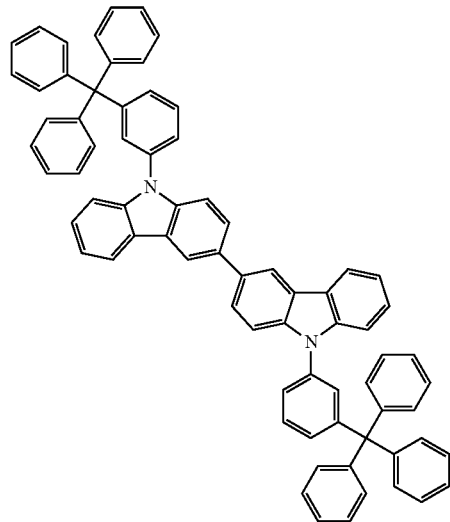
(1-202)
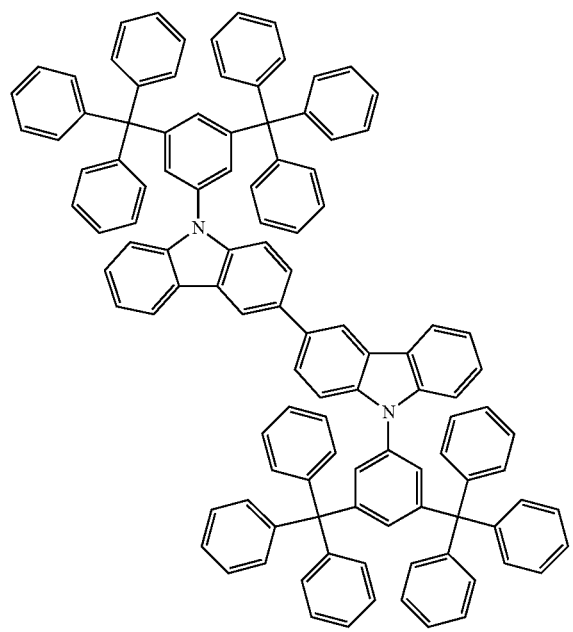
(1-203)
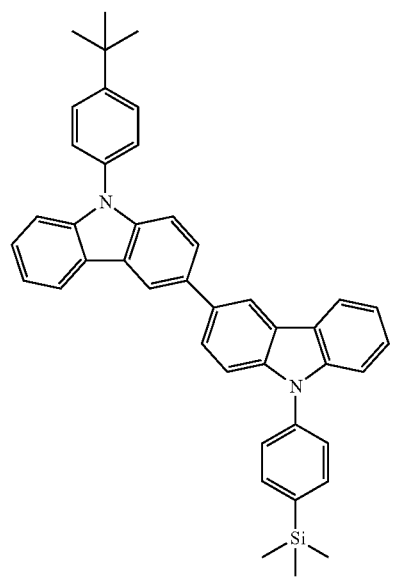

-continued
(1-204)
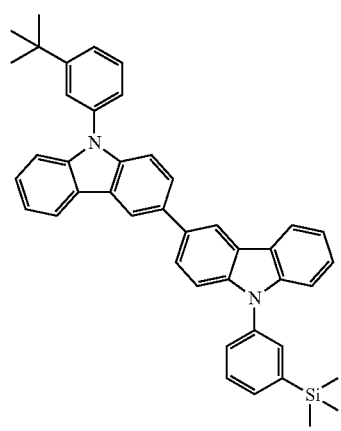
(1-205)
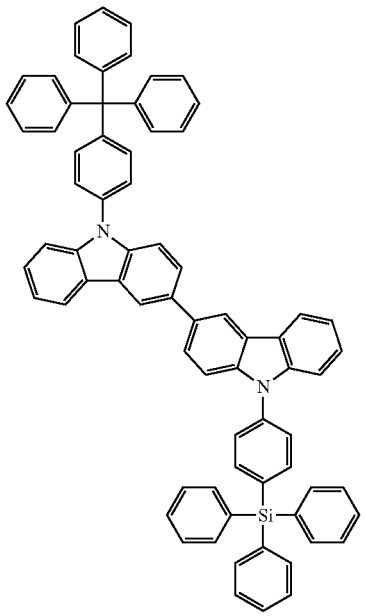
(1-206)
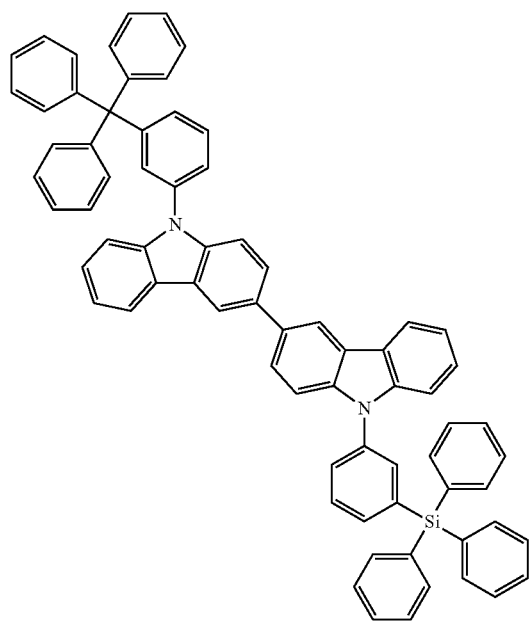
(1-207)
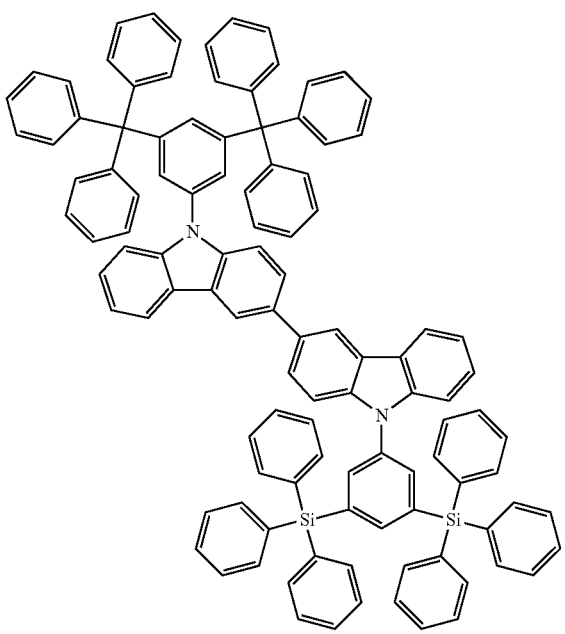

(1-208)
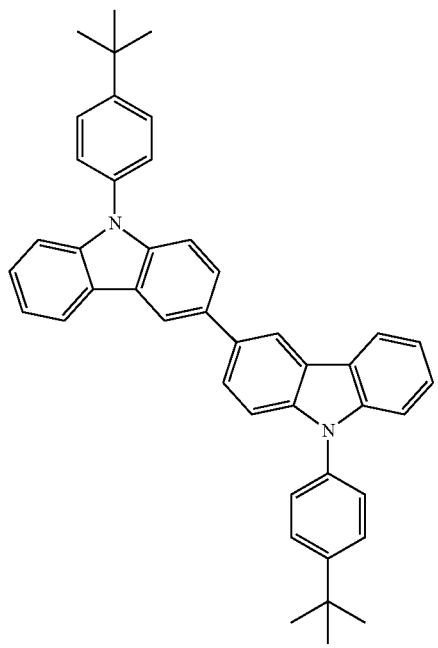
(1-209)
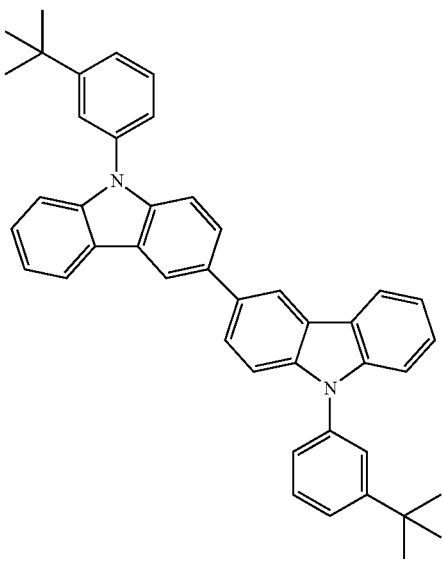
(1-210)
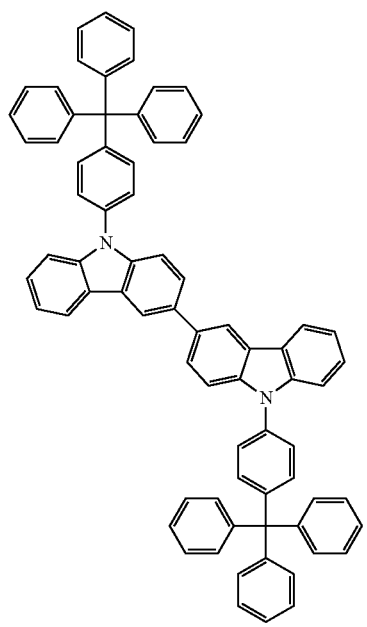
(1-211)
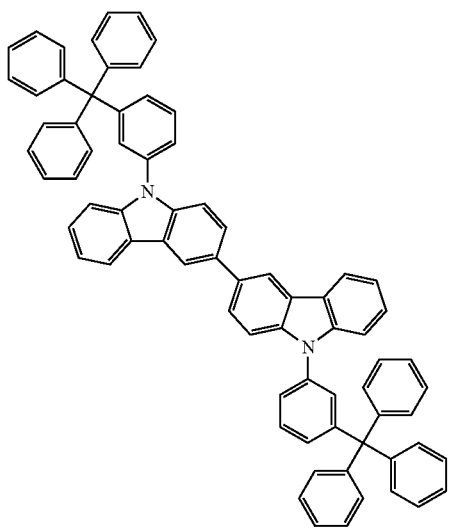

(1-212)
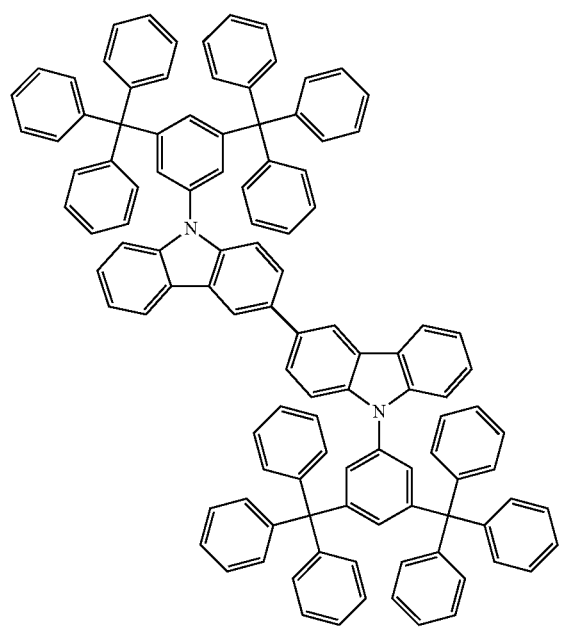
(1-213)
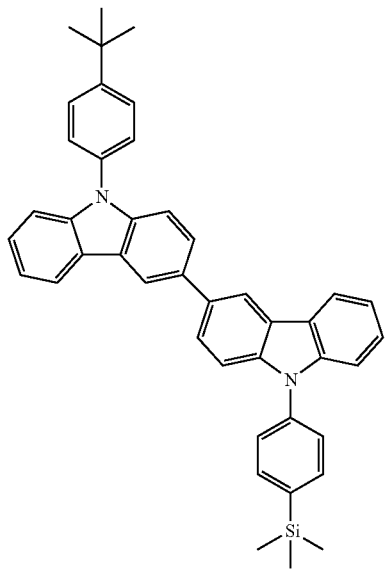
(1-214)
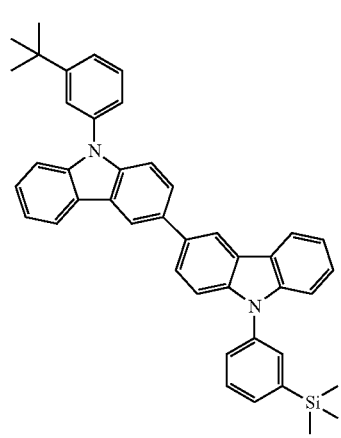
(1-215)
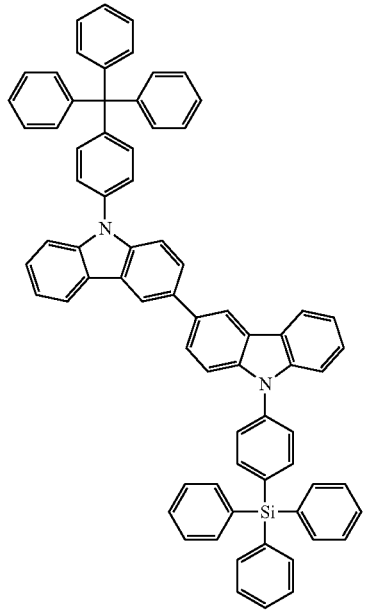

-continued
(1-216)
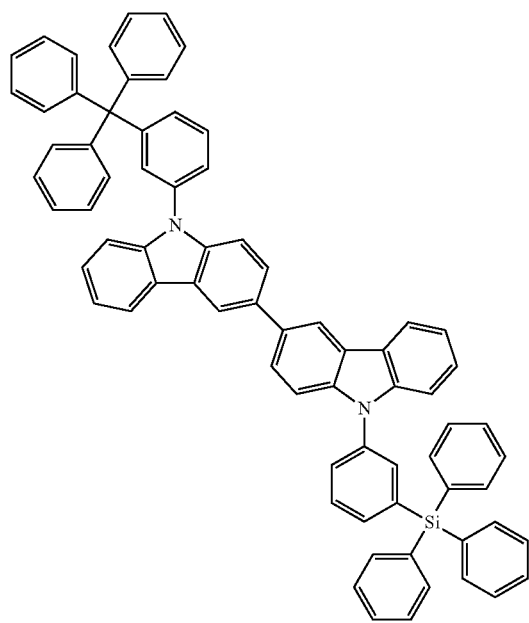
(1-217)
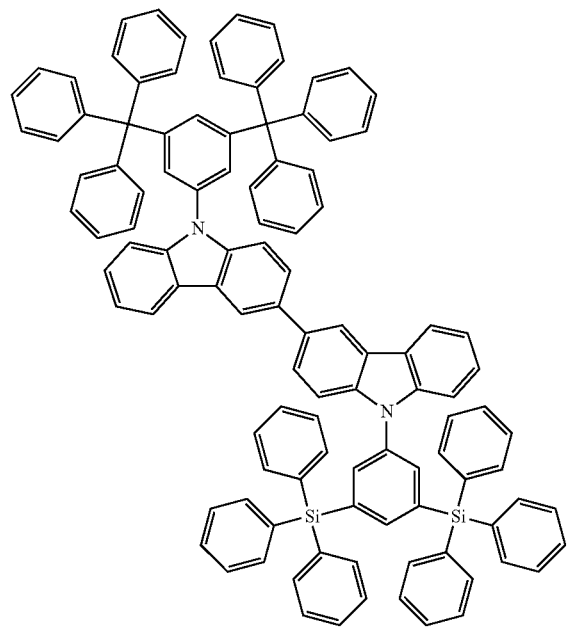
(1-218)
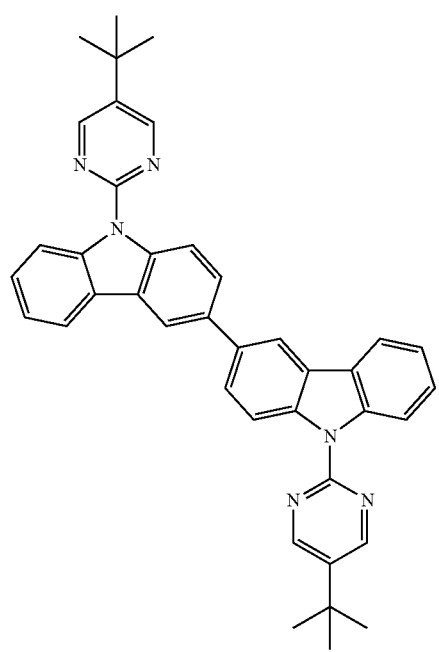
(1-219)
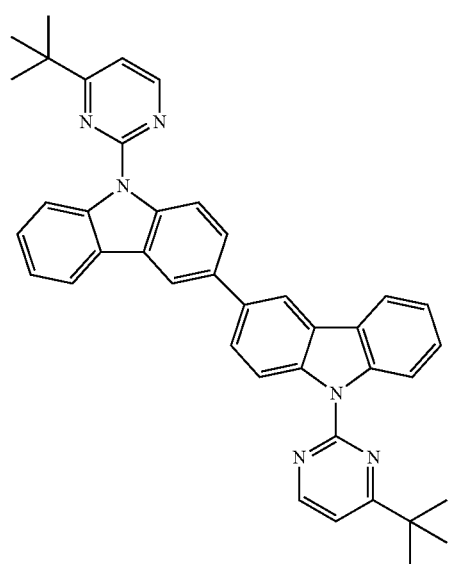

-continued
(1-220)
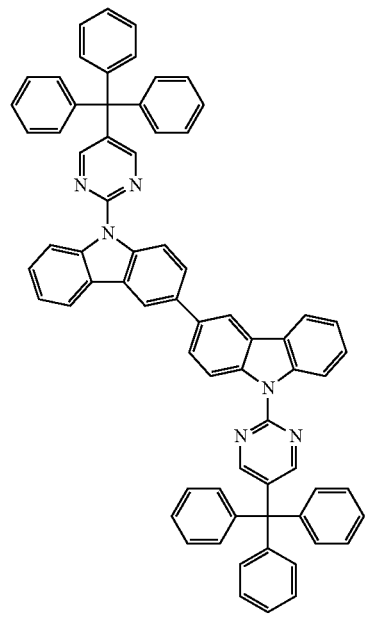
(1-221)
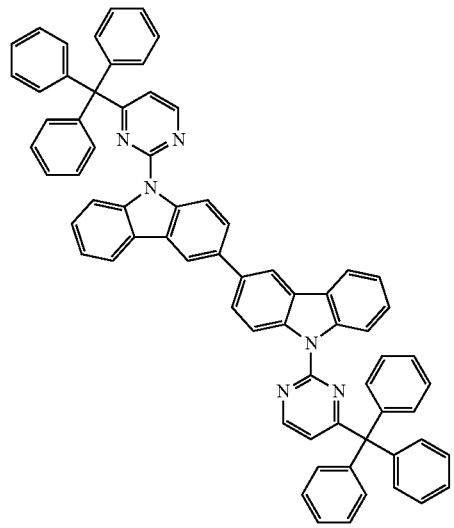
(1-222)
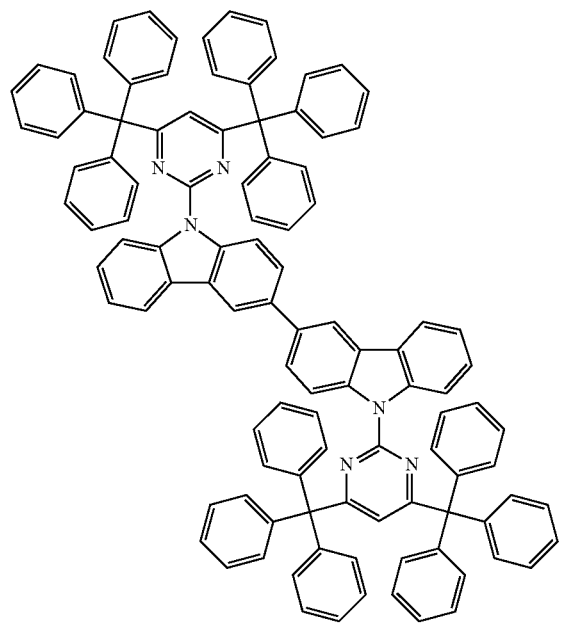
(1-223)
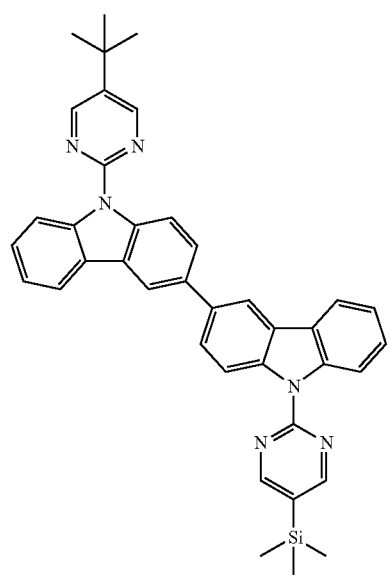

-continued (1-224)
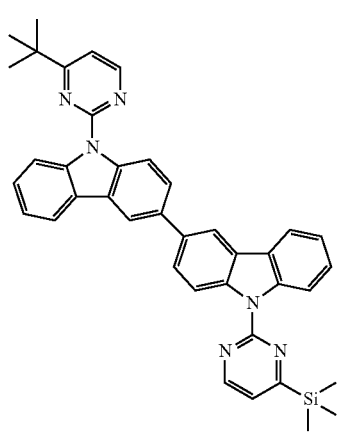

(1-225)
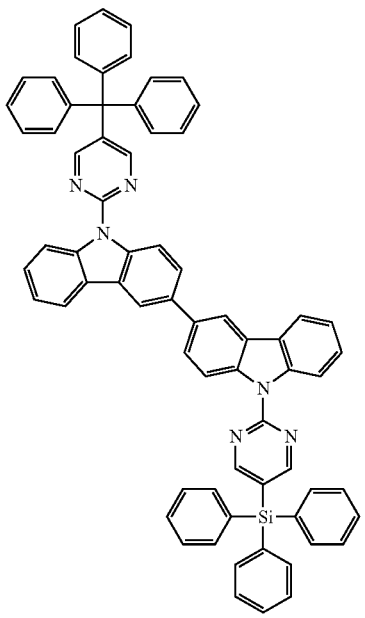

(1-226)
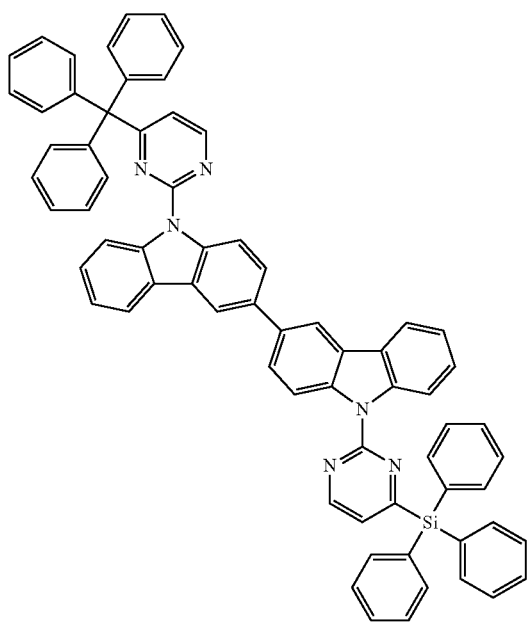

(1-227)
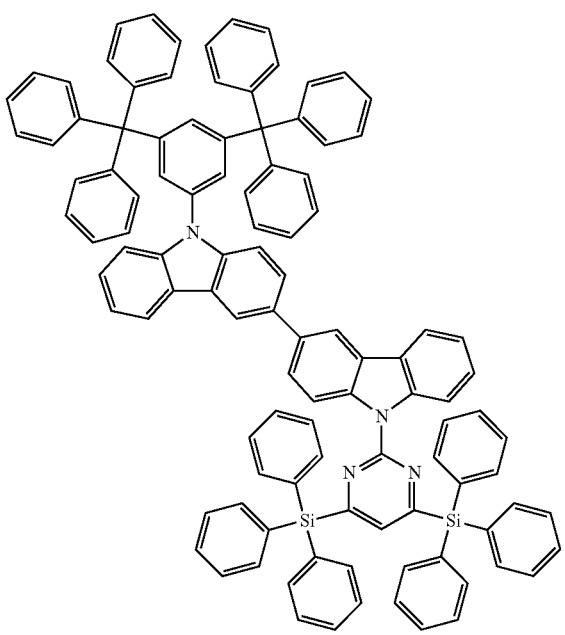

The thickness of the hole blocking layer 50 may be about 1 nm to about 1,000 nm, e.g., about 10 nm to about 100 nm. Maintaining the thickness of the hole blocking layer 50 at about 1 nm or greater (e.g., about 10 nm or greater) may help ensure that a hole blocking characteristic is not deteriorated. Maintaining the thickness of the hole blocking layer 50 at about 1,000 Å or less (e.g., about 100 nm or less) may help prevent an undesirable increase in a driving voltage.

As described, in the organic light emitting element according to the exemplary embodiment, a carbazole-containing compound represented by Chemical Formula 1 may be used as or included in the hole blocking layer 50 and, at the same time, a phenyl-substituted anthracene-containing compound represented by Chemical Formula 2 may be used as or included in the emission layer 60 of the organic light emitting element. Thus, carrier balance may be improved, efficiency of the organic light emitting element may be enhanced, and life span may be increased.

Figure 3:
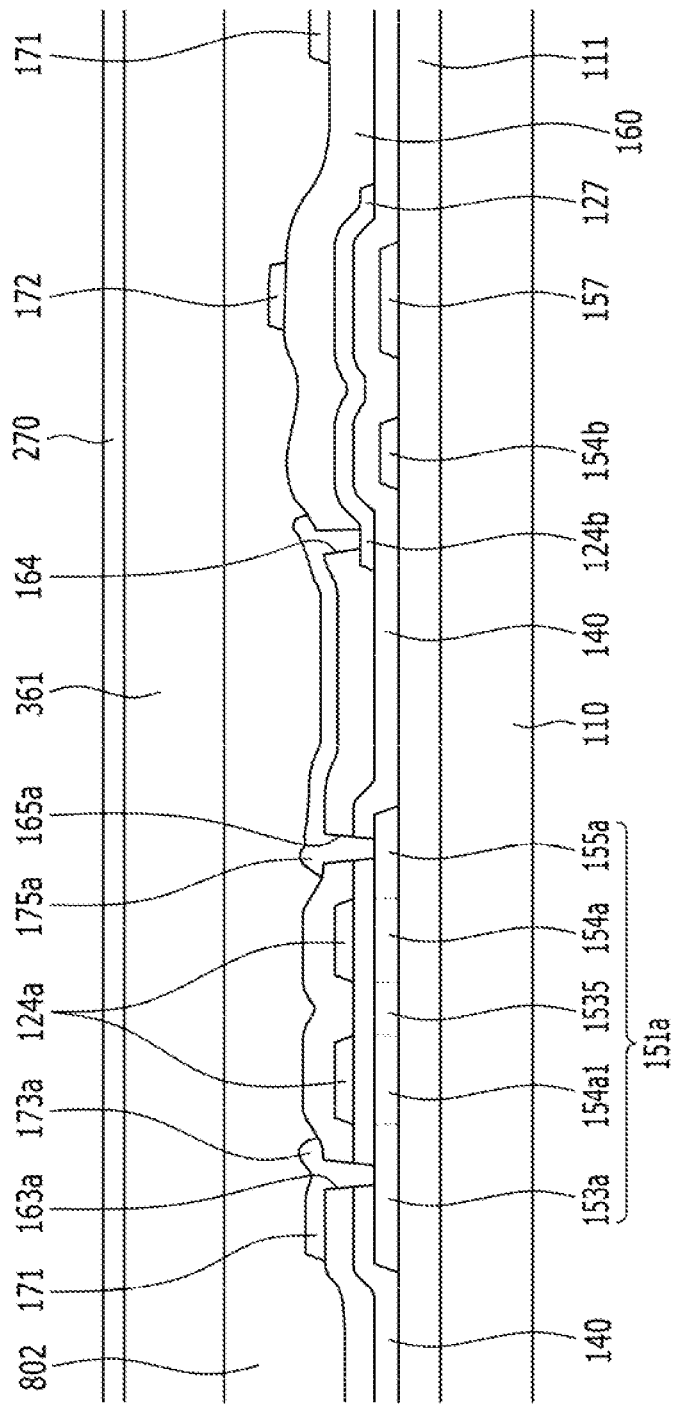
FIG. 3 illustrates a cross-sectional view of the organic light emitting diode device of FIG. 2, taken along the line III-III.
Figure 4:
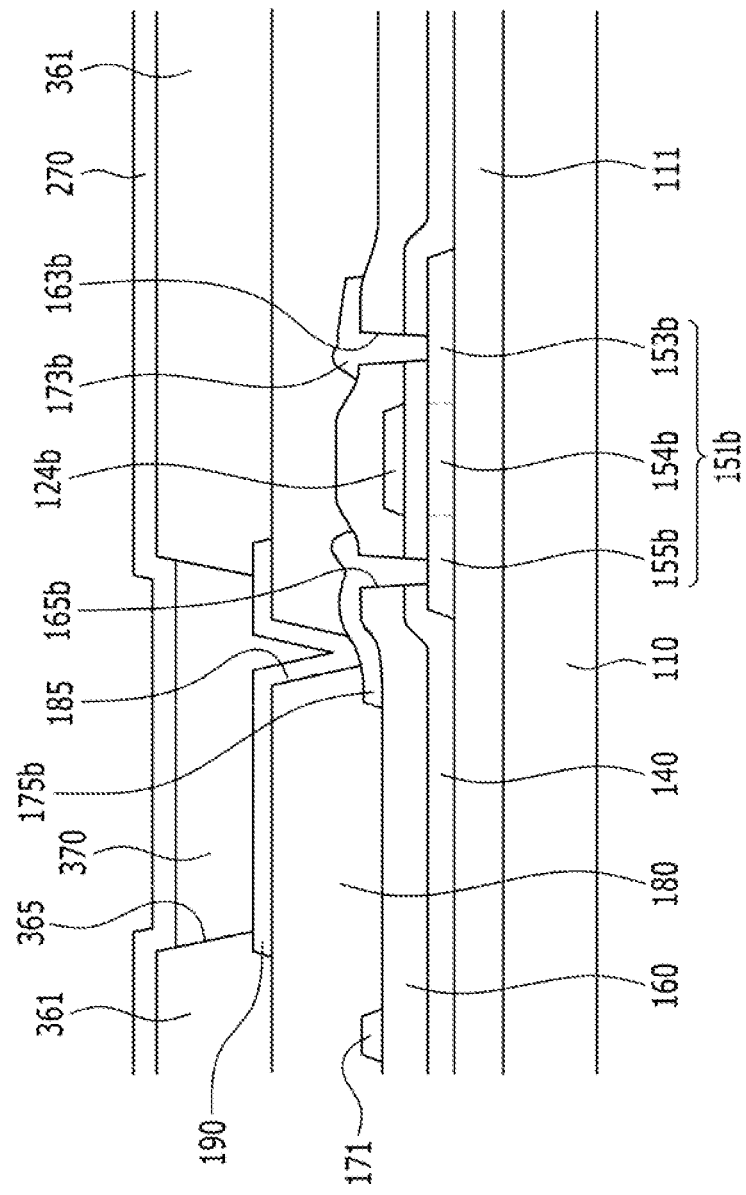
FIG. 4 illustrates a cross-sectional view of the organic light emitting diode device of FIG. 2, taken along the line IV-IV.

Next, an organic light emitting diode device including the organic light emitting diode according to the exemplary embodiment will be described with reference to FIG. 2 to FIG. 4.

Figure 2:
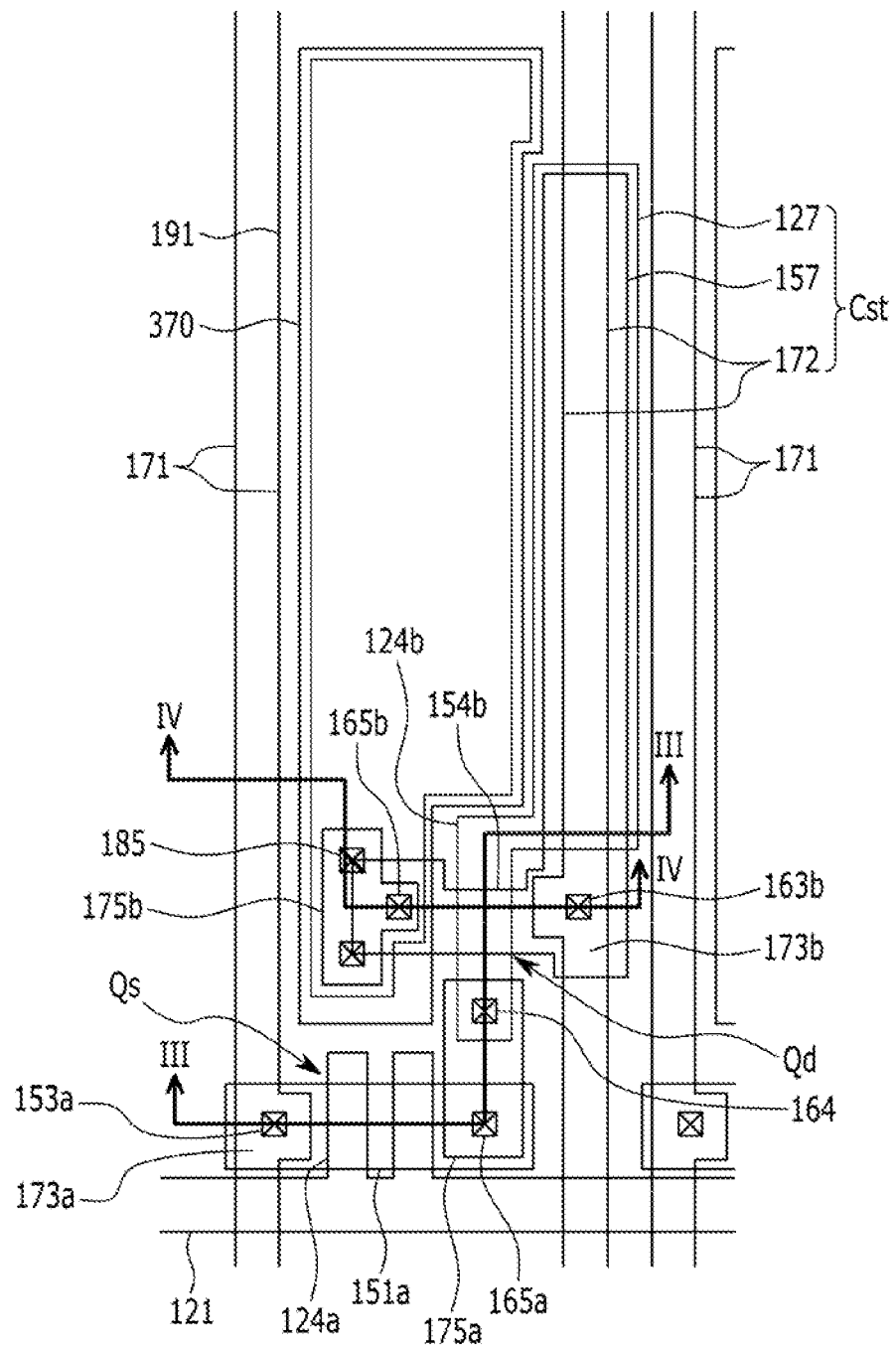
FIG. 2 illustrates a layout view of an organic light emitting diode device according to an exemplary embodiment.

FIG. 2 illustrates a layout view of an organic light emitting diode device according to an exemplary embodiment. FIG. 3 illustrates a cross-sectional view of the organic light emitting diode device of FIG. 2, taken along the line FIG. 4 illustrates a cross-sectional view of the organic light emitting diode device of FIG. 2, taken along the line IV-IV.

A blocking layer 111 made of a silicon oxide or a silicon nitride may be formed on a substrate 110 made of transparent glass or the like. The blocking layer 111 may have a dual-layer structure.

A plurality of pairs of first and second semiconductor islands 151a and 151b may be formed on the blocking layer 111. The first and second semiconductor islands 151a and 151b may be made of polysilicon or the like. Each of the semiconductor islands 151a and 151b may include a plurality of extrinsic regions including an n-type or p-type conductive impurity, and at least one intrinsic region that hardly includes a conductive impurity.

In the first semiconductor island 151a, the extrinsic region may include a first source region 153a, a first drain region 155a, and an intermediate region 1535, and they may be respectively doped with an n-type impurity and are separated from each other. The intrinsic region may include a pair of first channel regions 154a1 and 154a2 provided between the extrinsic regions 153a, 1535, and 155a.

In the second semiconductor island 151b, the extrinsic region may include a second source region 153b and a second drain region 155b, and they may be doped with a p-type impurity and are separated from each other. The intrinsic region may include a second channel region 154b provided between the second source region 153b and the second drain region 155b, and a storage region 157 extended upward from the second drain region 153b.

The extrinsic region may further include a lightly-doped region provided between the channel regions 154a1, 154a2, and 154b and the source and drain regions 153a, 155a, 153b, and 155b. Such a lightly-doped region may be replaced with an offset region that hardly includes an impurity.

In contrast, the extrinsic regions 153a and 155a of the first semiconductor island 151a may be doped with the p-type impurity, or the extrinsic regions 153b and 155b of the second semiconductor island 151b may be doped with the n-type impurity. The p-type conductive impurity may include boron (B), gallium (Ga), or the like, and the n-type conductive impurity may include phosphor (P), arsenic (As), or the like.

A gate insulating layer 140 made of a silicon oxide or a silicon nitride may be formed on the semiconductor islands 151a and 151b and the blocking layer 111.

A plurality of gate lines 121 including a first control electrode 124a and a plurality of gate conductors including a plurality of second control electrodes 124b may be formed on the gate insulating layer 140.

The gate lines 121 transmit a gate signal and substantially extend in a horizontal direction. The first control electrode 124a extends upward from the gate line 121 and crosses the first semiconductor island 151a. In this case, the first control electrode 124a overlaps the first channel regions 154a1 and 154a2. Each gate line 121 may include a wide end portion for connection with another layer or an external driving circuit. When a gate driving circuit generating the gate signal is integrated with the substrate 110, the gate line 121 is extended and thus may be directly connected with the gate driving circuit.

The second control electrode 124b may be separated from the gate line 121 and overlaps the second channel region 154b of the second semiconductor island 151b. The second control electrode 124b forms a storage electrode 127 by being extended, and the storage electrode 127 overlaps the storage region 157 of the second semiconductor island 151b.

The gate conductors 121 and 124b may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). However, the gate conductors 121 and 124b may have a multilayered structure including at least two conductive layers having different physical properties. One of the conductive layers may be made of a metal having low resistivity, for example, an aluminum-based metal, a silver-based metal, a copper-based metal, and the like so as to reduce a signal delay or a voltage drop. In contrast, the other conductive layer may be made of another material, particularly a material having an excellent contact characteristic with indium tin oxide (ITO) and indium zinc oxide (IZO), for example, chromium (Cr), molybdenum (Mo), a molybdenum alloy, tantalum (Ta), titanium (Ti), or the like. An example of combination of the two conductive layers may include a chromium lower layer and an aluminum (alloy) upper layer, or an aluminum (alloy) lower layer and a molybdenum (alloy) upper layer. However, the gate conductors 121 and 124b may be made of various metals and conductors other than the above-stated metals and conductors.

Side surfaces of the gate conductors 121 and 124b may be inclined with an inclination angle of about 30° to 80°.

An interlayer insulating film 160 may be formed on the gate conductors 121 and 124b. The interlayer insulating layer 160 may be made of an inorganic insulator such as a silicon nitride or a silicon oxide, an organic insulator, a low-dielectric insulator, or the like. A dielectric constant of the low-dielectric insulator may be about 4.0 or less, and —Si:C:O, a-Si:O:F, or the like formed through plasma enhanced chemical vapor deposition (PECVD) are examples of such a low-dielectric insulator. The interlayer insulating layer 160 may be formed of an organic insulator having photosensitivity, and the interlayer insulating layer 160 may have a flat surface.

A plurality of contact holes 164 exposing the second control electrode 124b may be formed in the interlayer insulating layer 160. In addition, a plurality of contact holes 163a, 163b, 165a, and 165b exposing the source and drain regions 153a, 153b, 155a, and 155b may be formed in the interlayer insulating layer 160.

A plurality of data conductors including data lines 171, driving voltage lines 172, and first and second output electrodes 175a and 175b may be formed on the interlayer insulating layer 160.

The data lines 171 transmit a data signal and substantially extend in a vertical direction to cross the gate lines 121. Each data line 171 may include a plurality of first input electrodes 173a connected with the first source region 153a through the contact hole 163a, and may include a wide end portion for connection with another layer or an external driving circuit. When a data driving circuit generating the data signal is integrated with the substrate 110, the data line 171 may be extended and then connected with the data driving circuit.

The driving voltage lines 172 transmit a driving voltage and substantially extend in a vertical direction to cross the gate line 121. Each of the driving voltage lines 172 may include a plurality of second input electrodes 173b connected with the second source region 153b through the contact hole 163b. The driving voltage lines 172 overlap the storage electrode 127, and they may be connected with each other.

The first output electrode 175a may be separated from the data line 171 and the driving voltage line 172. The first output electrode 175a may be connected with the first source region 155a through the contact hole 165a, and may be connected with the second control electrode 124b through the contact hole 164.

The second output electrode 175b may be separated from the data line 171, the driving voltage line 172, and the first output electrode 175a, and may be connected with the second drain region 155b through the contact hole 165b.

The data conductors 171, 172, 175a, and 175b may be made of a refractory material such as molybdenum, chromium, tantalum, titanium, or the like, or an alloy thereof, and may have a multilayer structure formed of a conductive layer such as a refractory metal and the like and a low-resistive material conductive layer. An example of the multilayered structure may include a double layer of a chromium or molybdenum (alloy) lower layer and an aluminum (alloy) upper layer, or a triple layer of a molybdenum (alloy) lower layer, an aluminum (alloy) middle layer, and a molybdenum (alloy) upper layer. However, the data conductors 171, 172, 175a, and 175b may be made of various metals and conductors other than the above-stated metals and conductors.

Like the gate conductors 121 and 121b, the data conductors 171, 172, 175a, and 175b may also have side surfaces that are inclined at about 30° to 80° with respect to the substrate 110.

A passivation layer 180 may be formed on the data conductors 171, 172, 175a, and 175b. The passivation layer 180 may be made of an inorganic material, an organic material, a low dielectric constant insulating material, or the like.

A plurality of contact holes 185 exposing the second output electrode 175b may be formed in the passivation layer 180. A plurality of contact holes (not shown) exposing an end portion of the data line 171 may be formed in the passivation layer 180, and a plurality of contact holes (not shown) exposing an end portion of the gate line 121 may be formed in the passivation layer 180 and the interlayer insulating layer 160.

A plurality of pixel electrodes 190 may be formed on the passivation layer 180. Each pixel electrode 190 may be physically and electrically connected with the second output electrode 175b through the contact hole 185, and may be made of a transparent conductive material such as ITO or IZO or a reflective metal such as aluminum, silver, or an alloy thereof.

A plurality of contact assistants or a plurality of connecting members may be formed on the passivation layer 180, and they may be connected with the gate line 121 and an exposed end portion of the data line 171.

A partition 361 may be formed on the passivation layer 180. The partition 361 defines openings by surrounding a periphery of an edge of the pixel electrode 190 like a bank, and may be made of an organic insulator or an inorganic insulator. The partition 361 may be made of a photoresist including a black pigment, and in this case, the partition 361 functions as a light blocking member and can be formed through a simple process.

An organic emission layer 370 may be formed on the pixel electrode 190, and a common electrode 270 may be formed on the organic emission layer 370. In this way, an organic light emitting element including the pixel electrode 190, the organic emission layer 370, and the common electrode 270 may be formed.

The organic light emitting element may be the same as the above-described organic light emitting element. For example, the organic light emitting element may have a lamination structure including anode/emission layer/cathode, anode/hole transfer layer/emission layer/electron injection layer/cathode, anode/hole transfer layer/emission layer/hole blocking layer/electron transfer layer/cathode, or anode/hole transfer layer/emission layer/hole blocking layer/electron transfer layer/cathode.

In this case, the pixel electrode 190 may be an anode which is a hole injection electrode, and the common electrode 270 becomes a cathode which is an electron injection electrode. In an implementation, according to a driving method of the organic light emitting device, the pixel electrode 190 may be a cathode and the common electrode 270 may be an anode. The hole and electron may be injected into the organic emission layer 370 from the pixel electrode 190 and the common electrode 270, respectively, and an exciton generated by coupling the injected hole and electron falls from an excited state to a ground state to emit light.

The common electrode 270 may be formed on the organic emission layer 370. The common electrode 270 receives a common voltage, and may be made of a reflective metal including calcium (Ca), barium (Ba), magnesium (Mg), aluminum (Al), silver (Ag), or the like, or a transparent conductive material such as ITO or IZO.

The emission layer, the hole blocking layer, and the electron injection layer may be the same as those described above. For example, the first compound, which is the carbazole-containing compound (e.g., represented by one of Chemical Formulae 1-A to 1-D), may be included as or in a hole blocking layer of the organic light emitting element, and the second compound, which is the anthracene-containing compound (e.g., represented by Chemical Formula 2), may be included as or in the emission layer.

In such an organic light emitting device, the first semiconductor island 151a, the first control electrode 124a connected to the gate line 121, and the first input electrode 173a and the first output electrode 175a connected to the data line 171 form a switching thin film transistor Qs, and a channel of the switching thin film transistor Qs is formed in the channel regions 154a1 and 154a2 of the first semiconductor island 151a. The second semiconductor island 151b, the second control electrode 124b connected to the first output electrode 175a, the second input electrode 173b connected to the driving voltage line 172, and the second output electrode 175b connected to the pixel electrode 190 form a driving thin film transistor Qd, and a channel of the driving thin film transistor Qd is formed in the channel region 154b of the second semiconductor island 151b. The pixel electrode 190, the organic light emitting member 370, and the common electrode 270 form an organic light emitting diode, and the pixel electrode 190 may become an anode and the common electrode 270 may become a cathode, or the pixel electrode 190 may become a cathode and the common electrode 270 may become an anode. The storage electrode 127, the driving voltage line 172, and the storage region 157 that overlap each other form a storage capacitor Cst.

The switching thin film transistor Qs transmits a data signal of the data line 171 in response to a gate signal of the gate line 121. When receiving the data signal, the driving thin film transistor Qd flows a current that depends on a voltage difference between the second control electrode 124b and the second input electrode 173b. The voltage difference between the second control electrode 124b and the second input electrode 173b may be charged to the storage capacitor Cst and then maintained even after the switching thin film transistor Qs is turned off. The organic light emitting diode displays an image by emitting light of which the strength varies depending on a current of the driving thin film transistor Qd.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Test Example 1

An indium tin oxide (ITO) transparent electrode was formed with a thickness of 120 nm on a glass substrate. The glass substrate was then cleaned using ultrasonic waves, and a pretreatment process (i.e., UV—$O_3$ treatment or heat treatment) was performed.

A compound represented by Chemical Formula 4 was deposited with a thickness of 50 nm as a hole injection layer on the pre-treated anode, and then a compound represented by Chemical Formula 5 was deposited with a thickness of 45 nm as a hole transfer layer thereon. Then, a compound represented by Chemical Formula 3, serving as a doping material, was simultaneously deposited (at a concentration of 5 wt %) with a compound represented by Chemical Formula 2-1, serving as a host material, such that an emission layer having a thickness of 30 nm was formed.

[Chemical Formula 4]

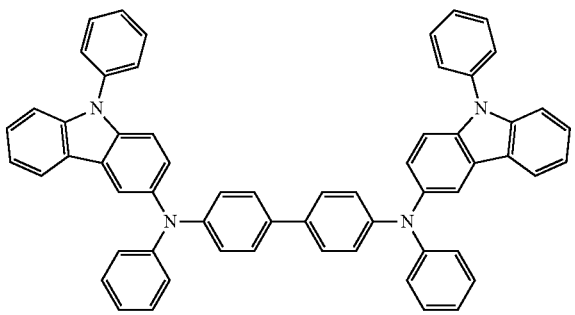

[Chemical Formula 5]

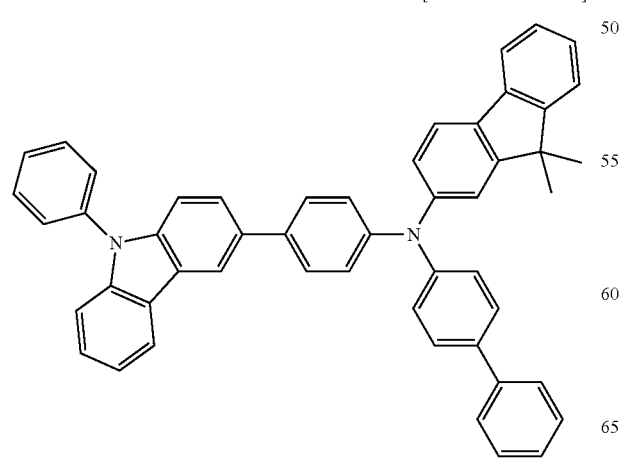

[Chemical Formula 2-1]

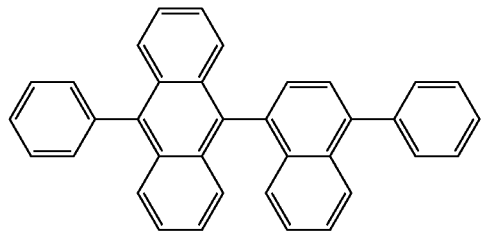

[Chemical Formula 3]

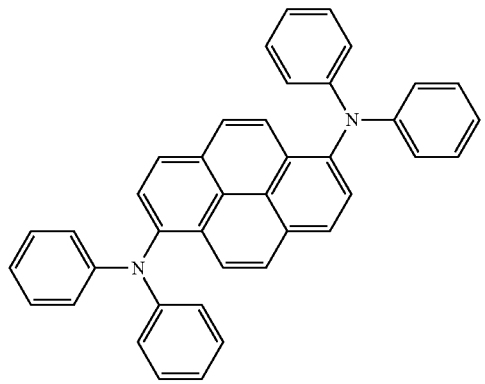

Next, as a hole blocking layer, a compound of Chemical Formula 1-1 was deposited with a thickness of 10 nm on the emission layer. Then, as an electron transfer layer, Alq was deposited with a thickness of 15 nm on the hole blocking layer. Next, as a cathode, lithium fluoride was deposited with a thickness of 0.5 nm and then aluminum was deposited with a thickness of 150 nm such that an organic light emitting element was manufactured.

[Chemical Formula 1-1]

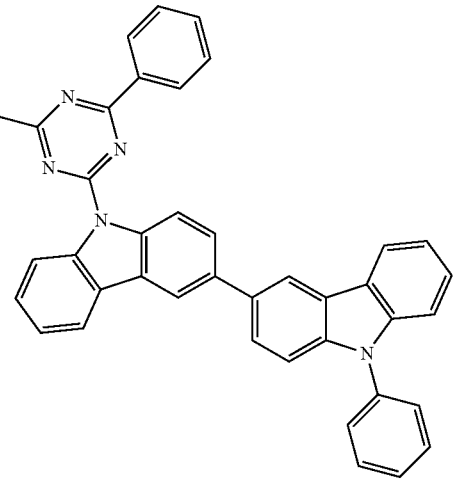

With respect to the manufactured organic light emitting element, element performance (i.e., current efficiency, Cd/A) was measured when driving with a current density of 10 mA/cm$^2$, and time (i.e., life span) until luminance was decreased to 80% from initial luminance at a current density of 50 mA/cm$^2$ was respectively measured.

The host compound of the emission layer was varied to include the compounds of Chemical Formulae 2-1 to 2-9, respectively, and a compound of the electron blocking layer was varied to include the compounds of Chemical Formulae 1-1 to 1-8, respectively, and then element performance and life span were measured under the same conditions.
(2-1)
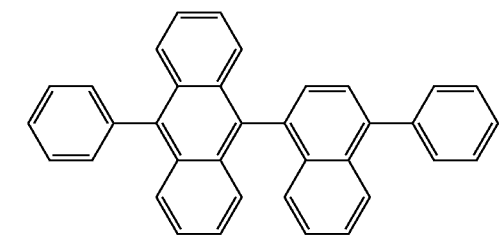
(2-2)
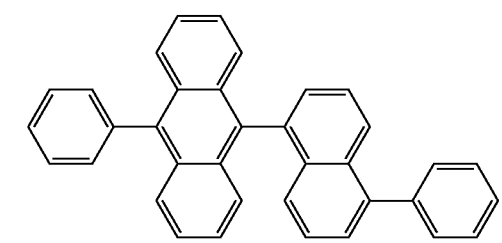
(2-3)
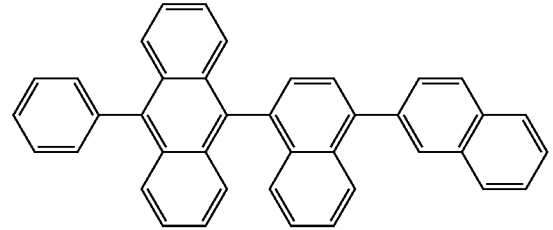
(2-4)
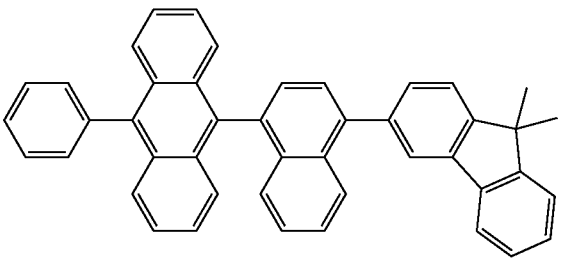
(2-5)
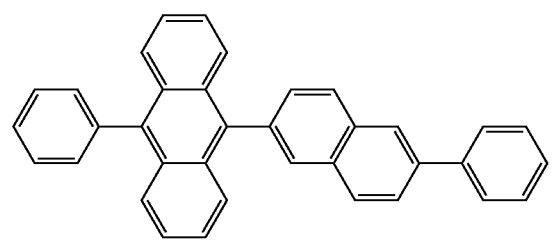
-continued
(2-6)
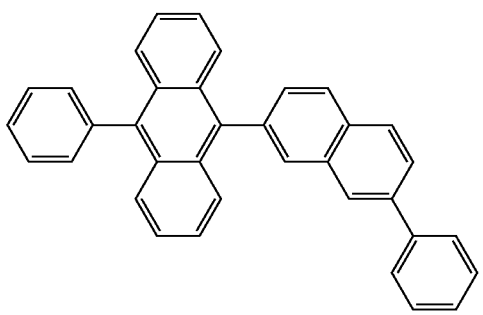
(2-7)
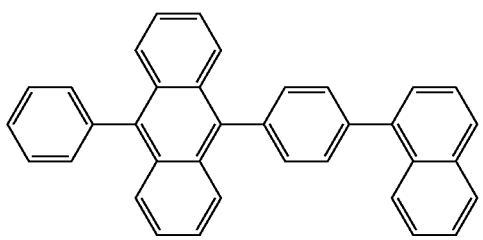
(2-8)
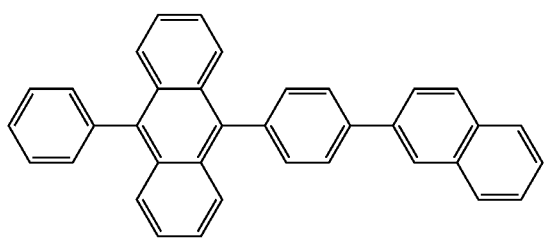
(2-9)
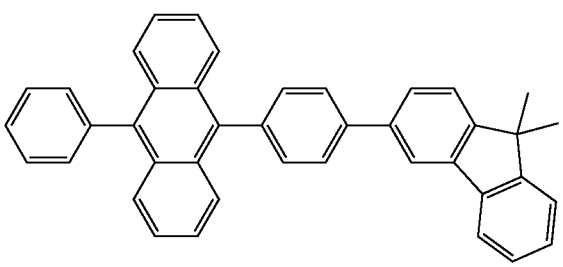
(1-1)
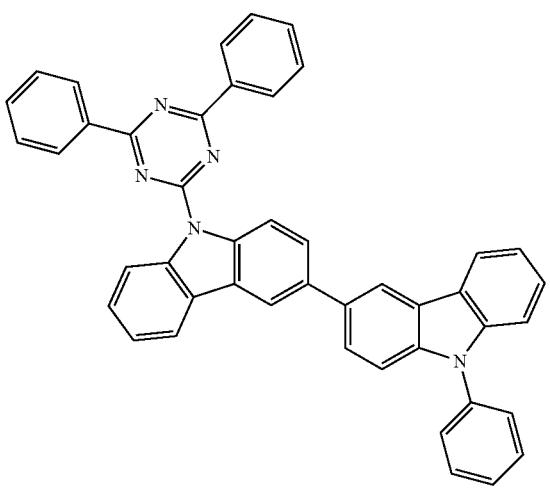

(1-2)
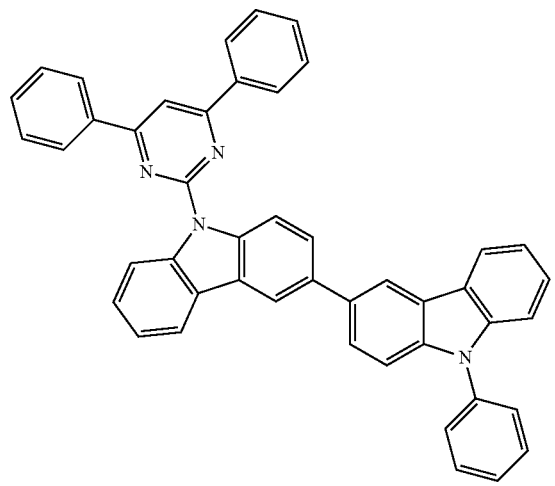
(1-3)
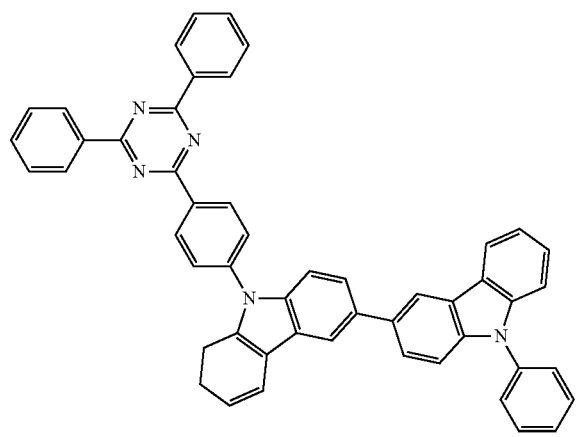
(1-4)
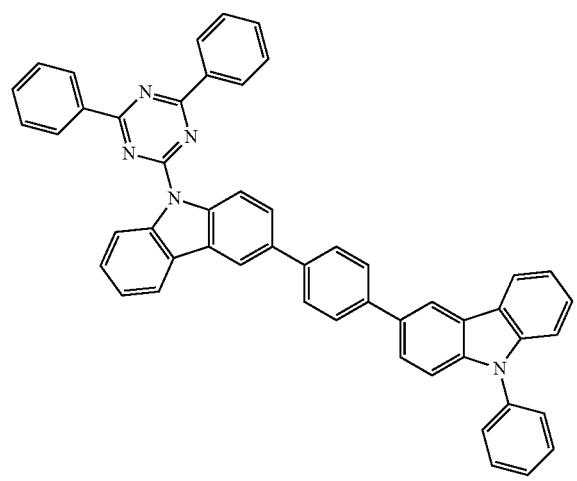
(1-5)
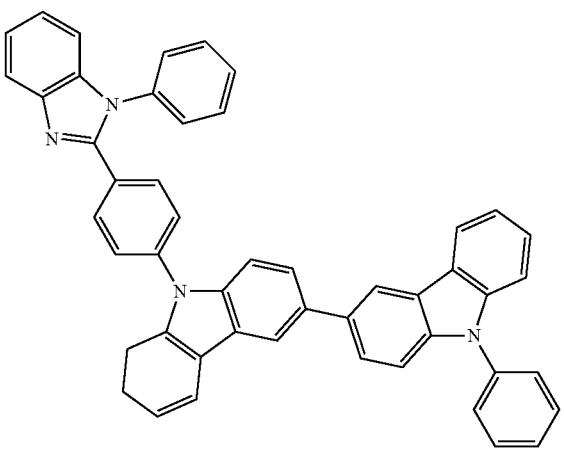
(1-6)
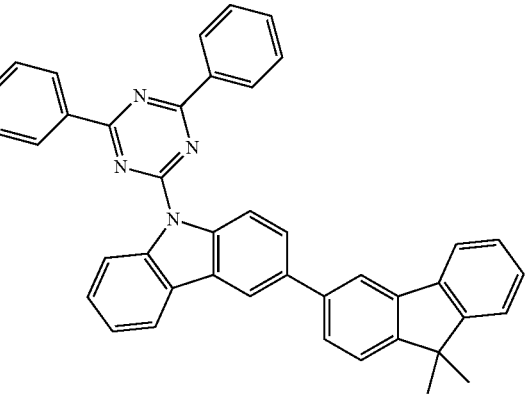
(1-7)
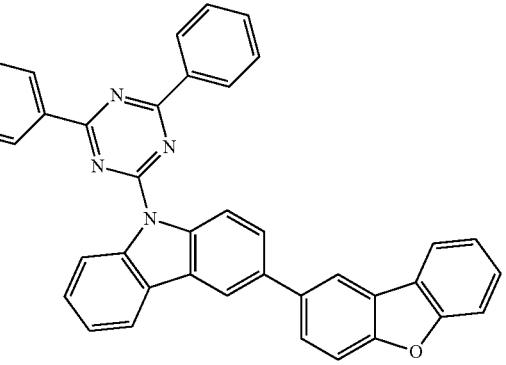

(1-8)

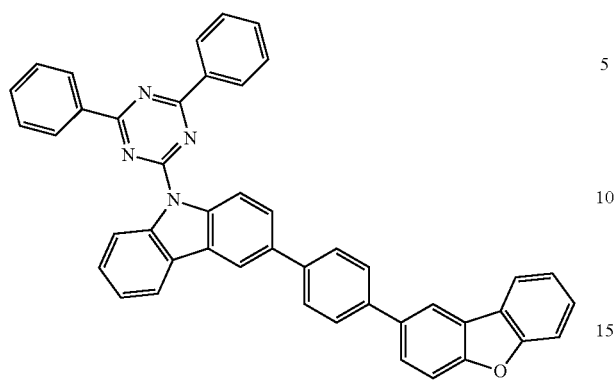

[Chemical Formula 7]

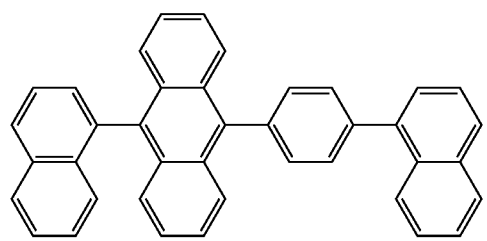

In addition, as Comparative Examples, an organic light emitting element was manufactured under the same conditions as of the above-described organic light emitting elements, except that a host compound was varied to include compounds of Chemical Formulae 6 to 8.

[Chemical Formula 6]

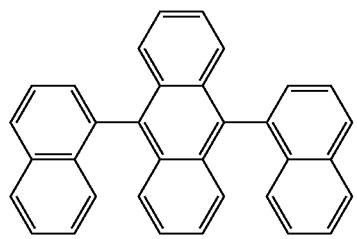

[Chemical Formula 8]

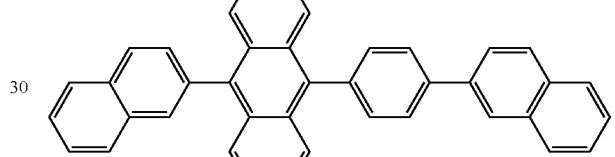

Table 1 shows measurement results.

TABLE 1

| Test Example | Host | Hole blocking layer | Electron transfer layer | Efficiency (cd/A) | Life span (h) |
|---|---|---|---|---|---|
| Test Example 1-1 | Chemical Formula 2-1 | Chemical Formula 1-1 | Alq | 5.4 | 130 |
| Test Example 1-2 | Chemical Formula 2-1 | Chemical Formula 1-2 | Alq | 5.3 | 110 |
| Test Example 1-3 | Chemical Formula 2-1 | Chemical Formula 1-3 | Alq | 5.5 | 130 |
| Test Example 1-4 | Chemical Formula 2-1 | Chemical Formula 1-4 | Alq | 5.2 | 110 |
| Test Example 1-5 | Chemical Formula 2-1 | Chemical Formula 1-5 | Alq | 5.4 | 120 |
| Test Example 1-6 | Chemical Formula 2-1 | Chemical Formula 1-6 | Alq | 5.5 | 110 |
| Test Example 1-7 | Chemical Formula 2-1 | Chemical Formula 1-7 | Alq | 5.5 | 100 |
| Test Example 1-8 | Chemical Formula 2-1 | Chemical Formula 1-8 | Alq | 5.3 | 110 |
| Test Example 1-9 | Chemical Formula 2-2 | Chemical Formula 1-1 | Alq | 5.3 | 130 |
| Test Example 1-10 | Chemical Formula 2-3 | Chemical Formula 1-1 | Alq | 5.2 | 140 |
| Test Example 1-11 | Chemical Formula 2-4 | Chemical Formula 1-1 | Alq | 5.4 | 110 |
| Test Example 1-12 | Chemical Formula 2-5 | Chemical Formula 1-1 | Alq | 5.3 | 130 |
| Test Example 1-13 | Chemical Formula 2-6 | Chemical Formula 1-1 | Alq | 5.2 | 140 |
| Test Example 1-14 | Chemical Formula 2-7 | Chemical Formula 1-1 | Alq | 5.3 | 130 |
| Test Example 1-15 | Chemical Formula 2-8 | Chemical Formula 1-1 | Alq | 5.2 | 130 |

TABLE 1-continued

| Test Example | Host | Hole blocking layer | Electron transfer layer | Efficiency (cd/A) | Life span (h) |
|---|---|---|---|---|---|
| Test Example 1-16 | Chemical Formula 2-9 | Chemical Formula 1-1 | Alq | 5.5 | 110 |
| Test Example 1-17 | Chemical Formula 2-2 | Chemical Formula 1-3 | Alq | 5.2 | 130 |
| Test Example 1-18 | Chemical Formula 2-4 | Chemical Formula 1-3 | Alq | 5.5 | 110 |
| Test Example 1-19 | Chemical Formula 2-5 | Chemical Formula 1-3 | Alq | 5.4 | 120 |
| Test Example 1-20 | Chemical Formula 2-7 | Chemical Formula 1-3 | Alq | 5.3 | 120 |
| Test Example 1-21 | Chemical Formula 2-2 | Chemical Formula 1-4 | Alq | 5.1 | 120 |
| Test Example 1-22 | Chemical Formula 2-4 | Chemical Formula 1-4 | Alq | 5.3 | 100 |
| Test Example 1-23 | Chemical Formula 2-5 | Chemical Formula 1-4 | Alq | 5.3 | 110 |
| Test Example 1-24 | Chemical Formula 2-7 | Chemical Formula 1-4 | Alq | 5.2 | 110 |
| Test Example 1-25 | Chemical Formula 2-2 | Chemical Formula 1-6 | Alq | 5.4 | 120 |
| Test Example 1-26 | Chemical Formula 2-4 | Chemical Formula 1-6 | Alq | 5.6 | 100 |
| Test Example 1-27 | Chemical Formula 2-5 | Chemical Formula 1-6 | Alq | 5.4 | 110 |
| Test Example 1-28 | Chemical Formula 2-7 | Chemical Formula 1-6 | Alq | 5.4 | 120 |
| Comparative Example 1 | Chemical Formula 6 | Chemical Formula 1-1 | Alq | 4.5 | 40 |
| Comparative Example 2 | Chemical Formula 7 | Chemical Formula 1-1 | Alq | 4.9 | 90 |
| Comparative Example 3 | Chemical Formula 8 | Chemical Formula 1-1 | Alq | 4.8 | 80 |

As shown in Table 1, it may be seen that when a compound of Chemical Formula 1 and a compound of Chemical Formula 2 were included as an electron transfer material and a host material, respectively, efficiency and life span were significantly improved. In addition, referring to Table 1, even when the compound of Chemical Formula 1 was used as an electron transfer material of the hole blocking layer, efficiency and life span were reduced when the compounds of Chemical Formulae 6 to 8 were used as a host, as in the Comparative Examples.

For example, efficiency and life span of the organic light emitting element may be be improved by including a phenyl-substituted anthracene-containing compound as a host, and a carbazole-containing compound as an electron blocking layer.

Test Example 2

An organic light emitting element was manufactured under the same conditions of Test Example 1, except that 50 wt % of Liq was simultaneously deposited as a doping material to a BPen compound to form an electron transfer layer. Efficiency and life span of the manufactured organic light emitting element were measured under the same conditions of Test Example 1, and measurement results are shown in Table 2.

TABLE 2

| Test Example | Host | Hole blocking layer | Electron transfer layer | Efficiency (cd/A) | Life span (h) |
|---|---|---|---|---|---|
| Test Example 2-1 | Chemical Formula 2-1 | Chemical Formula 1-1 | BPhen:Liq | 5.3 | 140 |
| Test Example 2-2 | Chemical Formula 2-1 | Chemical Formula 1-2 | BPhen:Liq | 5.3 | 120 |
| Test Example 2-3 | Chemical Formula 2-1 | Chemical Formula 1-3 | BPhen:Liq | 5.4 | 140 |
| Test Example 2-4 | Chemical Formula 2-1 | Chemical Formula 1-4 | BPhen:Liq | 5.1 | 120 |
| Test Example 2-5 | Chemical Formula 2-1 | Chemical Formula 1-5 | BPhen:Liq | 5.3 | 140 |
| Test Example 2-6 | Chemical Formula 2-1 | Chemical Formula 1-6 | BPhen:Liq | 5.5 | 130 |
| Test Example 2-7 | Chemical Formula 2-1 | Chemical Formula 1-7 | BPhen:Liq | 5.4 | 120 |
| Test Example 2-8 | Chemical Formula 2-1 | Chemical Formula 1-8 | BPhen:Liq | 5.3 | 130 |
| Test Example 2-9 | Chemical Formula 2-2 | Chemical Formula 1-1 | BPhen:Liq | 5.2 | 140 |
| Test Example 2-10 | Chemical Formula 2-3 | Chemical Formula 1-1 | BPhen:Liq | 5.2 | 150 |
| Test Example 2-11 | Chemical Formula 2-4 | Chemical Formula 1-1 | BPhen:Liq | 5.3 | 120 |
| Test Example 2-12 | Chemical Formula 2-5 | Chemical Formula 1-1 | BPhen:Liq | 5.3 | 140 |
| Test Example 2-13 | Chemical Formula 2-6 | Chemical Formula 1-1 | BPhen:Liq | 5.3 | 160 |
| Test Example 2-14 | Chemical Formula 2-7 | Chemical Formula 1-1 | BPhen:Liq | 5.2 | 150 |
| Test Example 2-15 | Chemical Formula 2-8 | Chemical Formula 1-1 | BPhen:Liq | 5.3 | 150 |
| Test Example 2-16 | Chemical Formula 2-9 | Chemical Formula 1-1 | BPhen:Liq | 5.4 | 120 |
| Test Example 2-17 | Chemical Formula 2-2 | Chemical Formula 1-3 | BPhen:Liq | 5.4 | 130 |

TABLE 2-continued

| Test Example | Host | Hole blocking layer | Electron transfer layer | Efficiency (cd/A) | Life span (h) |
|---|---|---|---|---|---|
| Test Example 2-18 | Chemical Formula 2-4 | Chemical Formula 1-3 | BPhen:Liq | 5.5 | 120 |
| Test Example 2-19 | Chemical Formula 2-5 | Chemical Formula 1-3 | BPhen:Liq | 5.3 | 130 |
| Test Example 2-20 | Chemical Formula 2-7 | Chemical Formula 1-3 | BPhen:Liq | 5.4 | 130 |
| Test Example 2-21 | Chemical Formula 2-2 | Chemical Formula 1-4 | BPhen:Liq | 5.0 | 130 |
| Test Example 2-22 | Chemical Formula 2-4 | Chemical Formula 1-4 | BPhen:Liq | 5.1 | 120 |
| Test Example 2-23 | Chemical Formula 2-5 | Chemical Formula 1-4 | BPhen:Liq | 5.2 | 130 |
| Test Example 2-24 | Chemical Formula 2-7 | Chemical Formula 1-4 | BPhen:Liq | 5.1 | 120 |
| Test Example 2-25 | Chemical Formula 2-2 | Chemical Formula 1-6 | BPhen:Liq | 5.4 | 130 |
| Test Example 2-26 | Chemical Formula 2-4 | Chemical Formula 1-6 | BPhen:Liq | 5.5 | 120 |
| Test Example 2-27 | Chemical Formula 2-5 | Chemical Formula 1-6 | BPhen:Liq | 5.5 | 120 |
| Test Example 2-28 | Chemical Formula 2-7 | Chemical Formula 1-6 | BPhen:Liq | 5.3 | 120 |
| Comparative Example 1 | Chemical Formula 6 | Chemical Formula 1-1 | BPhen:Liq | 4.5 | 50 |
| Comparative Example 2 | Chemical Formula 7 | Chemical Formula 1-1 | BPhen:Liq | 4.8 | 100 |
| Comparative Example 3 | Chemical Formula 8 | Chemical Formula 1-1 | BPhen:Liq | 4.9 | 90 |

As shown in Table 2, it may be seen that when the compound of Chemical Formula 1 and the compound of Chemical Formula 2 were included as an electron transfer material and a host material, respectively, efficiency and life span were significantly improved. In addition, referring to Table 2, even though the compound of Chemical Formula 1 was used as an electron transfer material of the hole blocking layer, efficiency and life span were reduced, when the compounds of Chemical Formulae 6 to 8 were used as a host, as in the Comparative Examples.

For example, efficiency and life span of the organic light emitting element may be improved by using a phenyl-substituted anthracene-based compound as a host and a carbazole-based compound as an electron blocking layer. It can be observed through Table 1 and Table 2 that when the organic light emitting element is made of the above-stated combinations, high efficiency and long life span can be acquired regardless of the type of electron transfer layer material.

By way of summation and review, some organic light emitting diode devices may require a high driving voltage, may generate low light emission luminance or efficiency, and may have a short light emission lifespan.

The embodiments may provide an organic light emitting diode with high efficiency and a long lifespan.

The efficiency and life span of the organic light emitting element according to an embodiment may be improved by using a carbazole-containing compound as or in a hole blocking layer of the organic light emitting element and a phenyl-substituted anthracene-containing compound as or in an emission layer of the organic light emitting element.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

| <Description of Symbols> | |
|---|---|
| 10: anode | 20: cathode |
| 30: hole transfer layer | 40: electron transfer layer |
| 50: electron blocking layer | 60: emission layer |

What is claimed is:

1. An organic light emitting diode comprising a first compound that includes a compound represented by at least one of Chemical Formulae 1-1 and 1-3 to 1-8, and a second compound that includes a compound represented by at least one of Chemical Formulae 2-1 to 2-9:

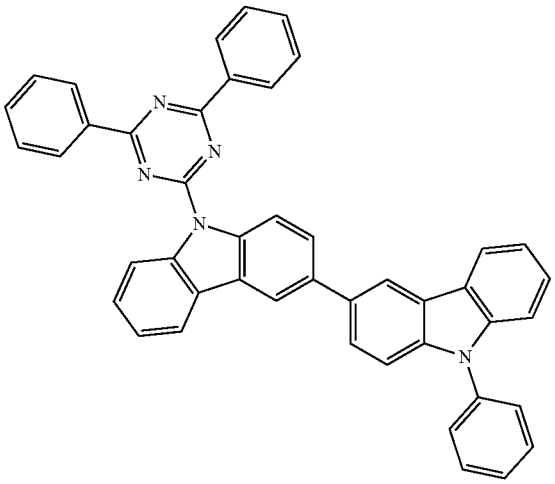

(1-1)

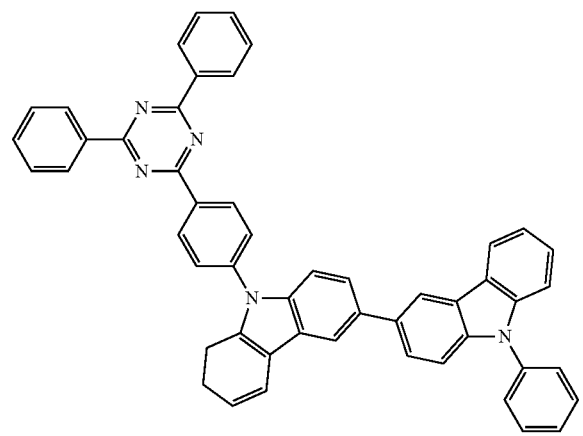

(1-3)

(1-4)
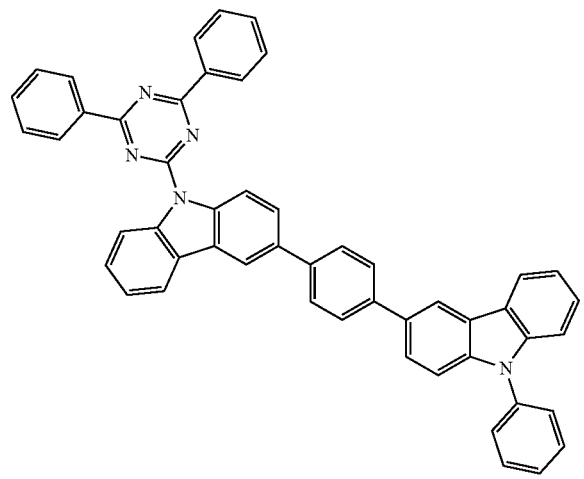
(1-5)
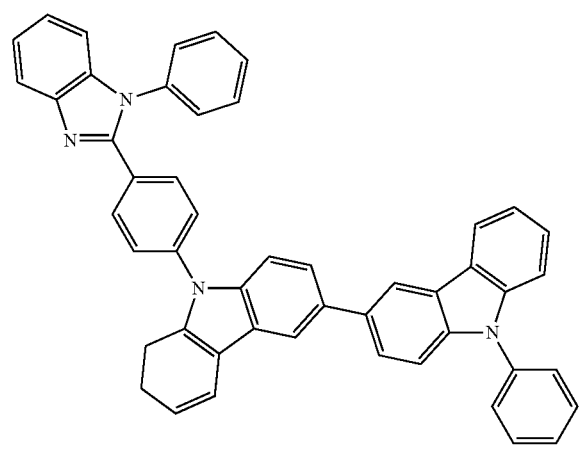
(1-6)
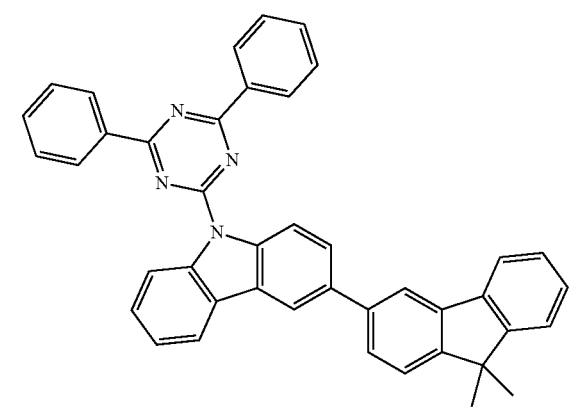
(1-7)
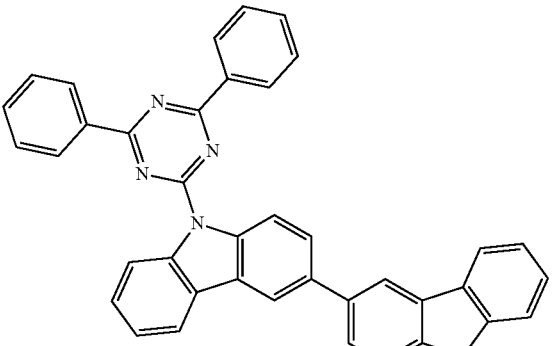
(1-8)
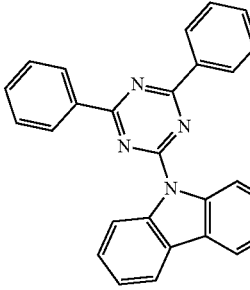
(2-1)
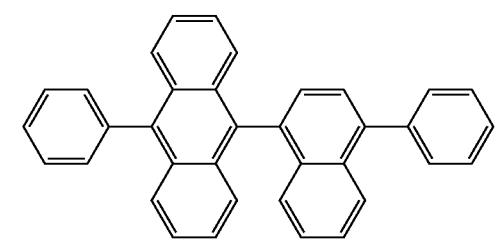
(2-2)
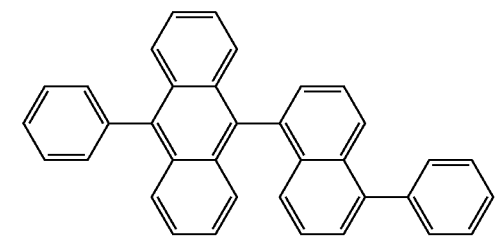
(2-3)
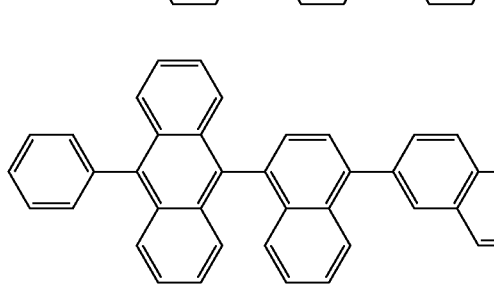

-continued (2-4)
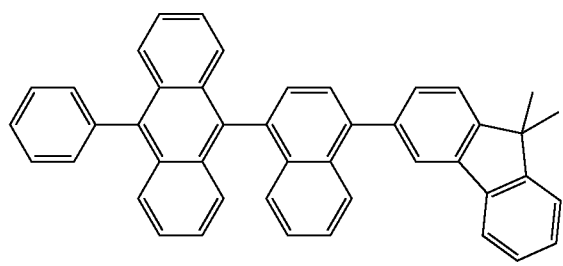

(2-9)
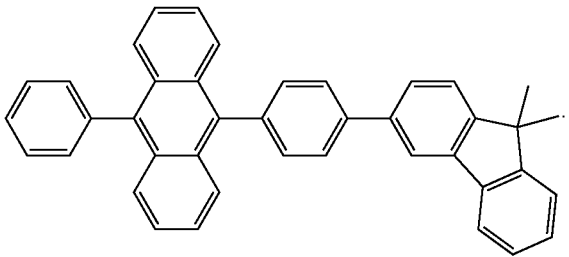

(2-5)
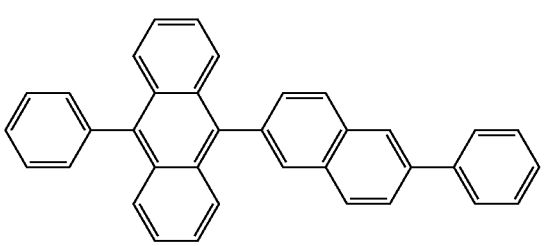

(2-6)
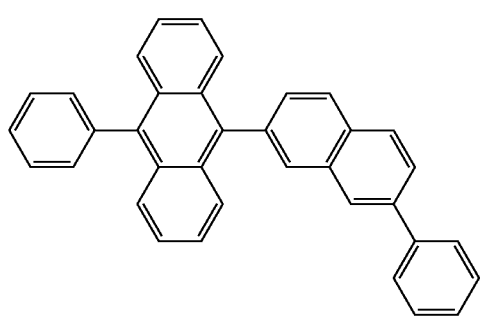

(2-7)
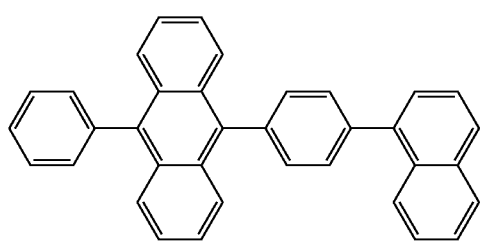

(2-8)
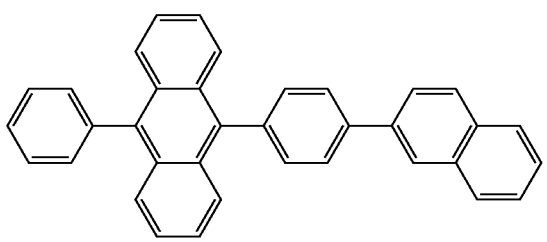

2. The organic light emitting diode as claimed in claim 1, wherein:

the organic light emitting diode includes:
an anode and a cathode that face each other;
an emission layer between the anode and the cathode;
a hole transfer layer between the anode and the emission layer;
an electron transfer layer between the cathode and the emission layer; and
a hole blocking layer between the electron transfer layer and the emission layer,
the hole blocking layer includes the first compound, and
the emission layer includes the second compound.

3. The organic light emitting diode as claimed in claim 2, wherein the electron transfer layer further includes a metal or a metal complex.

4. The organic light emitting diode as claimed in claim 3, wherein the electron transfer layer includes at least one of $Alq_3$, TAZ, Balq, BPhen, and $Bebq_2$.

5. The organic light emitting diode as claimed in claim 2, wherein a thickness of the hole blocking layer is about 1 nm to about 100 nm.

6. An organic light emitting diode device, comprising:
a substrate;
gate lines on the substrate;
data lines and a driving voltage line crossing the gate lines;
a switching thin film transistor connected to the gate line and the data line;
a driving thin film transistor connected to the switching thin film transistor and the driving voltage line; and
an organic light emitting diode connected with the driving thin film transistor,
wherein the organic light emitting diode includes a first compound that includes a compound represented by at least one of Chemical Formulae 1-1 and 1-3 to 1-8, and a second compound that includes a compound represented by at least one of Chemical Formulae 2-1 to 2-9:

(1-1)
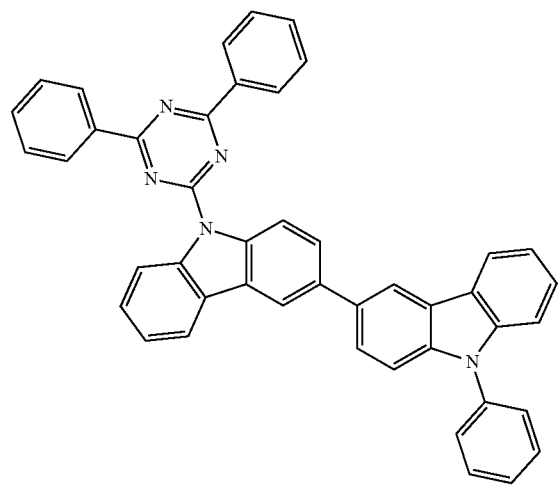
(1-3)
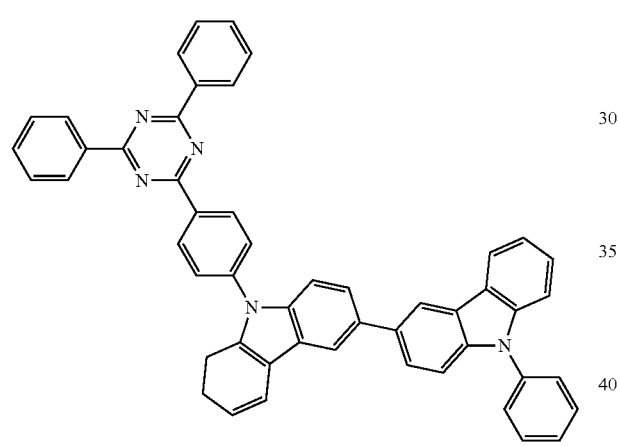
(1-4)
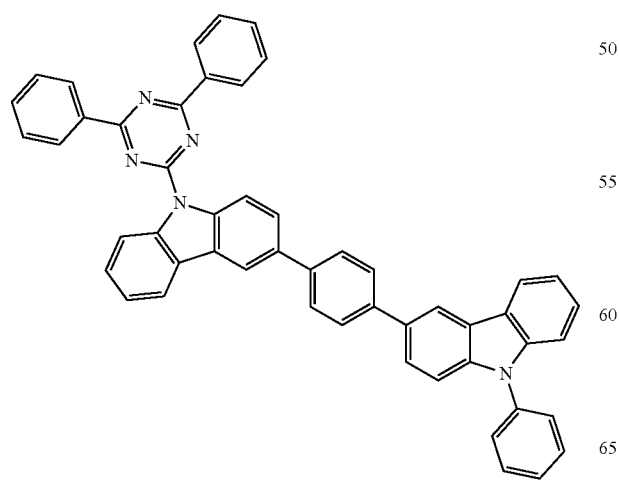
(1-5)
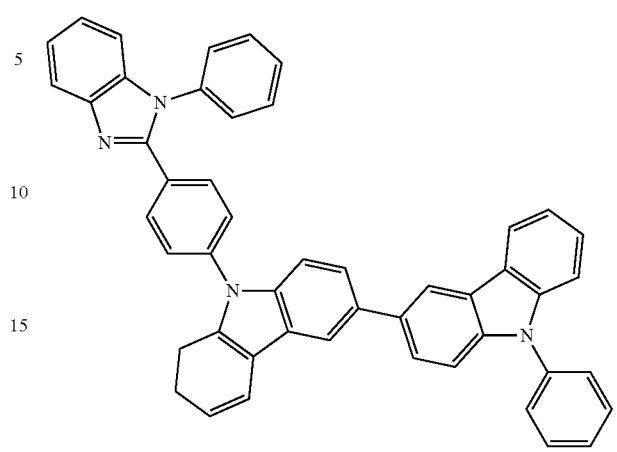
(1-6)
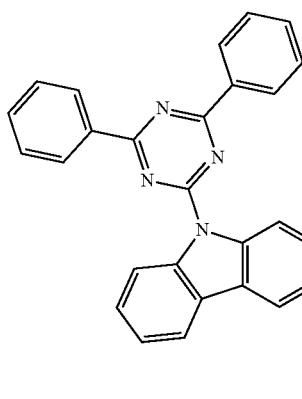
(1-7)
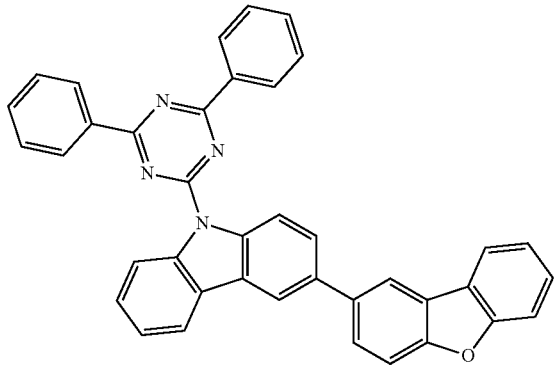

(1-8)
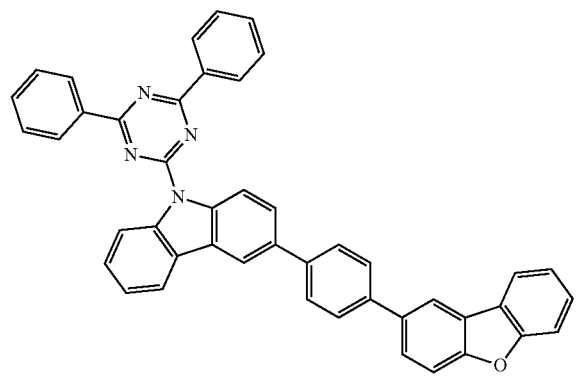

(2-1)
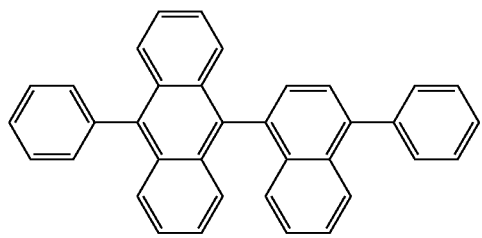

(2-2)
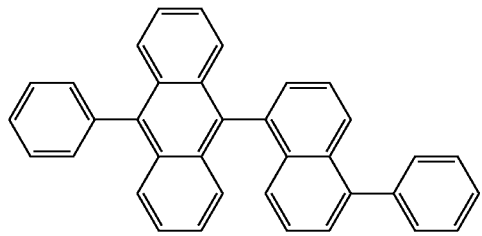

(2-3)
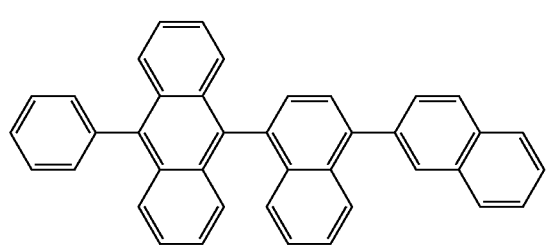

(2-4)
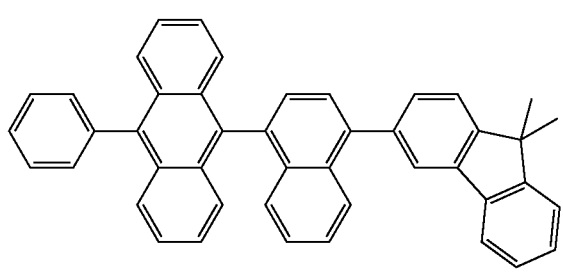

(2-5)
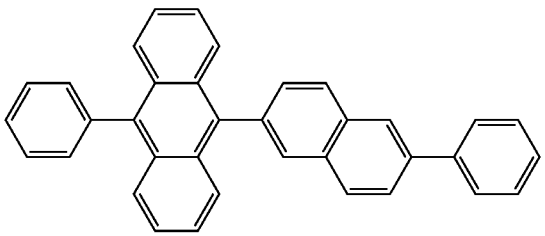

(2-6)
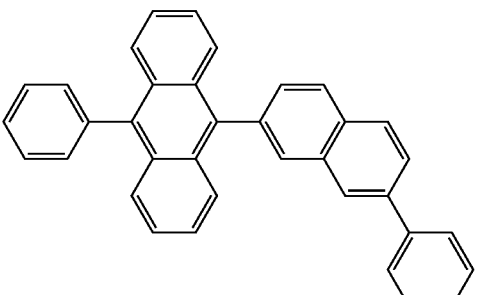

(2-7)
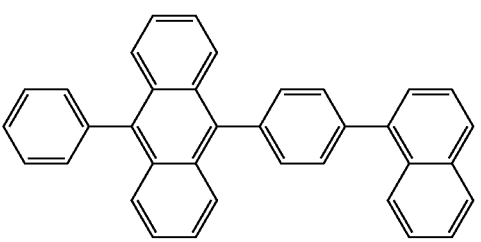

(2-8)
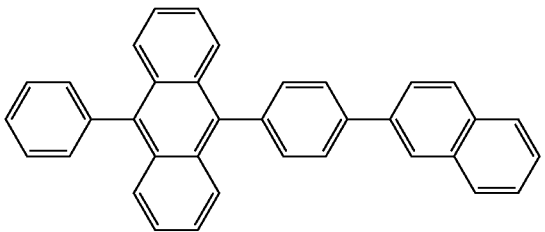

(2-9)
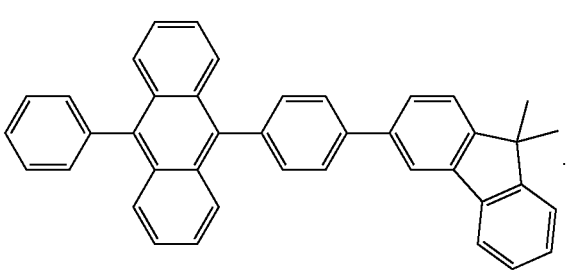

7. The organic light emitting diode device as claimed in claim 6, wherein:
the organic light emitting diode includes:
an anode and a cathode that face each other;
an emission layer between the anode and the cathode;
a hole transfer layer between the anode and the emission layer;
an electron transfer layer between the cathode and the emission layer; and
a hole blocking layer between the electron transfer layer and the emission layer, the hole blocking layer includes the first compound, and the emission layer includes the second compound.

8. The organic light emitting diode device as claimed in claim 7, wherein the electron transfer layer further includes a metal or a metal complex.

9. The organic light emitting diode device as claimed in claim 8, wherein the electron transfer layer includes at least one of Alq3, TAZ, Balq, BPhen, and Bebq2.

10. The organic light emitting diode device as claimed in claim 7, wherein a thickness of the hole blocking layer is about 1 nm to about 100 nm.

* * * * *